United States Patent
Ohba et al.

(10) Patent No.: US 10,084,017 B2
(45) Date of Patent: Sep. 25, 2018

(54) SWITCH DEVICE AND STORAGE UNIT HAVING A SWITCH LAYER BETWEEN FIRST AND SECOND ELECTRODES

(71) Applicant: SONY CORPORATION, Tokyo (JP)

(72) Inventors: Kazuhiro Ohba, Tokyo (JP); Hiroaki Sei, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/109,692

(22) PCT Filed: Jan. 7, 2015

(86) PCT No.: PCT/JP2015/050209
§ 371 (c)(1),
(2) Date: Jul. 5, 2016

(87) PCT Pub. No.: WO2015/107945
PCT Pub. Date: Jul. 23, 2015

(65) Prior Publication Data
US 2016/0336378 A1   Nov. 17, 2016

(30) Foreign Application Priority Data
Jan. 17, 2014  (JP) .................................. 2014-007264

(51) Int. Cl.
*H01L 47/00* (2006.01)
*H01L 27/24* (2006.01)
(Continued)

(52) U.S. Cl.
CPC ...... *H01L 27/2481* (2013.01); *G11C 13/0002* (2013.01); *G11C 13/003* (2013.01);
(Continued)

(58) Field of Classification Search
None
See application file for complete search history.

(56) References Cited

U.S. PATENT DOCUMENTS

2008/0042119 A1* 2/2008 Sandoval ............... H01L 45/06
257/4
2013/0001494 A1* 1/2013 Chen ..................... G11C 13/003
257/1
(Continued)

FOREIGN PATENT DOCUMENTS

JP   2006-86526 A   3/2006
JP   2009-534835 A   9/2009
(Continued)

OTHER PUBLICATIONS

International Search Report prepared by the Japanese Patent Office dated Mar. 17, 2015, for International Application No. PCT/JP2015/050209.

*Primary Examiner* — Cory Eskridge
(74) *Attorney, Agent, or Firm* — Sheridan Ross P.C.

(57) ABSTRACT

A switch device includes: a first electrode; a second electrode disposed to oppose the first electrode; a switch layer provided between the first electrode and the second electrode, and including at least one or more kinds of chalcogen elements and one or more kinds of first elements out of the one or more kinds of chalcogen elements, the one or more kinds of first elements, and a second element including one or both of oxygen (O) and nitrogen (N), the one or more kinds of chalcogen elements being selected from tellurium (Te), selenium (Se), and sulfur (S), and the one or more kinds of first elements being selected from boron (B), carbon (C), and silicon (Si).

28 Claims, 22 Drawing Sheets

(51) Int. Cl.
*G11C 13/00* (2006.01)
*H01L 45/00* (2006.01)

(52) U.S. Cl.
CPC ........ *G11C 13/004* (2013.01); *G11C 13/0004* (2013.01); *G11C 13/0007* (2013.01); *G11C 13/0023* (2013.01); *G11C 13/0069* (2013.01); *G11C 13/0097* (2013.01); *H01L 27/2463* (2013.01); *H01L 45/04* (2013.01); *H01L 45/065* (2013.01); *H01L 45/1233* (2013.01); *H01L 45/142* (2013.01); *H01L 45/143* (2013.01); *H01L 45/144* (2013.01); *H01L 45/1608* (2013.01); *H01L 45/1625* (2013.01); *H01L 45/1641* (2013.01); *G11C 2013/0073* (2013.01); *G11C 2213/73* (2013.01); *G11C 2213/76* (2013.01)

(56) References Cited

U.S. PATENT DOCUMENTS

| | | | | |
|---|---|---|---|---|
| 2014/0191182 A1* | 7/2014 | Yasuda | ............... | H01L 45/1253 257/4 |
| 2015/0074326 A1* | 3/2015 | Castro | ............... | G11C 13/0004 711/101 |

FOREIGN PATENT DOCUMENTS

| | | |
|---|---|---|
| JP | 2010-531062 A | 9/2010 |
| JP | 2011-146590 A | 7/2011 |
| JP | 2012-124374 A | 6/2012 |

* cited by examiner

[ FIG. 1 ]
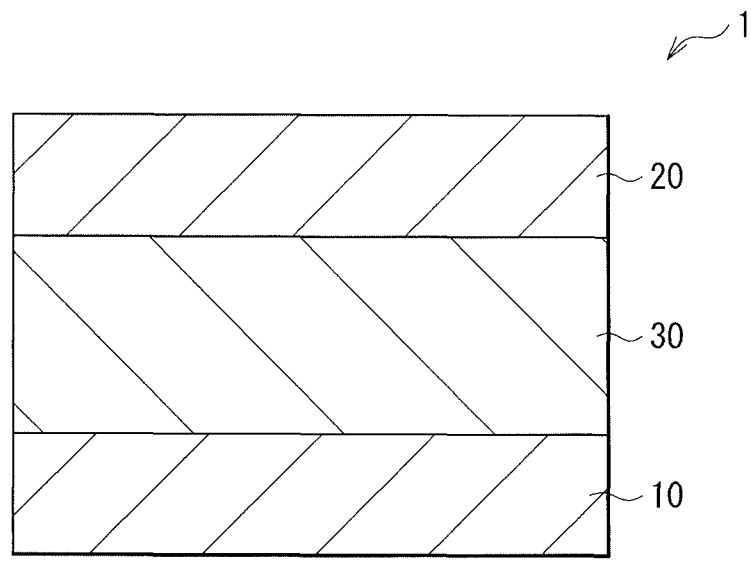
[ FIG. 2 ]
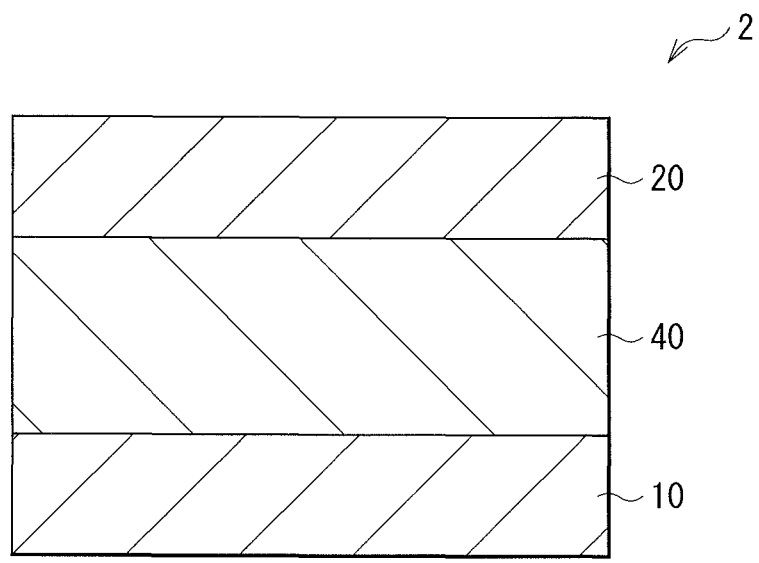

[ FIG. 3 ]
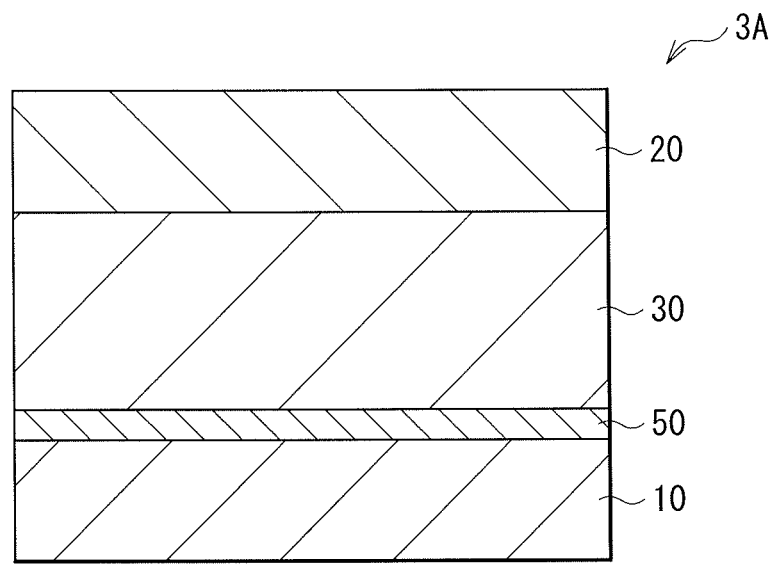
[ FIG. 4 ]
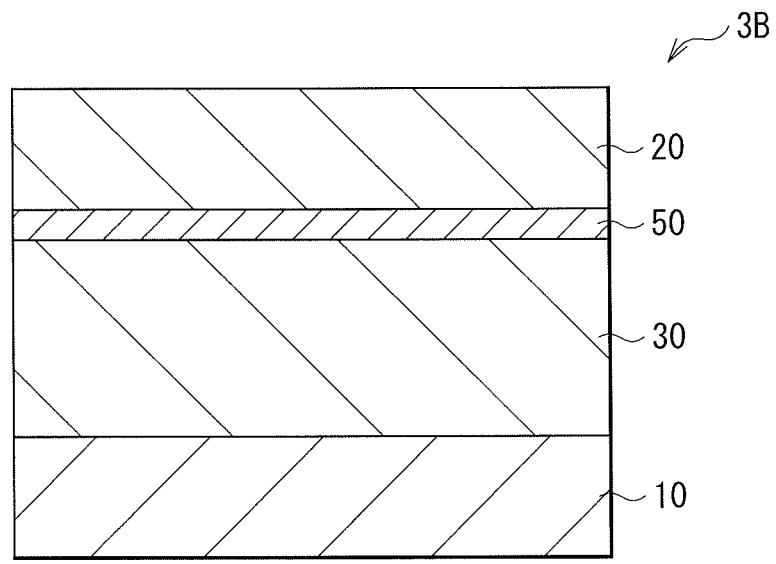

[ FIG. 5 ]
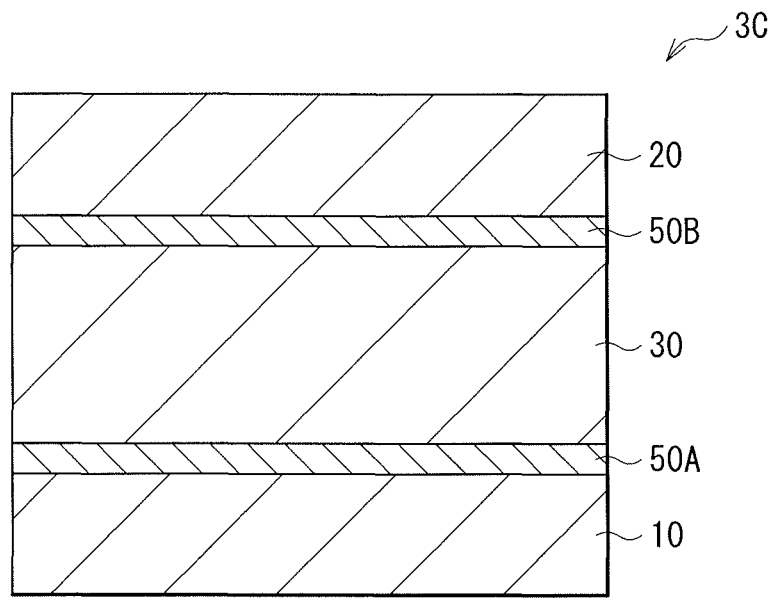
[ FIG. 6 ]
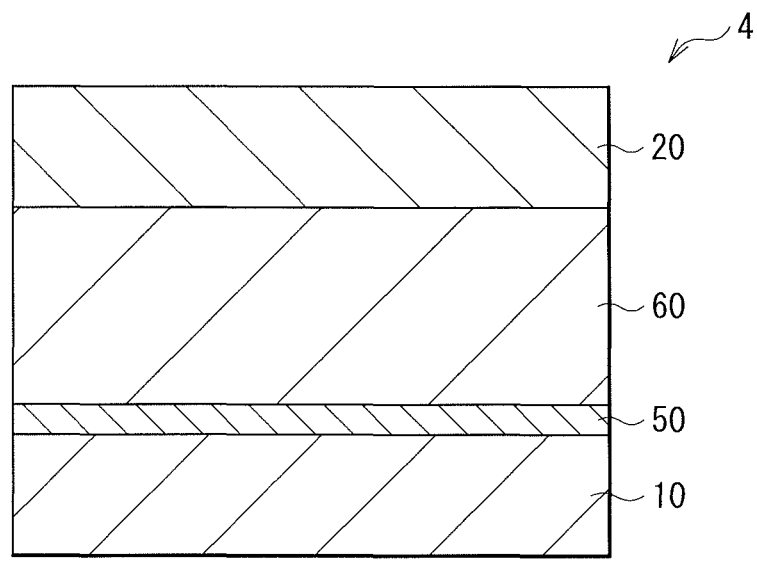

[ FIG. 7 ]
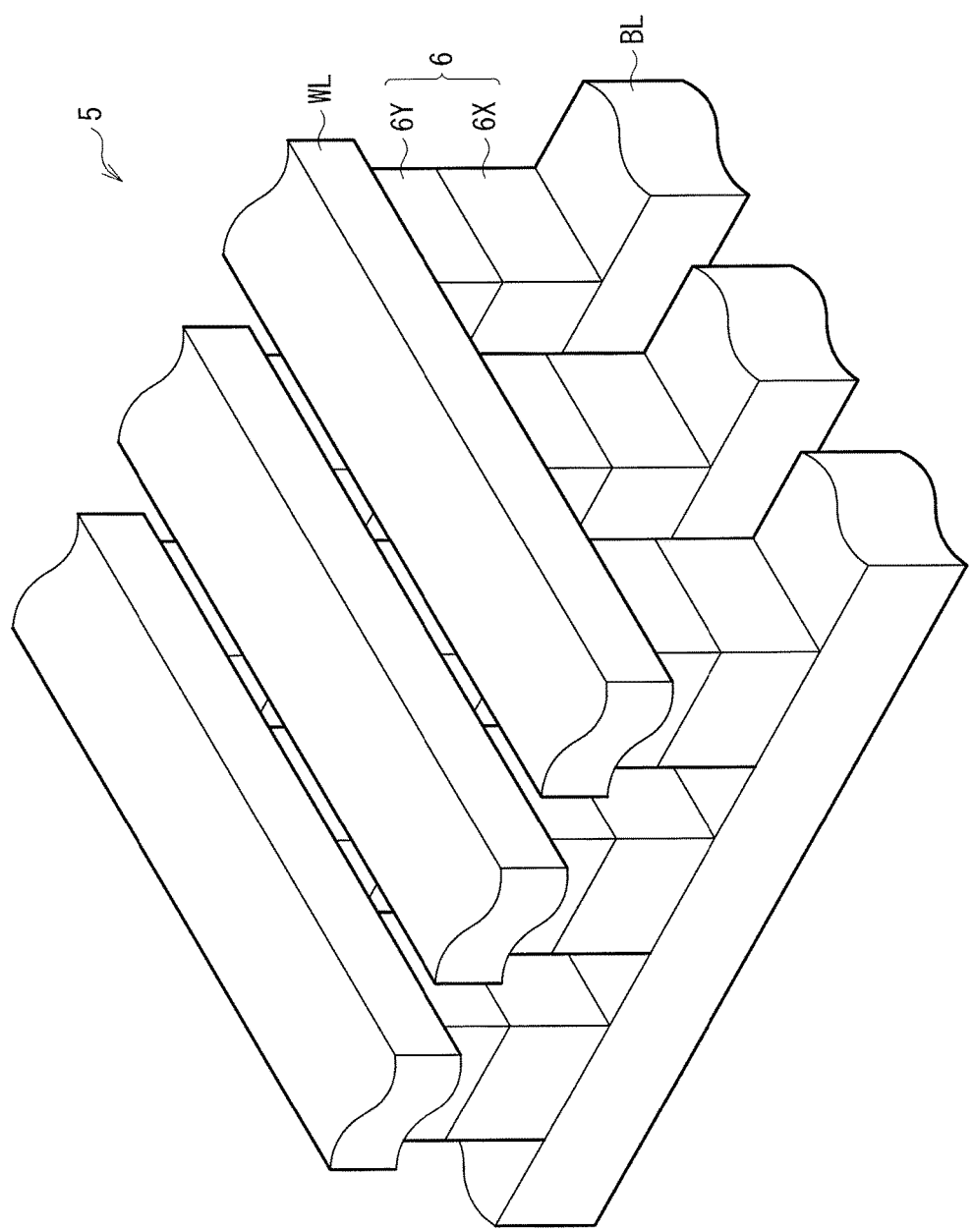

[FIG. 8]
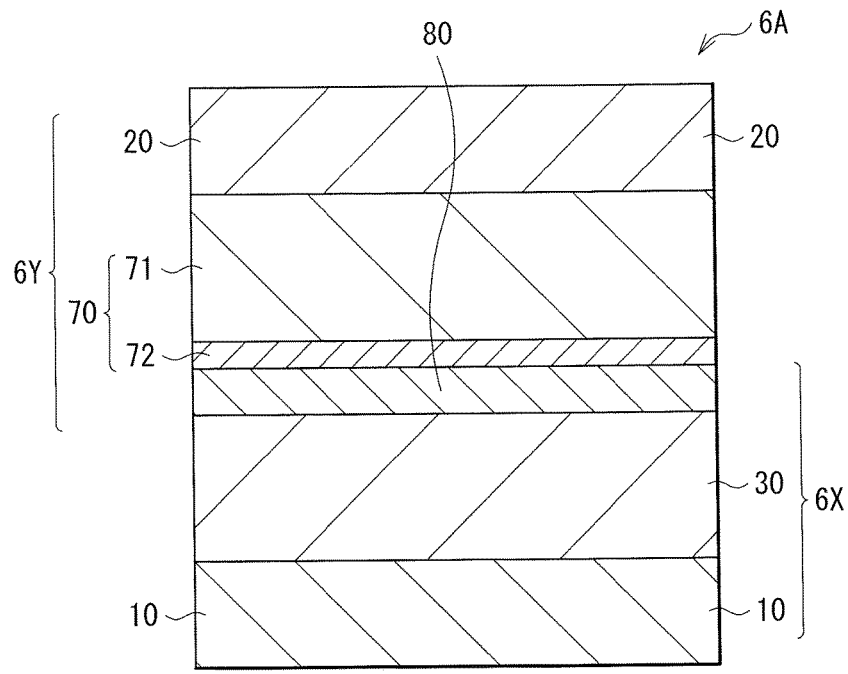
[FIG. 9]
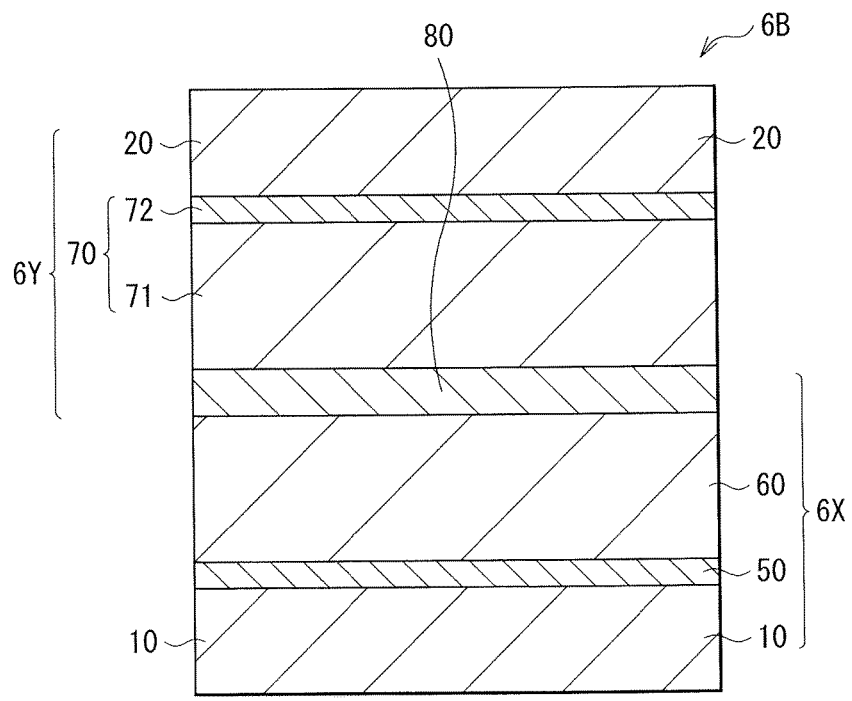

[ FIG. 10 ]
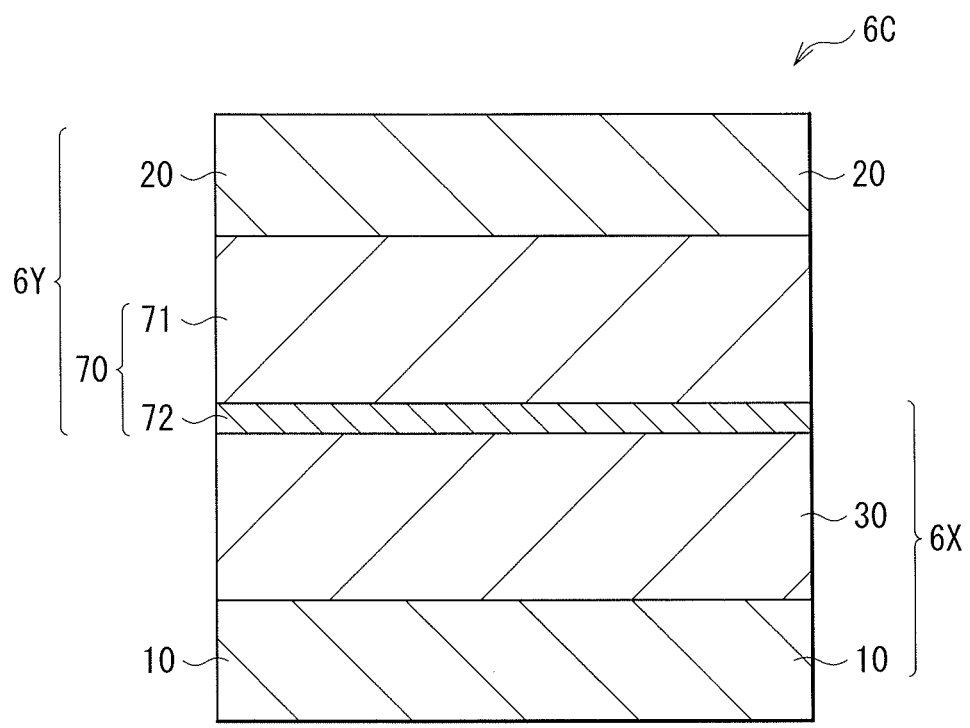

[ FIG. 11A ]
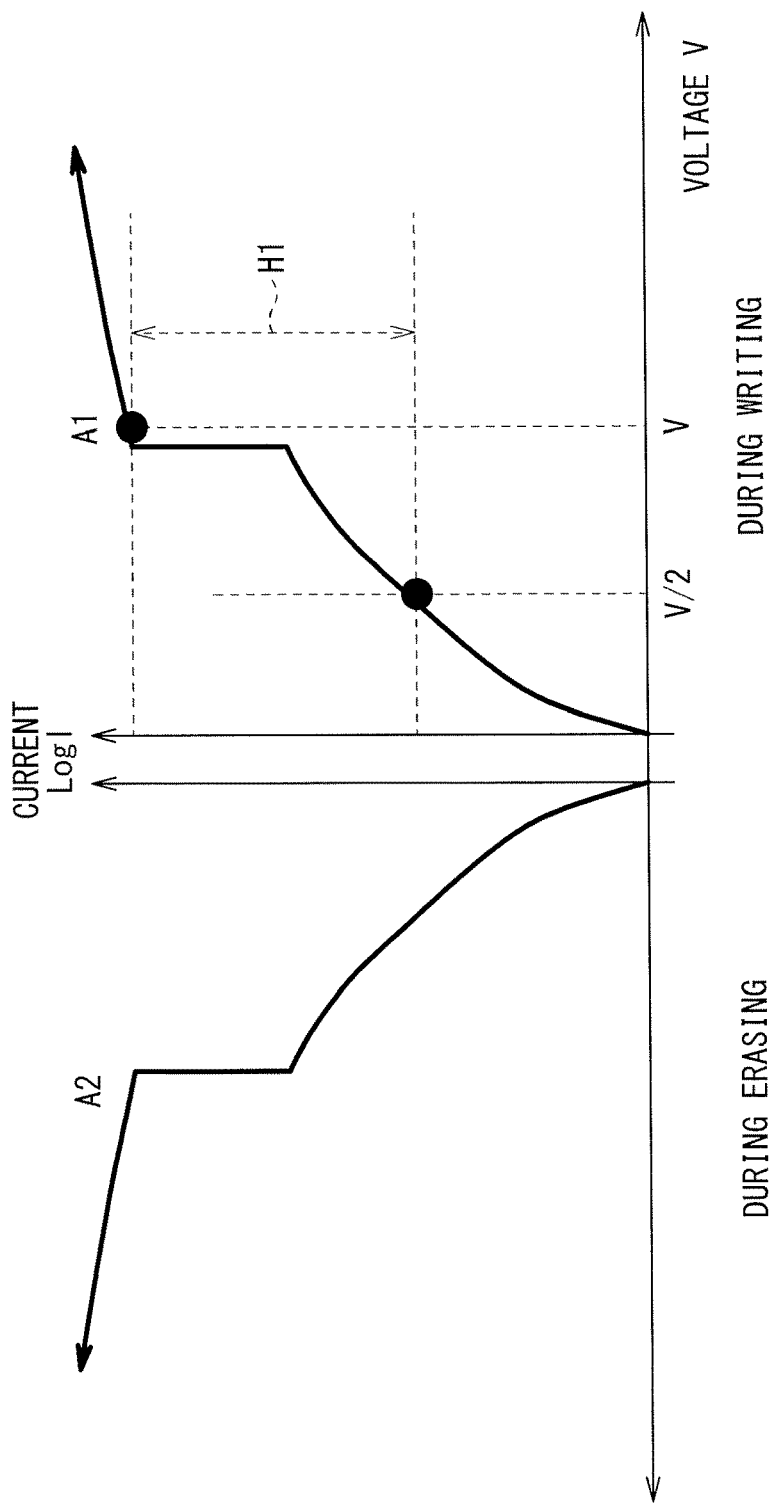

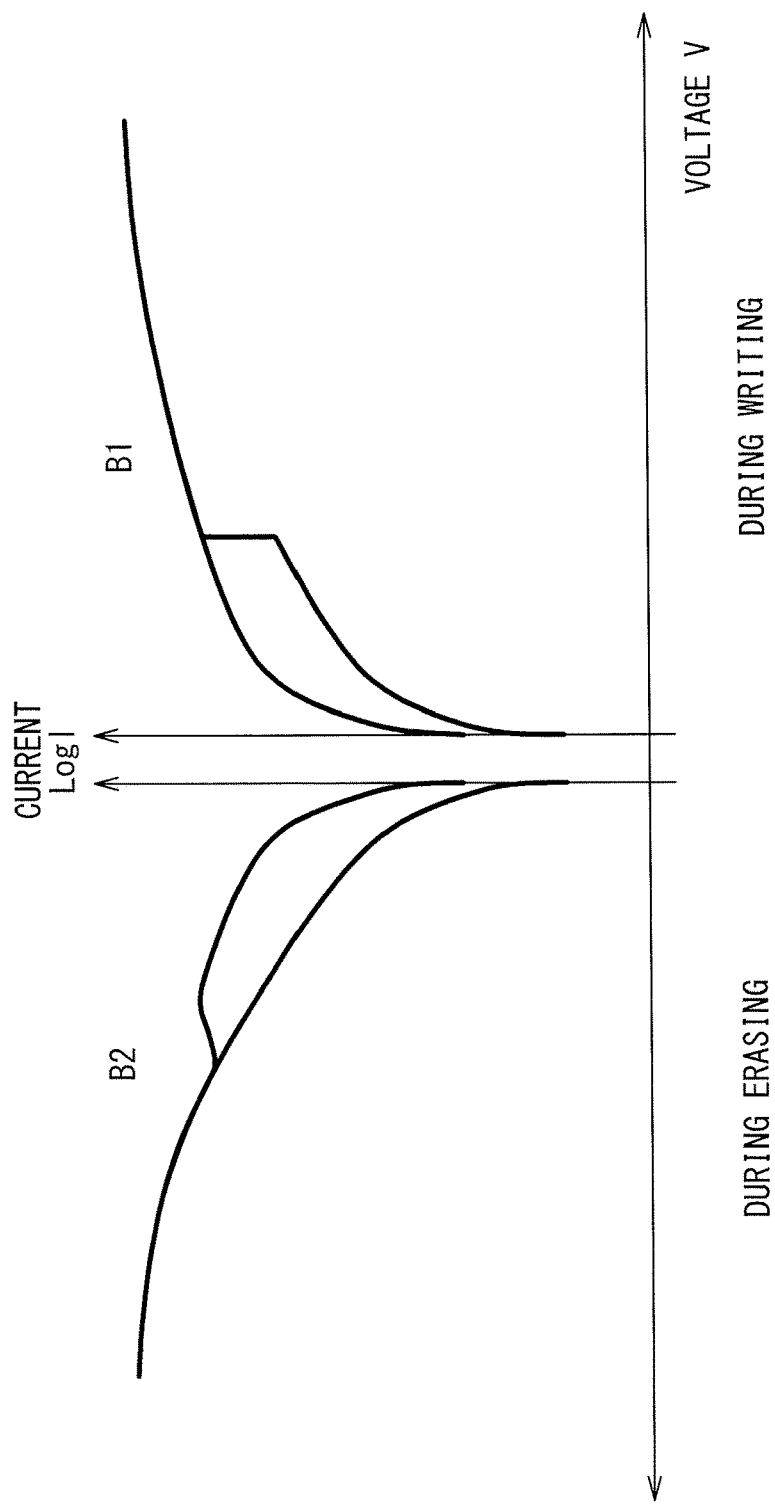
[ FIG. 11B ]

[FIG. 11C]
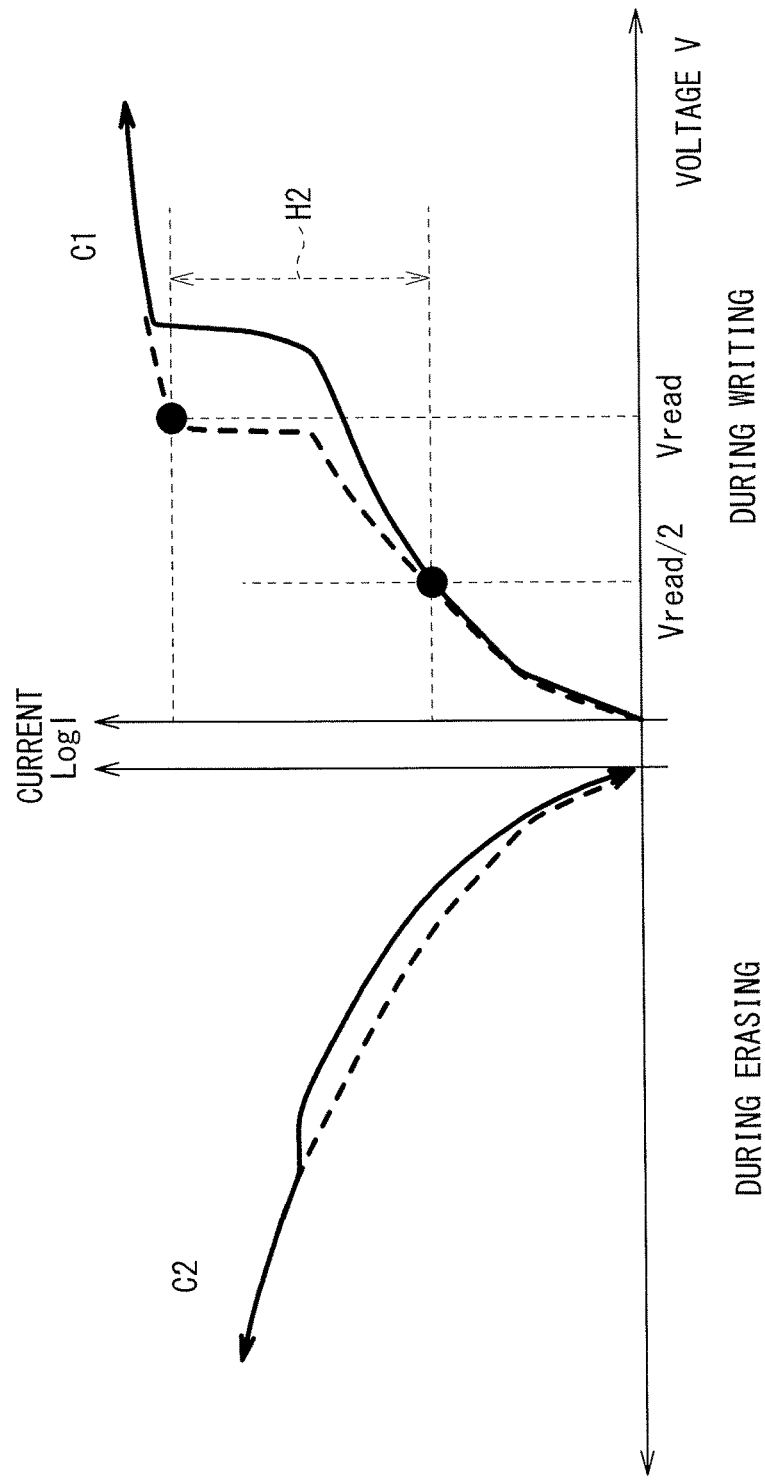

[ FIG. 11D ]
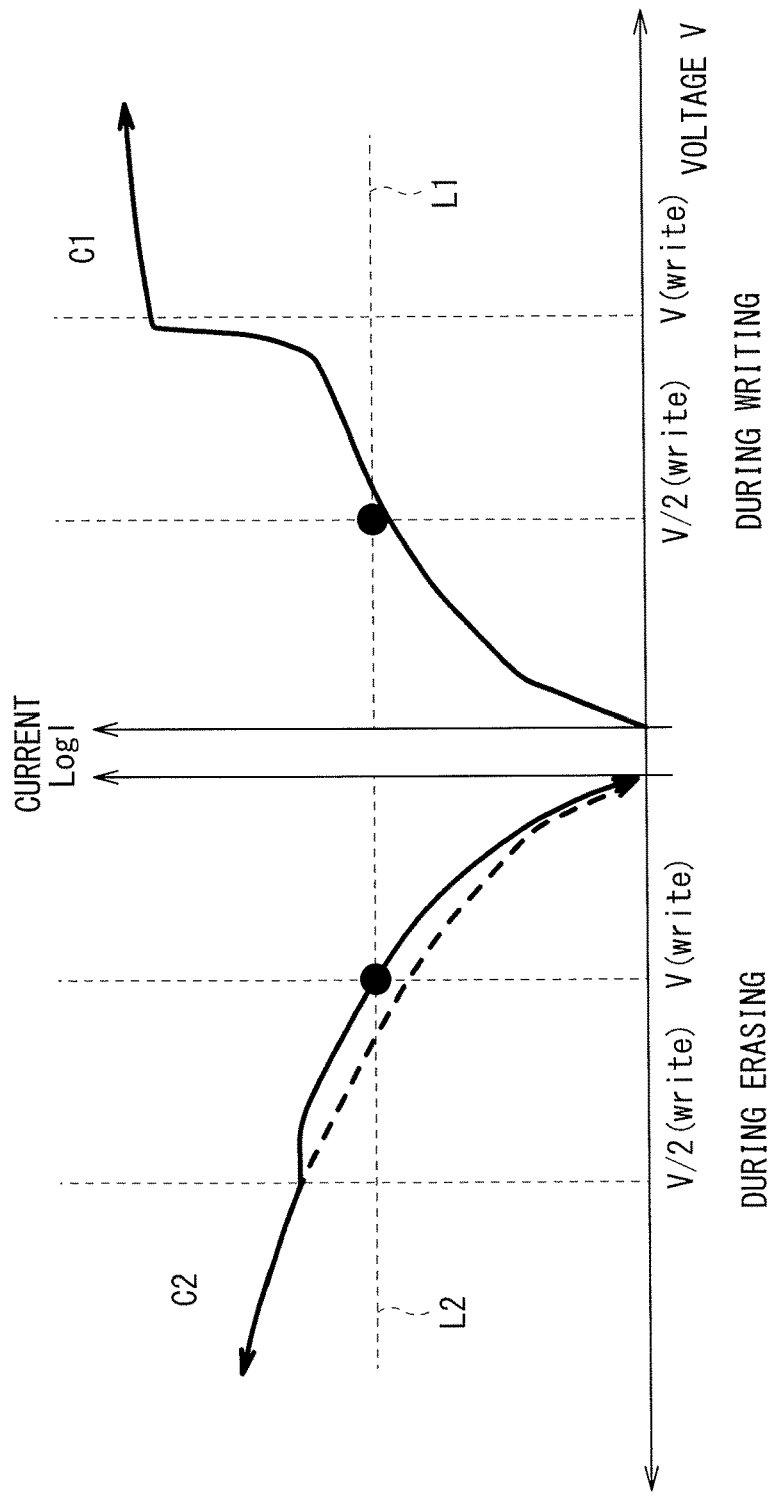

[ FIG. 12 ]
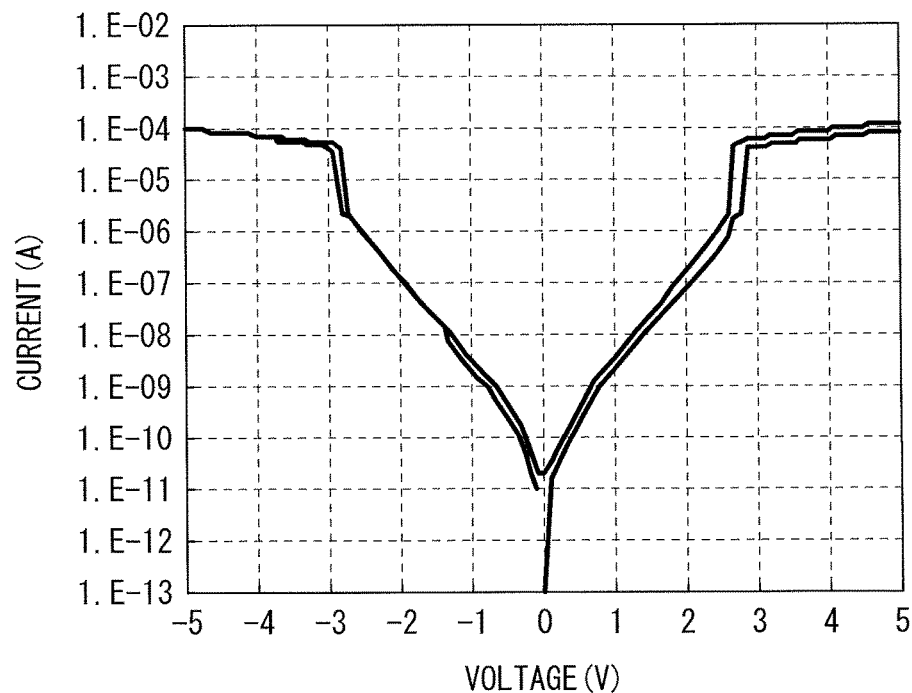
[ FIG. 13 ]
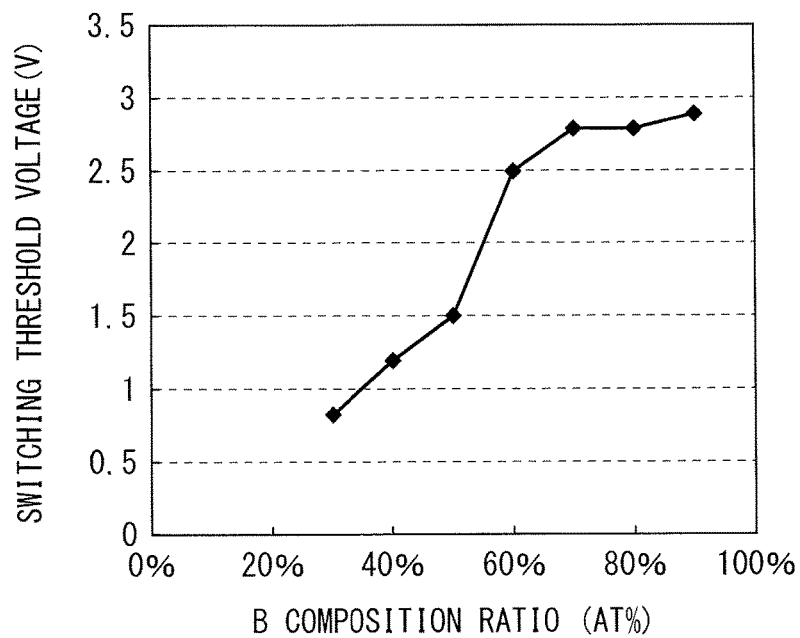

[ FIG. 14 ]
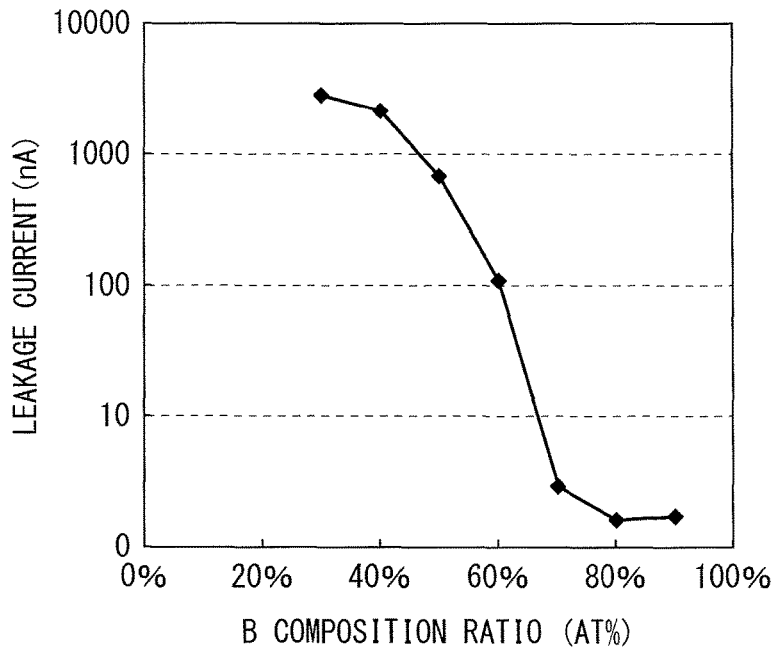
[ FIG. 15 ]
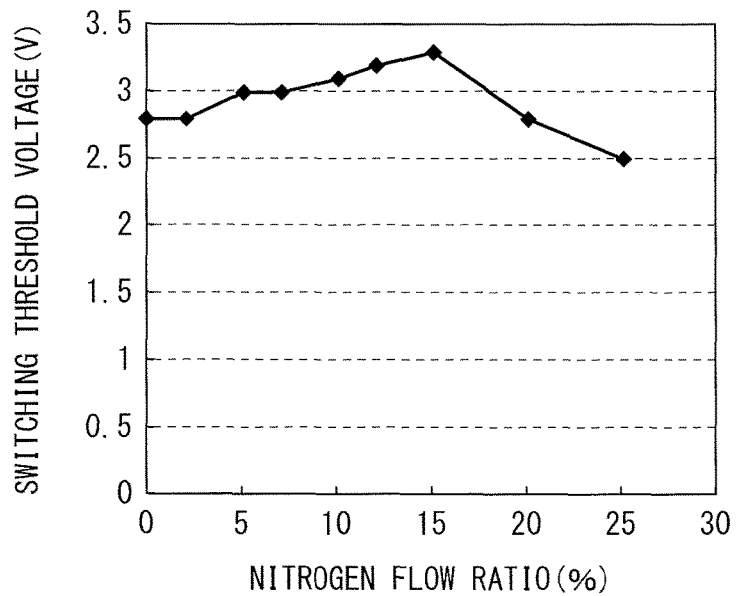

[ FIG. 16 ]
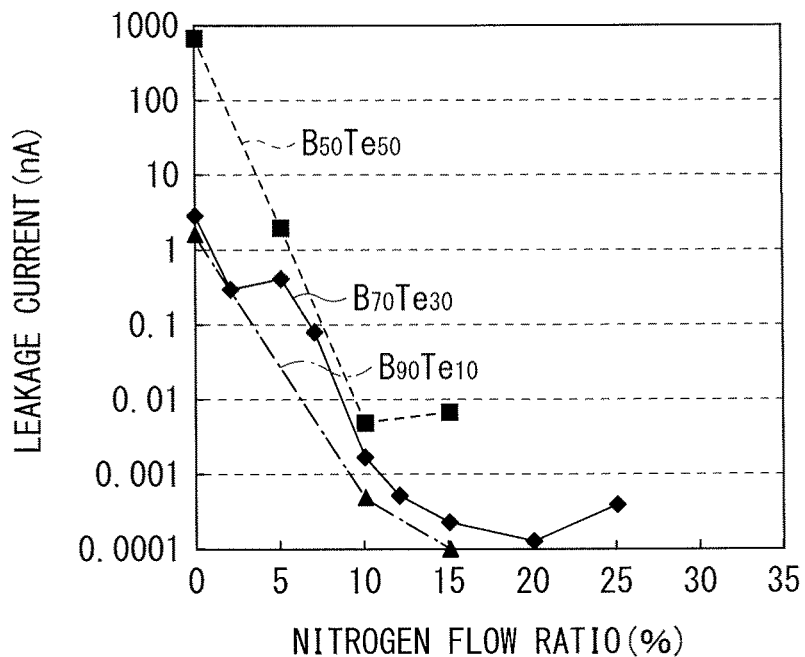
[ FIG. 17 ]
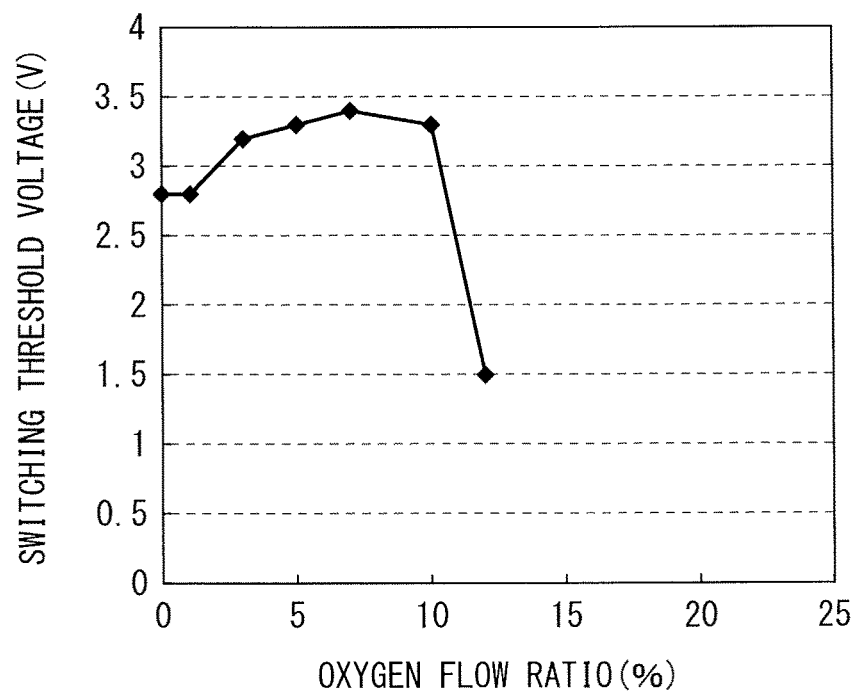

[ FIG. 18 ]
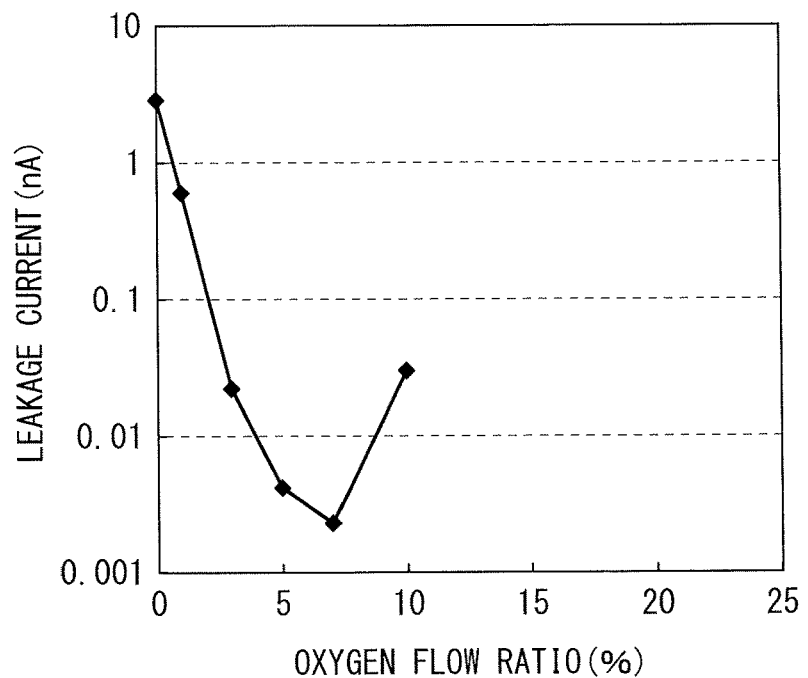
[ FIG. 19 ]
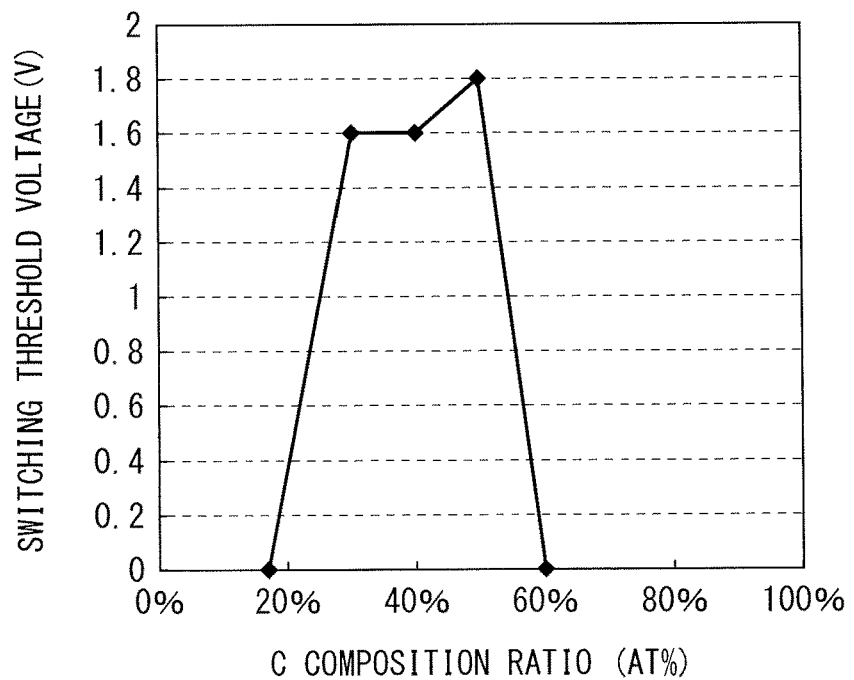

[ FIG. 20 ]
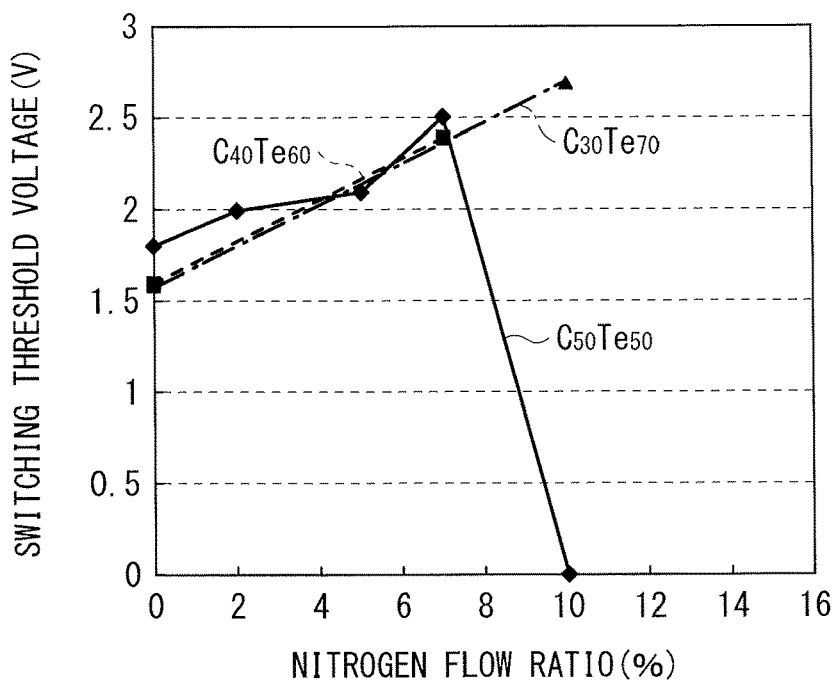
[ FIG. 21 ]
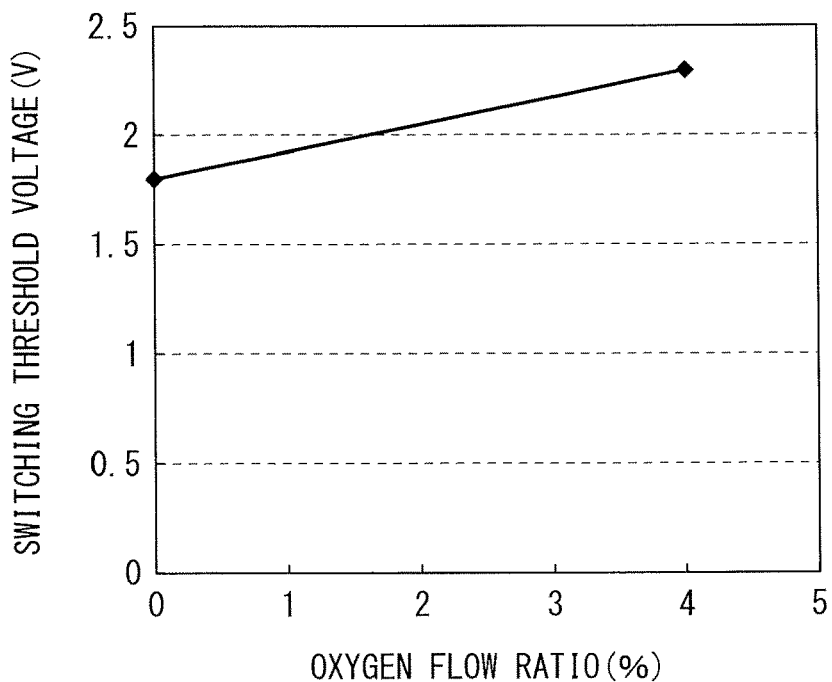

[ FIG. 22 ]
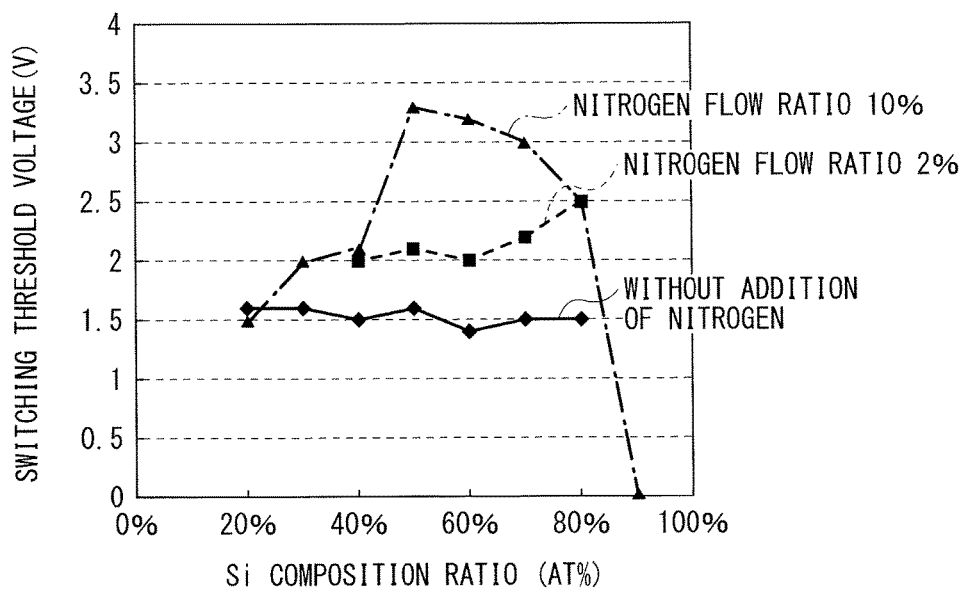
[ FIG. 23 ]
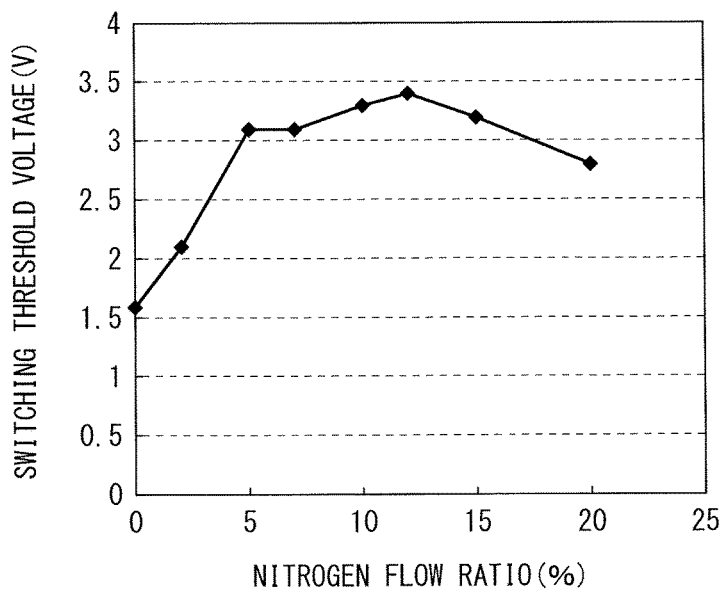

[ FIG. 24 ]
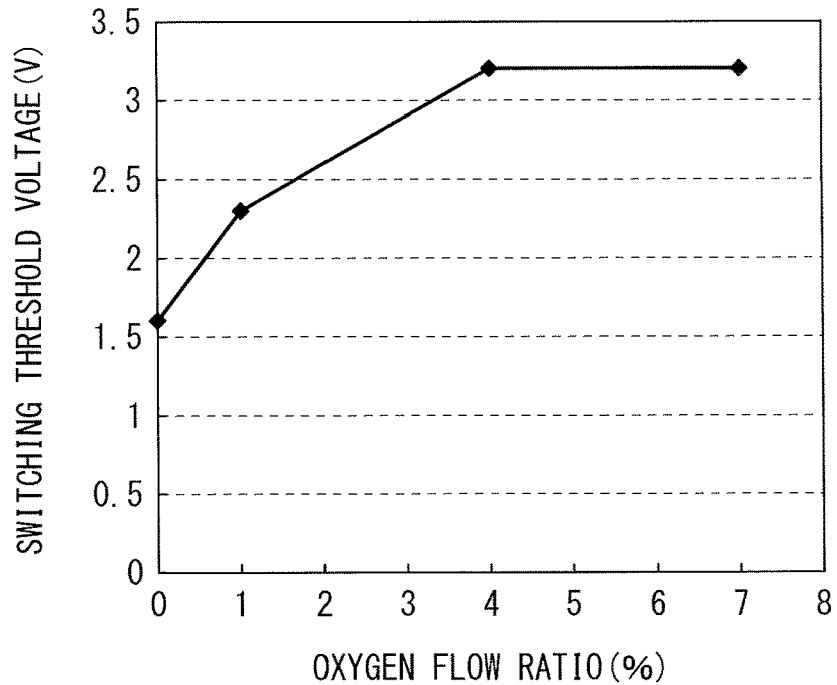
[ FIG. 25 ]
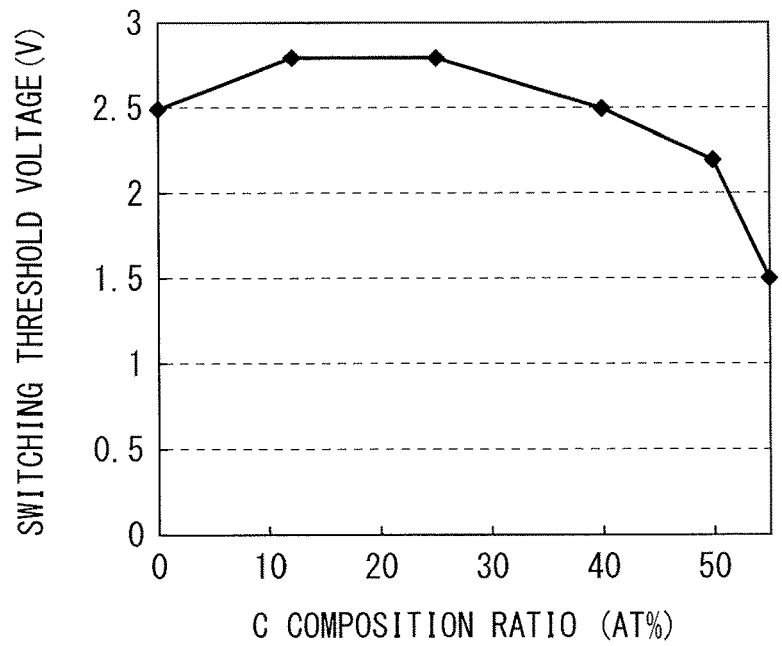

[ FIG. 26 ]
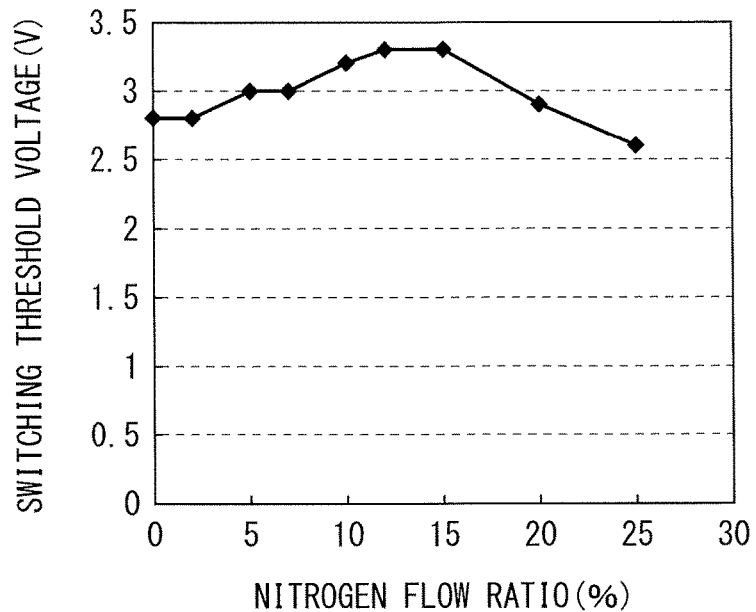
[ FIG. 27 ]
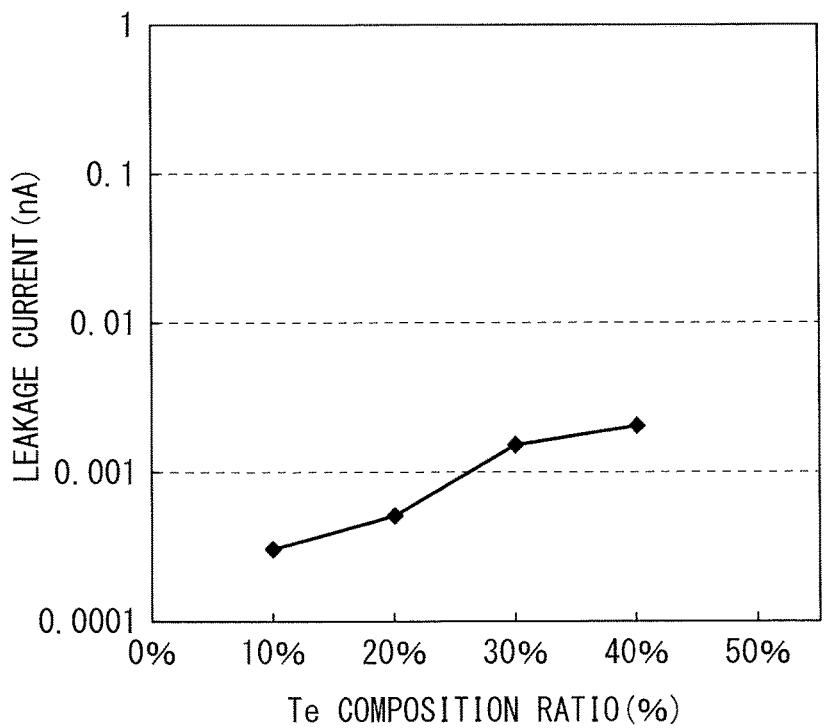

[ FIG. 28 ]
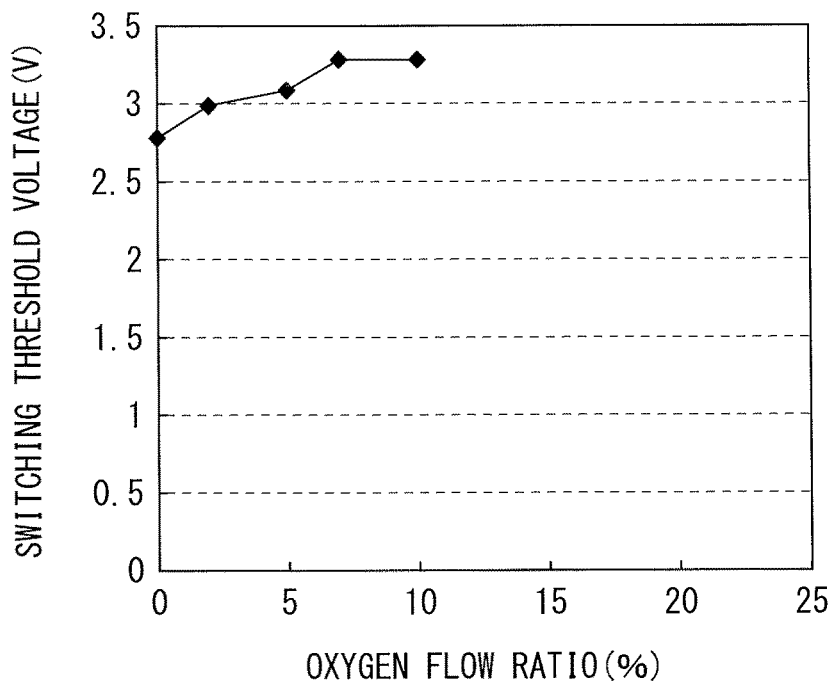
[ FIG. 29 ]
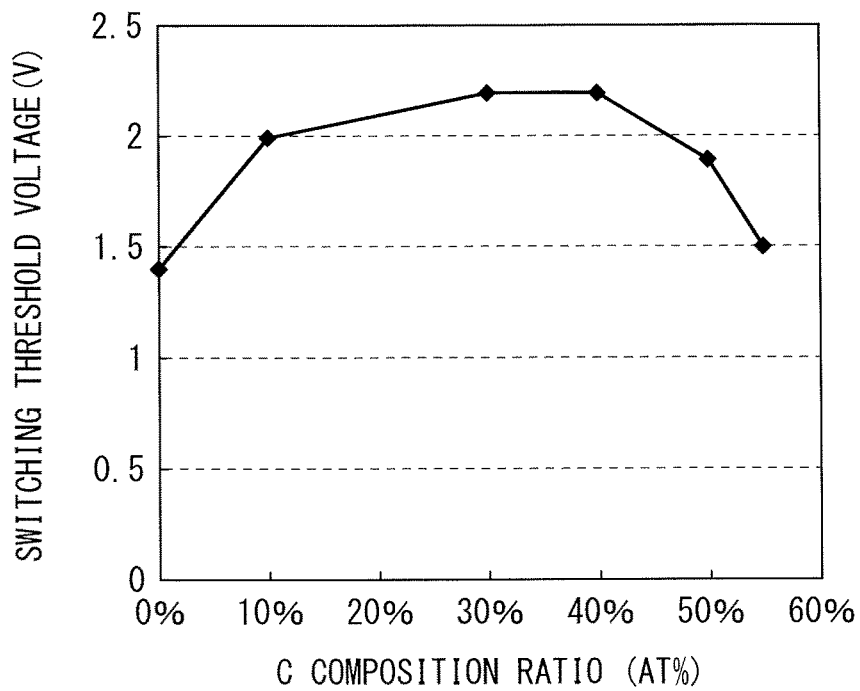

[ FIG. 30 ]
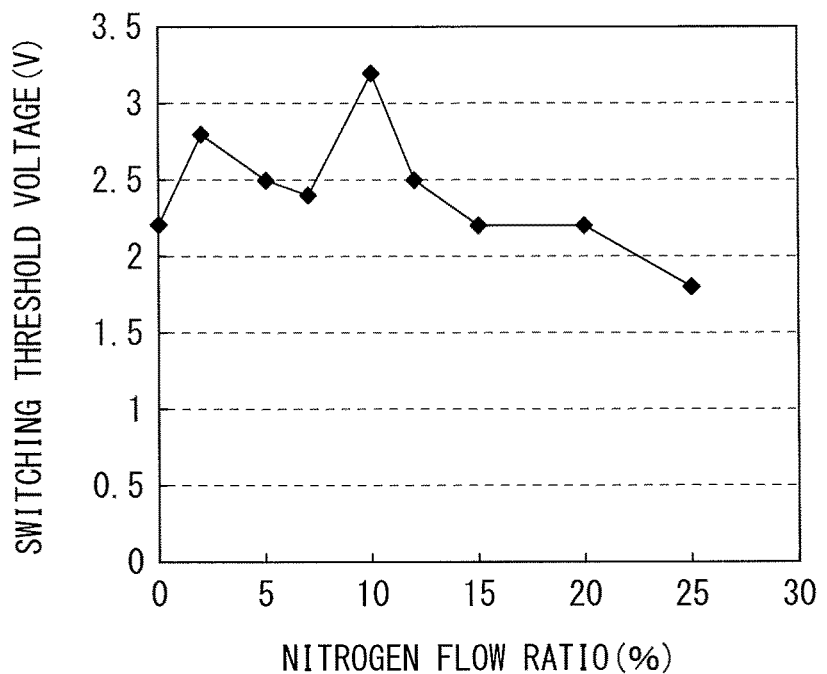
[ FIG. 31 ]
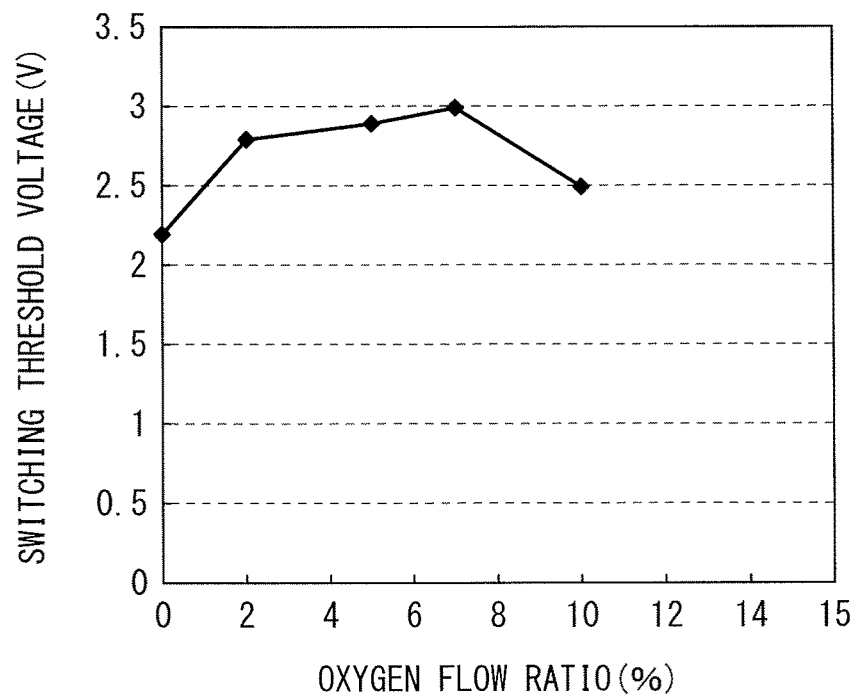

[ FIG. 32 ]
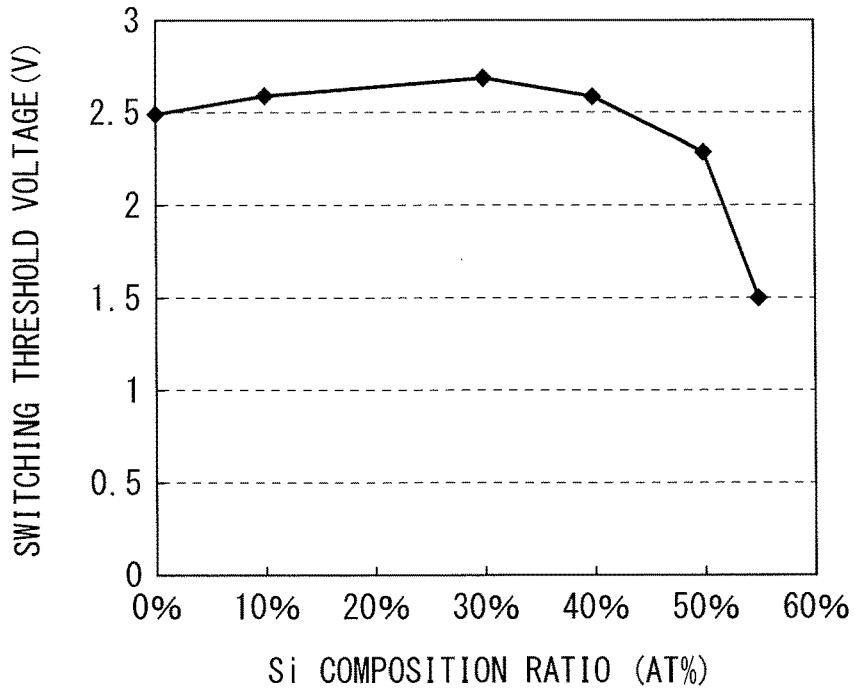
[ FIG. 33 ]
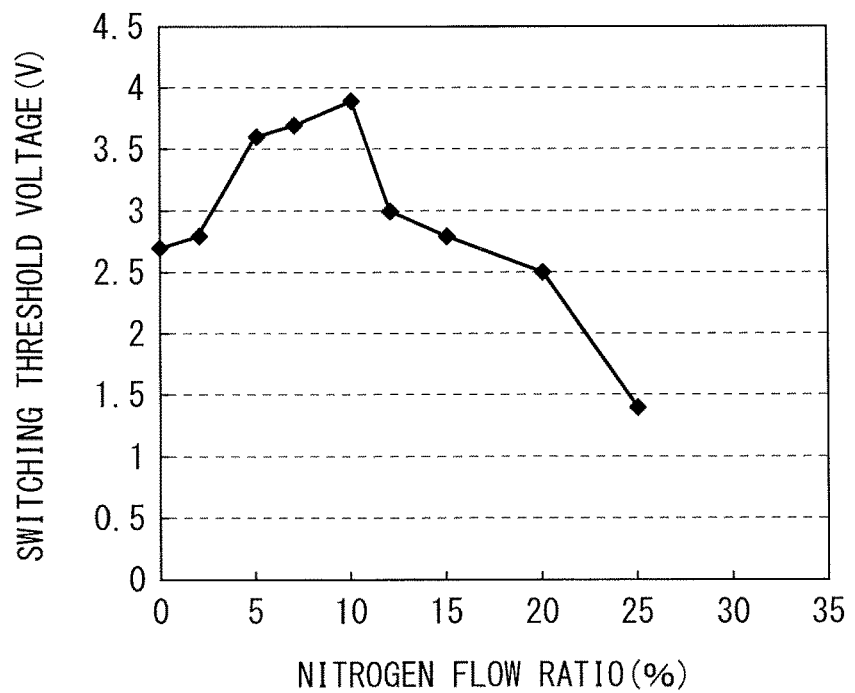

[ FIG. 34 ]
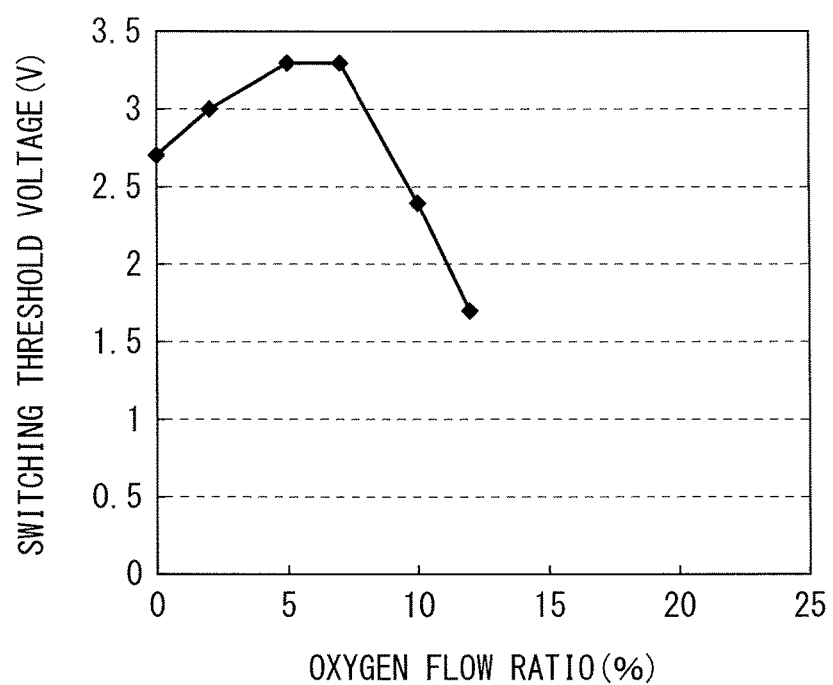

SWITCH DEVICE AND STORAGE UNIT HAVING A SWITCH LAYER BETWEEN FIRST AND SECOND ELECTRODES

CROSS REFERENCE TO RELATED APPLICATIONS

This application is a national stage application under 35 U.S.C. 371 and claims the benefit of PCT Application No. PCT/JP2015/050209 having an international filing date of 7 Jan. 2015, which designated the United States, which PCT application claimed the benefit of Japanese Patent Application No. 2014-007264 filed 17 Jan. 2014, the disclosures of which are incorporated herein by reference in their entirety.

TECHNICAL FIELD

The disclosure relates to a switch device and a storage unit that each include a chalcogenide layer between electrodes.

BACKGROUND ART

In recent years, an increase in capacity has been demanded in non-volatile memories for data storage. The non-volatile memories for data storage are typified by resistance-change memories such as ReRAMs (Resistance Random Access Memories) and PRAMs (Phase-Change Random Access Memories). However, in a resistance-change memory using an existing access transistor, a floor area per unit cell is increased. Accordingly, for example, as compared with flash memories such as NAND flash memories, it is difficult to achieve an increase in capacity of the resistance-change memory even in a case in which the resistance-change memory is miniaturized with use of same design rules. In contrast, in a case in which the resistance-change memory uses a so-called cross-point array configuration in which memory devices are each provided at corresponding one of intersections (cross points) of intersecting wiring lines, a floor area per unit cell in the resistance-change memory is reduced, which makes it possible to achieve the increase in capacity of the resistance-change memory.

In a cross-point type memory cell, a selection device (switch device) for cell selection is provided in addition to a memory device. Examples of the switch device may include a PN diode, an avalanche diode, a switch device configured with use of a metal oxide (for example, refer to NPTLs 1 and 2), and a switch device that is switched at a certain threshold voltage by Mott transition to abruptly increase a current (for example, refer to NPTLs 3 and 4). However, since a threshold voltage at which the switch devices are switched is not sufficient and a leakage current during non-selection is large, the switch devices do not have sufficient characteristics as switch devices used in combination with the memory device (in particular, a resistance-change memory device having a large writing threshold voltage) in the cross-point type memory cell.

Examples of the switch device other than the above-described switch device configured with use of the metal oxide may include a switch device using a chalcogenide material (ovonic threshold switch (OTS) device; for example, refer to PTLs 1 and 2). The OTS device has a characteristic in which a current abruptly increases at a switching threshold voltage or higher, which makes it possible to obtain relatively large current density in a selection (ON) state. Moreover, a microstructure of a layer (an OTS layer) made of a chalcogenide material is amorphous, and it is therefore possible to form the OTS layer under room-temperature conditions such as a physical vapor deposition (PVD) method and a chemical vapor deposition (CVD) method. Accordingly, the OTS layer has an advantage of high process affinity.

CITATION LIST

Patent Literature

PTL 1: Japanese Unexamined Patent Application Publication No. 2006-86526
PTL 2: Japanese Unexamined Patent Application Publication No. 2010-157316

Non-Patent Literature

NPTL 1: Jiun-Jia Huang et al., 2011 IEEE IEDM11-733 to 736
NPTL 2: Wootae Lee et al., 2012 IEEE VLSI Technology symposium p. 37 and 38
NPTL 3: Myungwoo Son et al., IEEE ELECTRON DEVICE LETTERS, VOL. 32, NO. 11, November 2011
NPTL 4: Seonghyun Kim et al., 2012 VLSI p. 155 and 156

SUMMARY OF INVENTION

However, in a case in which the OTS device is used in a cross-point memory cell, it is necessary to reduce a leakage current in a semi-selection (OFF) state and to obtain a larger resistance change ratio (an ON/OFF ratio). Moreover, a relatively large writing voltage is necessary specifically in a resistance-change memory device having more favorable data retention characteristics. Therefore, in a case in which such a memory device is used to achieve a high-capacity memory, the switching threshold voltage of the above-described OTS device is not sufficiently high. Although increasing a thickness of the above-described OTS layer makes it possible to increase the switching threshold voltage of the OTS device, there is an issue that the increased thickness may cause a disadvantage in miniaturization.

It is therefore desirable to provide a switch device that has a large resistance change ratio and a large switching threshold voltage and has a small leakage current during non-selection, and a storage unit that includes the switch device.

A switch device according to an embodiment of the technology includes: a first electrode; a second electrode disposed to oppose the first electrode; a switch layer provided between the first electrode and the second electrode, and including at least one or more kinds of chalcogen elements and one or more kinds of first elements out of the one or more kinds of chalcogen elements, the one or more kinds of first elements, and a second element including one or both of oxygen (O) and nitrogen (N), the one or more kinds of chalcogen elements being selected from tellurium (Te), selenium (Se), and sulfur (S), and the one or more kinds of first elements being selected from boron (B), carbon (C), and silicon (Si).

A switch device according to another embodiment of the technology includes: a first electrode; a second electrode disposed to oppose the first electrode; a switch layer provided between the first electrode and the second electrode, and including one or more kinds of chalcogen elements selected from tellurium (Te), selenium (Se), and sulfur (S) and one or more kinds selected from magnesium (Mg), calcium (Ca), strontium (Sr), aluminum (Al), and gallium (Ga).

A switch device according to another embodiment of the technology includes: a first electrode; a second electrode disposed to oppose the first electrode; a switch layer provided between the first electrode and the second electrode, and including one or more kinds of chalcogen elements selected from tellurium (Te), selenium (Se), and sulfur (S) and a compound having a band gap of 2.2 V or higher.

A storage unit according to an embodiment of the technology includes a plurality of storage device and a plurality of switch devices according to the foregoing embodiment.

In the switch device according to the embodiment of the disclosure, the switch layer is provided between the first electrode and the second electrode, and includes at least the one or more kinds of chalcogen elements and the one or more kinds of first elements out of the one or more kinds of chalcogen elements, the one or more kinds of first elements, and the second element including one or both of O and N. In the switch device according to another embodiment of the technology, the switch layer is provided between the first electrode and the second electrode, and includes the one or more kinds of chalcogen elements selected from Te, Se, and S and the one or more kinds selected from Mg, Ca, Sr, Al, and Ga. In the switch device according to another embodiment of the technology, the switch layer is provided between the first electrode and the second electrode, and includes the one or more kinds of chalcogen elements selected from Te, Se, and S and a compound having a band gap of 2.2 V or higher. Accordingly, in the switch devices and the storage unit according to the foregoing embodiments, a leakage current during non-selection is reduced, and a current passing in an ON state is increased.

In the switch devices and the storage unit according to the embodiments of the technology, the switch layer provided between the first electrode and the second electrode includes the one or more kinds of chalcogen elements selected from Te, Se, and S. The switch device according to an embodiment further includes at least the one or more kinds selected from Si, B, and C. The switch device according to another embodiment further includes the one or more kinds selected from Mg, Ca, Sr, Al, and Ga. The switch device according to another embodiment further includes the compound having a band gap of 2.2 eV or higher. Accordingly, the leakage current during non-selection (an OFF state) is reduced, and the current passing in the ON state is increased. This makes it possible to increase a resistance change ratio (ON/OFF ratio) and increase a value of a switching threshold voltage. In other words, this makes it possible to provide a miniaturized high-capacity storage unit. It is to be noted that in the switch device according to the embodiment, the switch layer may include one or both of O and N in addition to the above-described elements. Note that effects described here are non-limiting. Effects achieved by the technology may be one or more of effects described in the disclosure.

BRIEF DESCRIPTION OF DRAWINGS

FIG. 1 is a cross-sectional view illustrating a configuration of a switch device according to an embodiment of the disclosure.

FIG. 2 is a cross-sectional view illustrating a configuration of a switch device according to another embodiment of the disclosure.

FIG. 3 is a cross-sectional view illustrating an example of a configuration of a switch device according to another embodiment of the disclosure.

FIG. 4 is a cross-sectional view illustrating another example of the configuration of the switch device illustrated in FIG. 3.

FIG. 5 is a cross-sectional view illustrating another example of the configuration of the switch device illustrated in FIG. 3.

FIG. 6 is a cross-sectional view illustrating a configuration of a switch device according to another embodiment of the disclosure.

FIG. 7 is a perspective view of a memory cell array using the switch device illustrated in FIG. 1.

FIG. 8 is a cross-sectional view illustrating an example of a configuration of a memory cell illustrated in FIG. 7.

FIG. 9 is a cross-sectional view illustrating another example of the configuration of the memory cell illustrated in FIG. 7.

FIG. 10 is a cross-sectional view illustrating another example of the configuration of the memory cell illustrated in FIG. 7.

FIG. 11A is a diagram illustrating an I-V characteristic in the memory cell (the switch device) illustrated in FIG. 7.

FIG. 11B is a diagram illustrating an I-V characteristic in the memory cell (a storage device) illustrated in FIG. 7.

FIG. 11C is a diagram illustrating an I-V characteristic in the memory cell illustrated in FIG. 7.

FIG. 11D is a diagram illustrating an I-V characteristic in the memory cell illustrated in FIG. 7.

FIG. 12 is an I-V characteristic diagram in Experiment 1-1.

FIG. 13 is a characteristic diagram between a B composition ratio and a switching threshold voltage in Experiment 2-2.

FIG. 14 is a characteristic diagram between a B composition ratio and a leakage current in Experiment 2-2.

FIG. 15 is a characteristic diagram between a nitrogen flow ratio and a switching threshold voltage in Experiment 2-2.

FIG. 16 is a characteristic diagram between a nitrogen flow ratio and a leakage current in Experiment 2-2.

FIG. 17 is a characteristic diagram between an oxygen flow ratio and a switching threshold voltage in Experiment 2-2.

FIG. 18 is a characteristic diagram between a B composition ratio and a switching threshold voltage in Experiment 2-3.

FIG. 19 is a characteristic diagram between a C composition ratio and a switching threshold voltage in Experiment 2-3.

FIG. 20 is a characteristic diagram of a switching threshold voltage under each condition in Experiment 2-3.

FIG. 21 is a characteristic diagram of switching threshold voltages with and without addition of O in Experiment 2-3.

FIG. 22 is a characteristic diagram illustrating a relationship between a Si composition ratio and a switching threshold voltage in Experiment 2-4.

FIG. 23 is a characteristic diagram illustrating a relationship between a nitrogen flow ratio and a switching threshold voltage in Experiment 2-4.

FIG. 24 is a characteristic diagram illustrating a relationship between an oxygen flow ratio and a switching threshold voltage in Experiment 2-4.

FIG. 25 is a characteristic diagram illustrating a relationship between a C composition ratio and a switching threshold voltage in Experiment 2-5.

FIG. 26 is a characteristic diagram illustrating a relationship between a nitrogen flow ratio and a switching threshold voltage in Experiment 2-5.

FIG. 27 is a characteristic diagram illustrating a relationship between a Te composition ratio and a leakage current in Experiment 2-5.

FIG. 28 is a characteristic diagram illustrating a relationship between an oxygen flow ratio and a switching threshold voltage in Experiment 2-5.

FIG. 29 is a characteristic diagram illustrating a relationship between a C composition ratio and a switching threshold voltage in Experiment 2-6.

FIG. 30 is a characteristic diagram illustrating a relationship between a nitrogen flow ratio and a switching threshold voltage in Experiment 2-6.

FIG. 31 is a characteristic diagram illustrating a relationship between an oxygen flow ratio and a switching threshold voltage in Experiment 2-6.

FIG. 32 is a characteristic diagram illustrating a relationship between a Si composition ratio and a switching threshold voltage in Experiment 2-7.

FIG. 33 is a characteristic diagram illustrating a relationship between a nitrogen flow ratio and a switching threshold voltage in Experiment 2-7.

FIG. 34 is a characteristic diagram illustrating a relationship between an oxygen flow ratio and a switching threshold voltage in Experiment 2-7.

MODE FOR CARRYING OUT THE INVENTION

Some embodiments of the disclosure are described in detail below in the following order with reference to drawings.
1. First Embodiment (An example in which a metalloid light element is added to a switch layer)
2. Second Embodiment (An example in which an alkaline-earth metal or any other element is added to a switch layer)
3. Third Embodiment (An example in which a high-resistance layer is further included)
4. Modification Example (An example in which an alkaline-earth metal element and B (or C) are added to a switch layer and a high-resistance layer is further included)
5. Storage Unit
6. Examples 1. First Embodiment FIG. 1 illustrates a cross-sectional configuration of a switch device 1 according to a first embodiment of the disclosure. The switch device 1 is adapted to selectively operate a certain storage device (a storage device 6Y; refer to FIG. 7) of a plurality of storage devices arranged in a memory cell array with, for example, a so-called cross-point array configuration illustrated in FIG. 7. The switch device 1 (a switch device 6X; refer to FIG. 7) is coupled in series to the storage device 6Y (more specifically, a storage layer 70), and includes a lower electrode 10 (a first electrode), a switch layer 30, and an upper electrode 20 (a second electrode) in this order. It is to be noted that the switch device 1 is adapted to change its resistance state upon application of a predetermined voltage without phase change (between an amorphous state and a crystalline phase).

The lower electrode 10 may be made of a wiring material used in a semiconductor process. Examples of the wiring material may include tungsten (W), tungsten nitride (WN), titanium nitride (TiN), carbon (C), copper (Cu), aluminum (Al), molybdenum (Mo), tantalum (Ta), tantalum nitride (TaN), and silicide. In a case in which the lower electrode 10 is made of a material, such as Cu, that has a possibility of causing ionic conduction by an electric field, a surface of the lower electrode 10 made of Cu or any other wiring material may be covered with a material having barrier properties, such as W, WN, TiN, or TaN, that is less likely to cause ionic conduction and thermal diffusion.

The switch layer 30 includes one or more kinds of Group 16 elements of the periodic table, more specifically, one or more kinds of chalcogen elements such as sulfur (S), selenium (Se) and tellurium (Te). In a switch device having an OTS phenomenon, even if a voltage bias for switching is applied to the switch device, it is necessary for a switch layer to maintain an amorphous structure, thereby not causing a phase change, and a stabler amorphous structure makes it possible to stably cause the OTS phenomenon. In this embodiment, the switch layer 30 is made of a chalgogenide including one or more kinds of metalloid light elements (first elements), more specifically, boron (B), carbon (C), and silicon (Si) in addition to the above-described chalcogen element. Table 1 is a list of atomic radii of the respective elements. When an element with a relatively small atomic radius is added to an element with a relatively large atomic radius, a difference in atomic radius between the elements becomes large. Accordingly, it is difficult for the switch layer to have a crystalline structure, and the amorphous structure is more likely to be stabilized. Therefore, as with the switch layer 30 in this embodiment, when the metalloid light element with a relatively small atomic radius such as B is added to a chalcogenide including a chalcogen element with a relatively large atomic radius such as Te, a plurality of elements with different atomic radii are included in the chalcogenide, thereby stabilizing the amorphous structure.

TABLE 1

| Element | Atomic Radius (Å) |
| --- | --- |
| B | 0.82 |
| C | 0.77 |
| N | 0.75 |
| O | 0.73 |
| Si | 1.11 |
| P | 1.06 |
| S | 1.02 |
| Ge | 1.22 |
| As | 1.20 |
| Se | 1.17 |
| Sb | 1.40 |
| Te | 1.36 |

In metalloids, B particularly has low conductivity even in the form of a simple substance, and including B in the chalcogenide makes it possible to increase a resistance value of the switch layer 30. Moreover, B has a smaller atomic radius as compared with the chalcogen elements; therefore, B makes it possible to stabilize the amorphous structure of the switch layer 30 and to stably cause the ovonic threshold switch (OTS) phenomenon.

As with B, C except for C having a structure with the sp2 orbital such as graphite makes it possible to increase resistance of the chalcogenide. Moreover, C has a smaller ionic radius as compared with the chalcogen elements; therefore, as with B, C makes it possible to stabilize the amorphous structure.

Moreover, in addition to reduction in a leakage current by an increase in resistance of the switch layer 30 and stabilization of the OTS phenomenon by stabilization of the amorphous structure, use of a combination of a plurality of kinds of the above-described light elements makes it possible to increase a dielectric strength voltage. Accordingly, the switching threshold voltage is increased.

Further, the switch layer 30 may include one or both of nitrogen (N) and oxygen (O). N and O allow the resistance of the switch layer to be increased by being bonded to B, C, or Si. For example, as illustrated in Table 2, a band gap of a-BN in which B and N are bonded together is 5.05 even in an amorphous state, and $B_2O_3$ in which B and O are bonded together has a band gap of 8.45 eV. Including N or O makes it possible to further increase the resistance value of the switch layer 30 and to reduce the leakage current. Moreover, a bond between the light element and N or O (for example, Si—N, Si—O, B—N, and B—O) contributes to stabilization of the amorphous structure by dispersing the bond in the chalcogenide.

TABLE 2

| Compound | Band Gap (eV) |
| --- | --- |
| a-BN | 5.05 |
| c-BN | 6.4 |
| $B_2O_3$ | 8.45 |
| SiC(β) | 2.36 |
| SiCN | 3.8 |
| SiN | 4.5-5.0 |
| $SiO_2$ | 8.9 |

It is to be noted that in order to increase the resistance value and an insulating property of the chalcogenide, the switch layer 30 may include, in addition to the chalcogen element, the light elements of Si, B, and C, and N or O mentioned above, an element that forms a compound with a high band gap, other than the above-described elements. Examples of such an element may include alkaline-earth metal elements such as magnesium (Mg), zinc (Zn), calcium (Ca), and strontium (Sr), Group 13 elements of the periodic table such as aluminum (Al) and gallium (Ga), and rare earth elements such as yttrium (Y) and lanthanoids that are known as Group II-VI compound semiconductors in combination with the chalcogen element. As illustrated in Table 2, it is estimated that they form a compound with a relatively large band gap in the chalcogenide including nitrogen or oxygen, and it is possible to improve the insulating property of a chalcogenide switch layer in an OFF state in which a voltage is not applied. In particular, most of known chalcogenides including Ge, Sb, As, or any other element have a band gap of lower than 2 eV, and a compound having a band gap of 2.2 eV or higher may be preferably dispersed in the switch layer as illustrated in Table 2 and the following Table 3, which makes it possible to reduce the leakage current.

TABLE 3

| Compound | Band Gap (eV) | Compound | Band Gap (eV) |
| --- | --- | --- | --- |
| MgO | 7.8 | $Gd_2O_3$ | 5.4 |
| MgS | 4.4 | GdTe | 4.79 |
| MgSe | 4.0 | LaTe | 4.45 |
| AlN | 2.5 | CeTe | 4.28 |
| AlTe | 6.2 | SmTe | 5.4 |
| GaN | 3.39 | GeTe | 0.6 |
| GaS | 2.5 | GeSbTe | 0.5-1.5 |
| ZnO | 3.37 | SiTeAsGe | 0.8-2.0 |
| ZnS | 3.6 | As2S3 | 2.13 |
| ZnTe | 2.25 | AsSGe | 1.72 |
| ZnSe | 2.7 | As2Se3 | 1.54 |

Accordingly, in a microscopic structure, a high-resistance compound in which the chalcogen element and these elements are bonded together is formed in the switch layer 30, which makes it possible to further reduce the leakage current. Moreover, these elements are bonded to N or O to form a nitride or an oxide. Nitrides of these elements and oxides of these elements have a relatively large band gap, and have higher resistance than the chalcogenide. Therefore, by microscopically dispersing these nitrides and these oxides in the switch layer 30, the resistance of the switch layer 30 is further increased, and the leakage current is reduced while maintaining the OTS phenomenon. In other words, it is possible for the switch layer 30 in this embodiment to maintain the OTS phenomenon caused by the chalcogen element in the ON state upon voltage application as well as to reduce an off current while maintaining a high on current. This makes it possible to increase an ON/OFF ratio (a resistance ratio).

Moreover, the switch layer 30 may include an additive element in addition to the above-described elements. Examples of the additive element may include chromium (Cr), vanadium (V), and niobium (Nb). The additive element reduces variation in an ovonic threshold switch (OTS) operation of the switch device 1 and improves repetition durability of the switch device 1. Further, in order to achieve stabilization of the amorphous structure, etc., an element (for example, germanium (Ge), arsenic (As), and antimony (Sb)) other than these elements may be further included within a range that the element does not impair effects of the invention.

It is to be noted that when the switch layer 30 is too thin, depending on leakage characteristics during non-selection of the materials of the switch layer 30, it is difficult to reduce the leakage current, and the OTS phenomenon is less likely to be caused. Moreover, when the switch layer 30 is too thick, an issue arises in a miniaturization process. Reducing a device size makes it possible to increase a switching threshold voltage, thereby reducing the leakage current. In a miniaturized switch device (a fine device), there is a tendency that a too thick thickness causes an increase in aspect ratio (a size in a plane direction: a size in a vertical direction (a stacking direction)), thereby causing a difficulty in microfabrication. Accordingly, the thickness of the switch layer 30 may be preferably within a range of 5 nm to 100 nm both inclusive.

The upper electrode 20 may use a known semiconductor wiring material as with the lower electrode 10. A stable material that does not react with the switch layer 30 even after post annealing may be preferable.

As described above, the switch device 1 according to this embodiment reduces resistance by applying a voltage equal to or higher than a certain voltage without phase change between an amorphous phase and a crystalline phase, and returns to a high-resistance state by reducing the applied voltage to a voltage lower than the certain voltage. The certain voltage is referred to as a switching threshold voltage. In other words, in the switch device 1, a phase change is not caused in the switch layer 30 by application of a voltage pulse or a current pulse from an unillustrated power supply circuit (a pulse application section) through the lower electrode 10 and the upper electrode 20. Moreover, the switch device 1 does not perform a memory operation such as maintaining a transmission path formed by ion movement by voltage application even after erasing the applied voltage. Further, the switch device 1 according to this embodiment is used as a selection device that selectively operates a certain memory device in a memory cell array in which a plurality of memory devices are arranged as described above.

As described above, an increase in capacity has been demanded in non-volatile memories (storage units) for data storage, and use of a cross-point array configuration makes it possible to achieve the increase in capacity. In a cross-point array type storage unit (a memory cell array), memory cells configured of the memory device and the switch device are each provided at corresponding one of cross points of intersecting wiring lines. For example, a resistance-change memory device such as a storage device 5 to be described later may be used for the memory device, which makes it possible to achieve a further increase in capacity and an improvement in reliability. However, for example, a resistance-change memory device having high reliability such as data storage characteristics in resistance-change memory devices typically has a high writing threshold voltage (for example, 1 V or higher), or further miniaturization of the resistance-change memory device may further increase the writing threshold voltage. It is therefore desirable that a switch device used in combination with the above-described memory device having high reliability have a large switching threshold voltage.

Moreover, in order to operate a memory cell array of several kBits or more, for example, it is necessary to reduce the leakage current during non-selection (OFF) of the switch device as described above. This is because a failure such as a writing error occurs in a case in which the leakage current is large. Further, in a miniaturized storage unit, in order to obtain a current necessary to operate the memory device, high current density in the ON state is necessary. Accordingly, in the switch device, a large selection ratio (a high on current and a low leakage current) is necessary.

Typical switch devices include the above-described PN diode, the above-described avalanche diode, and the above-described switch devices configured with use of a metal oxide.

The PN diode is fabricated by epitaxially growing silicon from a silicon substrate, forming a P-N junction in polysilicon, or recrystallizing the polysilicon. The PN diode has a relatively large ON/OFF ratio. However, in a case in which the PN diode is formed by epitaxial growth, silicon is grown from the silicon substrate, which does not allow the PN diode to be multilayered. Moreover, in a case in which a P-N junction is formed by recrystallization by laser annealing on polysilicon or any other process, it is difficult to form a multilayered PN diode because of issues such as unnecessary thermal damage to an unintended layer. Further, since the PN diode is basically a unidirectional diode, the PN diode is not allowed to operate a memory device driven by a bidirectional voltage such as a ReRAM, an MRAM, and a STTRAM (Spin Transfer Torque RAM). Some avalanche diodes are able to perform a bidirectional operation; however, the avalanche diodes do not have sufficient characteristics as switch devices used in combination with the resistance-change memory device, etc. in terms of a trade-off between the leakage current in the OFF state and the ON/OFF ratio.

In the switch device configured with use of the metal oxide, the magnitude of the switching threshold voltage is insufficient. Moreover, in a case in which a high voltage is applied to the switch device made of the metal oxide, the switch device easily causes insulation breakdown, and it is difficult for the switch device to operate a resistance-change memory device with a high writing threshold voltage. Further, it is difficult for a typical switch device that makes it possible to operate at a high voltage to sufficiently secure ON/OFF ratios in the selection (ON) state and the semi-selection (OFF) state. Accordingly, even if the switch device is able to operate the memory device, a writing/reading margin of the switch device is small, and it is therefore difficult for the switch device to properly operate a memory cell array in which a large number of memory cells are provided by miniaturization.

As the switch device having an ON/OFF ratio, an OTS device using a chalcogenide material is adopted. In the OTS device, an OTS layer provided between electrodes may be made of, for example, a chalcogenide such as GeTe, GeSbTe, GeSiAsTe, GeSe, GeSbSe, GeSiAsSe, GeS, GeSbS, or GeSiAsS. The electrodes generally oppose each other. The switch device made of any of these chalcogenides has a characteristic (ovonic threshold switch) in which a current is abruptly increased at a certain threshold voltage or higher; therefore, the switch device obtains relatively large current density in the ON state, as compared with other switch devices such as the PN diode. However, the switching threshold voltage is not sufficiently high, and in a case in which the resistance-change memory device with a high writing threshold voltage and the OTS device are combined together, the OTS device is switched before the memory device is switched. This causes an issue that a voltage margin for reading or writing is narrowed. Moreover, the leakage current in the non-selection (OFF) state is large, which easily causes a malfunction (a writing error or an erasing error). In particular, in a large memory cell array, the issue of the leakage current becomes serious in proportion to the size of the memory cell array; therefore, a larger ON/OFF ratio is demanded to increase the writing/reading margin.

Moreover, the band gap of the chalcogenide forming a typical switch device is about 2.2 eV at most (refer to Table 2). Therefore, with a thickness allowing for miniaturization (for example, 100 nm or less), it is difficult to sufficiently reduce the leakage current.

In contrast, in the switch device 1 according to this embodiment, the switch layer 30 is formed with use of the chalcogen element such as Te, Se, and S, one or more kinds selected from Si, B, and C, and one or both of O and N. The switch layer 30 increases the resistance value by dispersing a high-resistance element (for example, B or Si) or a high-resistance compound (for example, BN, $B_2O_3$, SiN, SiC, and $SiO_2$), thereby reducing the leakage current in the OFF state.

Moreover, in this embodiment, addition of an element such as B, C, Si, N, or O to the chalcogenide stabilizes the amorphous structure, thereby obtaining a stable OTS phenomenon and remarkably reducing the resistance value in the ON state. Further, the metalloid light element has relatively large binding energy with the chalcogen element; therefore, the metalloid light element makes it possible to increase a breakdown voltage, thereby increasing an ovonic threshold voltage. This makes it possible to increase the ON/OFF ratios of a current in the selection state and the non-selection state and the value of the switching threshold voltage. Further, it is possible to reduce the leakage current by dispersing a compound with a large band gap such as BN, SiN, or SiCN in the switch layer 30.

Next, description is given of second and third embodiments and a modification example. In the following, same components as the components of the foregoing first embodiment are denoted by same reference numerals, and any redundant description thereof is omitted.

2. Second Embodiment

FIG. 2 illustrates a cross-sectional configuration of a switch device 2 according to the second embodiment of the disclosure. As with the above-described switch device 1, the switch device 2 is adapted to selectively operate a certain storage device of a plurality of storage devices arranged in a memory cell array with a so-called cross-point array configuration. As with the foregoing first embodiment, the switch device 2 includes the lower electrode 10, a switch layer 40, and the upper electrode 20 in this order.

The switch layer 40 in this embodiment includes a Group 16 element of the periodic table, more specifically, a chalcogen element such as S, Se, and Te, and further includes an alkaline-earth metal such as Mg, Ca, and Sr, a Group 13 element of the periodic table such as Al and Ga, or a rare earth element such as Y and lanthanoids. These elements are included to be bonded to the chalcogen element, thereby forming a chalcogenide such as MgTe, CaTe, SrTe, $Al_2Te_3$, $Ga_2Te_3$, and $Y_2Te_3$. A resistance value of the switch layer 40 is increased by microscopically dispersing these chalcogenides in the switch layer 40. Accordingly, a leakage current in the non-selection state is reduced.

Moreover, the switch layer 40 may include O or N in addition to the above-described elements. O or N forms a high-resistance compound with a relatively large band gap such as MgO, $Al_2O_3$, GaN, and AlN in the switch layer 40. As with the above-described chalcogenides of the alkaline-earth metal, etc., these compounds increase the resistance value of the switch layer 40 by microscopically dispersing these compounds in the switch layer 40.

Further, the switch layer 40 may include a metalloid light element such as B, C, and Si. As described above, a lighter element in metalloids has large binding energy, and has an effect of increasing the switching threshold voltage of the OTS device (for example, the switch device 2). Furthermore, these elements have an effect of increasing resistance of the switch layer 40 by addition of these elements to the chalcogenide that forms the switch layer 40. Therefore, when the above-described metalloid light element is included, the switching threshold voltage of the switch layer 40 is increased, and resistance is increased to reduce the leakage current in the OFF state. In particular, B has low conductivity even in the form of a simple substance, and makes it possible to further increase the resistance value of the switch layer 40. Moreover, as compared with the chalcogen elements, B, C, and Si have a small ionic radius, which makes it possible to stabilize the amorphous structure. Accordingly, the OTS phenomenon of the switch device 2 is stabilized. It is to be noted that, in a case in which O or N is included in the switch layer 40, these light elements make it possible to form, for example, a B—O bond or a B—N bond, thereby further increasing the resistance value of the switch layer 40.

It is to be noted that the switch layer 40 may include Zn, Cr, V, and Nb as additive elements other than the above-described elements. The additive elements reduce variation in an OTS operation of the switch device 2 and improve repetition durability of the switch device 2. Further, in order to achieve stabilization of the amorphous structure, an element (for example, Ge, As, and Sb) other than these elements may be further included within a range that the element does not impair effects of the disclosure. It is to be noted that, the switch layer 40 maintains the amorphous structure, thereby maintaining the OTS phenomenon.

As described above, an OTS layer of a typical OTS device is mainly made of the chalcogen element and As, Sb, or Ge. Such an OTS layer has an issue that while the amorphous structure is stabilized, the leakage current during non-selection is large.

In contrast, in this embodiment, the switch layer 40 is made of the chalcogen element and one of the alkaline-earth metal such as Mg, Ca, and Sr, the Group 13 element of the periodic table such as Al and Ga, and the rare earth element such as Y and lanthanoids. As with the foregoing first embodiment, this makes it possible to increase the resistance value of the switch layer 40 to reduce the leakage current, thereby improving a selection ratio at the time of ON/OFF.

3. Third Embodiment

FIG. 3 illustrates a cross-sectional configuration of a switch device 3A according to the third embodiment of the disclosure. As with the above-described switch device 1, the switch device 3A is adapted to selectively operate a certain storage device of a plurality of storage devices arranged in a memory cell array with a so-called cross-point array configuration. The third embodiment differs from the foregoing first embodiment in that the switch device 3A includes the lower electrode 10, a high-resistance layer 50, the switch layer 30, and the upper electrode 20 in this order, and the high-resistance layer 50 is formed between the lower electrode 10 and the switch layer 30.

As with the foregoing first embodiment, the switch layer 30 includes a Group 16 element of the periodic table, more specifically, a chalcogen element such as S, Se, and Te, and further includes one or more kinds selected from Si, B, and C that are metalloid light elements, and one or both of O and N. The resistance value of the switch layer 30 is increased by forming the switch layer 30 of the chalcogenide of the chalcogen element and the above-described light element to increase the selection ratio at the time of ON/OFF and increase the switching threshold voltage.

The high-resistance layer 50 is provided in contact with the switch layer 30, and in this case, the high-resistance layer 50 is provided on the lower electrode 10 side. As a material forming the high-resistance layer 50, an oxide, a nitride, or an oxynitride of a metal element or a metalloid element that makes it possible to have a sufficient resistance value (a higher insulation property than that of the switch layer 30) with a thickness of about several nm may be preferably used. Examples of such a metal element and such a metalloid element may include Al, gallium (Ga), Mg, Si, B, Ca, Sr, Cr, hafnium (Hf), and rare earth elements. Further, a high-resistance compound such as SiC may be used.

The high-resistance layer 50 in this embodiment has a transmission path with a size of about several nm therein. The transmission path is a defect formed during an initial writing operation (forming), and is adapted to control an actual operation region of the switch device 3A. More specifically, most of a voltage applied to the switch device 3A is applied to the switch layer 30 through the transmission path formed in the high-resistance layer 50 to apply an electric field to the switch layer 30. When the strength of the electric field reaches a certain value or higher, in the switch layer 30, charge carriers by ionizing collision caused by an electron state of the chalcogen element are increased to abruptly increase a current (to perform an OTS operation), thereby reducing resistance. In other words, the switch device 3A is turned to the ON state. It is to be noted that, when the voltage applied to the switch device 3A is reduced to be lower than the threshold voltage, the carriers generated by the ionizing collision are recombined to be eliminated, and the switch layer 30 is returned to the high-resistance state again. Thus, it is possible for the switch device 3A to obtain a large ON/OFF ratio.

It is to be noted that all of the elements in the high-resistance layer 50 may not be necessarily in an oxide (or nitride or oxynitride) state, and some of the elements may be oxidized (or nitrided). The high-resistance layer 50 may desirably have a higher insulation property than the switch layer 30. The thickness of the high-resistance layer 50 is not specifically limited, but may be preferably within a range of 2 nm to 30 nm both inclusive, for example, to reduce the thickness of the switch layer 30 and minimize the leakage current during non-selection.

Moreover, the high-resistance layer 50 may be provided in contact with the switch layer 30, and may be provided between the switch layer 30 and the upper electrode 20, for example, as illustrated in FIG. 4 (a switch device 3B). Alternatively, high-resistance layers 50A and 50B may be respectively provided on both the lower electrode 10 side and the upper electrode 20 side of the switch layer 30 as illustrated in FIG. 5 (a switch device 3C).

As described above, in switch devices 3 (3A, 3B, and 3C) according to this embodiment, the following effect is obtained in addition to the effects of the foregoing first embodiment by providing the high-resistance layer 50 in contact with the switch layer 30. Even in a case in which the thickness of the switch layer 30 is small, it is possible to secure sufficient current density in the ON state and to reduce a leakage current to a non-selected device and a semi-selected device in the OFF state. Accordingly, an effect of allowing for achievement of a further miniaturized high-capacity memory cell array is obtained.

Moreover, the switching threshold voltages of the switch devices 3 are adjustable by selecting the thickness and the material of the high-resistance layer 50. This allows for an operation in a storage unit including a storage device that needs a higher applied voltage such as the storage device 6Y.

4. Modification Example

FIG. 6 illustrates a cross-sectional configuration of a switch device 4 according to a modification example of the disclosure. As with the switch device 1, the switch device 4 is adapted to selectively operate a certain storage device of a plurality of storage devices arranged in a memory cell array with a so-called cross-point array configuration. As with the foregoing third embodiment, the switch device 4 includes the lower electrode 10, the high-resistance layer 50, a switch layer 60, and the upper electrode 20 in this order.

The switch layer 60 in the modification example has a configuration in which the switch layer 30 in the foregoing first (or third) embodiment and the switch layer 40 in the second embodiment are combined together. In other words, the switch layer 60 has a configuration including a Group 16 element of the periodic table, more specifically, a chalcogen element such as S, Se, and Te, and further including at least one or more kinds selected from a Si, B, and C that are metalloid light elements, one or both of O and N, and a alkaline-earth metal such as Mg, Ca, and Sr, a Group 13 element of the periodic table such as Al and Ga, or a rare earth element such as Y and lanthanoids. With such a configuration, the resistance value of the switch layer 60 is increased to increase the selection ratio at the time of ON/OFF, and the switching threshold voltage is increased.

It is to be noted that Te as the chalcogen element and Mg as the alkaline-earth metal element may be preferably used. MgTe with a large band gap is dispersed in the switch layer 60 to increase the resistance value of the switch layer 60, thereby reducing the leakage current in the OFF state. In addition, an additive element such as Zn and Cr may be included. The additive element reduces variation in the OTS operation of the switch device 4 and improves repetition durability of the switch device 4. Moreover, Ge, As, Sb, and any other element may be included without departing from the scope of the disclosure. The amorphous structure of the switch layer 60 is stabilized by addition of them.

As described above, in the switch device 4 according to the modification example, the effects in the first to third embodiments are obtained. In other words, the switch layer 30 is formed with use of the chalcogen element, the light element such as Si, B, and C, one or both of O and N, and the alkaline-earth metal such as Mg, Ca, and Sr, the Group 13 element of the periodic table such as Al and Ga, or the rare earth element such as Y and lanthanoids, thereby reducing the leakage current in the OFF state and increasing the current passing in the ON state.

It is to be noted that the high-resistance layer 50 in this embodiment may be provided in contact with the switch layer 60 as with the foregoing third embodiment, and the high-resistance layer 50 may be provided on one or both of the upper electrode side and the lower electrode side of the switch layer 60 as illustrated in FIG. 4 and FIG. 5.

5. Storage Unit

A storage unit is configured of a line or matrix arrangement of a large number of memory cells. The memory cells are each configured of a switch device and a memory device. It is possible to use, as the switch device (the switch device 6X, refer to FIG. 7), any of the switch devices 1 to 4 according to the foregoing first to third embodiments and the foregoing modification example, and the switch device is coupled in series to the memory device (the storage device 6Y, refer to FIG. 7). A memory cell 6 is coupled to a sense amplifier, an address decoder, a writing-erasing-reading circuit, and any other component through a wiring line.

FIG. 7 illustrates an example of a so-called cross-point array storage unit (a memory cell array 5) in which the memory cells 6 are each provided at corresponding one of intersections (cross points) of intersecting wiring lines. In the memory cell array 5, for the memory cells 6, wiring lines (for example, bit lines BL (row lines)) coupled to the lower electrode 10 side and wiring lines (for example, word lines WL (vertical lines)) coupled to the upper electrode 20 side are so provided as to intersect with each other, and each of the memory cells 6 may be provided, for example, around corresponding one of intersections of these wiring lines. Use of such a cross-point array configuration makes it possible to reduce a floor area per unit cell and achieve an increase in capacity.

The storage device 6Y configuring the memory cell 6 may include, for example, a lower electrode, a storage layer 70, and an upper electrode in this order. The storage layer 70 may be configured of a stacking configuration in which a resistance change layer 72 and an ion source layer 71 are stacked from the lower electrode side, or a single-layer configuration of the resistance change layer 72. It is to be noted that an intermediate electrode 80 is provided between the switch layer 30 and the storage layer 70, and the intermediate electrode 80 serves as both an upper electrode of the switch device 6X and a lower electrode of the storage device 6Y. More specifically, for example, the memory cell 6 may have a configuration in which the switch layer 30, the intermediate electrode 80, the resistance change layer 72, and the ion source layer 71 are stacked in this order between the lower electrode 10 and the upper electrode 20 as illustrated in FIG. 8.

The ion source layer 71 includes a mobile element forming a transmission path in the resistance change layer 72 by application of an electric field. Examples of the mobile element may include transition metal elements (Group 4 to 6 elements of the periodic table (for example, Ti, Zr, Hf, V, Nb, Ta, Cr, Mo, and W)), Al, copper (Cu), and chalcogen elements, and the ion source layer 71 includes one kind or two or more kinds selected from them. Moreover, the ion source layer 71 may include O and N, or an element other than the above-described elements, for example, manganese (Mn), cobalt (Co), iron (Fe), nickel (Ni), platinum (Pt), and silicon (Si).

The resistance change layer 72 may be made of, for example, an oxide or a nitride of a metal element or a nonmetal element, and is adapted to change its resistance value when a predetermined voltage is applied between a pair of electrodes (herein, between the intermediate electrode 80 and the upper electrode 20). More specifically, when a voltage is applied between the intermediate electrode 80 and the upper electrode 20, the transition metal element included in the ion source layer 71 is moved to inside the resistance change layer 72 to form a transmission path, thereby reducing the resistance of the resistance change layer 72. Alternatively, a structural defect such as an oxygen defect or a nitrogen defect occurs in the resistance change layer 72 to form a transmission path, thereby reducing the resistance of the resistance change layer 72. Moreover, when a voltage in a reverse direction is applied, the transmission path is disconnected or conductivity changes, thereby increasing the resistance of the resistance change layer 72.

It is to be noted that all of the metal elements and the nonmetal elements included in the resistance change layer 72 may not be necessarily in an oxide state, and some of them may be oxidized. Moreover, it is only necessary for an initial resistance value of the resistance change layer 72 to achieve a device resistance of about several MΩ to about several hundreds of GΩ, for example. Although an optimum initial resistance value of the resistance change layer 72 varies depending on the size of the device and the resistance value of the ion source layer 71, a thickness of the resistance change layer 72 may be preferably within a range of 0.5 nm to 10 nm both inclusive, for example.

The intermediate electrode 80 may be made of, for example, a material that prevents constituent elements of chalcogenides forming the switch layer 30 and the ion source layer 71 from being dispersed by application of an electric field. This is because, for example, the ion source layer 71 includes transition metal elements (for example, Cu) as elements that perform a memory operation and maintain a writing state, and when these transition metal elements are dispersed in the switch layer 30 by application of an electric field, switch characteristics may be deteriorated. Therefore, examples of a material of the intermediate electrode 80 may include known barrier materials having a barrier property of preventing dispersion of the transition metal elements and ion conduction. The known barrier material may include W, tungsten nitride (WN), titanium nitride (TiN), C, tantalum (Ta), tantalum nitride (TaN), and TiW (titanium-tungsten).

The storage device 6Y is a resistance-change storage device that changes electrical characteristics (a resistance value) of the storage layer 70 when a voltage pulse or a current pulse is applied from a unillustrated power supply circuit (a pulse application section) through the lower electrode 10 and the upper electrode 20, and the storage device 6Y performs writing, erasing, and reading of information. It is to be noted that, in the storage device 6Y, the transmission path formed by voltage application is maintained even after erasing the applied voltage, and the resistance value is maintained.

More specifically, in the storage device 6Y, when a voltage or a current pulse in a "positive direction" (for example, a negative potential on the intermediate electrode 80 side and a positive potential on the upper electrode 20 side) is applied to the device in an initial state (a high-resistance state), an oxygen defect occurs in the resistance change layer 72 by ionizing metal elements (for example, transition metal elements) included in the ion source layer 71 to disperse the ionized metal elements in the storage layer 70 (for example, in the resistance change layer 72) or by moving oxygen ions. Accordingly, a low-resistance section (a transmission path) in a low-oxidization state is formed in the storage layer 70, and the resistance of the resistance change layer 72 is reduced (a storage state). When a voltage pulse is applied to the device in the low-resistance state toward a "negative direction" (for example, a positive potential on the intermediate electrode 80 side and a negative potential on the upper electrode 20 side), metal ions in the resistance change layer 72 are moved into the ion source layer 71, or oxygen ions are moved from the ion source layer 71 to reduce the oxygen defect of a transmission path portion. Accordingly, the transmission path including the metal elements disappears to turn the resistance of the resistance change layer 72 to a high state (the initial state or an erasing state). It is to be noted that, in a case in which the storage layer 70 has a single-layer configuration of the resistance change layer 72, when a voltage (or a current pulse) in the positive direction is applied, a defect occurs by an electric field applied to the resistance change layer 72, and the defect forms a transmission path to reduce the resistance of the resistance change layer 72. When a voltage pulse in the negative direction is applied in this state, movement of oxygen ions or nitrogen ions in the resistance change layer 72 causes a reduction in the defect, that is, disconnection of the transmission path, thereby increasing the resistance.

It is to be noted that the stacking order of the stacking configuration of the switch device 6X and the storage device 6Y in the memory cell 6 is not limited to that in a memory cell 6A illustrated in FIG. 8. For example, as with a memory cell 6B illustrated in FIG. 9, for example, the switch device 4 may be used, and a configuration in which the high-resistance layer 50 and the switch layer 60 are stacked in order from the lower electrode 10 side, and the ion source layer 71 and the resistance change layer 72 are further stacked on the switch layer 60 with the intermediate electrode 80 in between may be adopted. Alternatively, a configuration without the intermediate electrode 80 may be adopted. In this case, for example, as with a memory cell 6C illustrated in FIG. 10, the switch layer 30, the resistance change layer 72, and the ion source layer 71 may be stacked in order from the lower electrode 10 side.

Moreover, the switch layer 30 and the storage layer 70 may be so formed as to change the stacking order thereof. Further, production and erasing of the transmission path in the above-described high-resistance layer 50 are similar to operations in the resistance change layer 72 in the storage device 6Y; therefore, the high-resistance layer 50 and the resistance change layer 72 may be shared with each other. Accordingly, the switch layer 30 and the ion source layer 71 may be so disposed with the high-resistance layer 50 in between as to allow the high-resistance layer 50 of the switch layer 30 to also serve as the resistance change layer 72 of the storage layer 70. Furthermore, two resistance change layers 72 may be provided on both the lower electrode 10 side and the upper electrode 20 side of the ion source layer 71 and may be stacked with the switch layer 30.

It is to be noted that, in the memory cell array of the disclosure, for example, a so-called resistance-change storage device (memory device) including the storage layer 70 in which the ion source layer 71 and the resistance change layer 72 are stacked is used as the storage device 6Y; however, the storage device 6Y is not limited thereto. For example, a resistance-change memory made of a transition metal oxide, a PCM (phase-change memory), or an MRAM (magnetic random access memory) may be used as the storage device 6Y.

FIGS. 11A to 11D illustrate relationships between an applied voltage and a current value passing through an electrode during writing (for example, a forward bias) and erasing (for example, a reverse bias) of the switch device 6X according to any of the embodiments (any one of the switch devices 1 to 4), the storage device 6Y, and the memory cell 6 configured of a combination of the switch device 6X and the storage device 6Y. A solid line indicates an I-V characteristic upon voltage application and a dotted line indicates an I-V characteristic when the applied voltage is swept toward a decreasing direction.

FIG. 11A illustrates an I-V characteristic of the switch device 6X. When a forward bias (herein, a writing voltage) is applied to the switch device 6X, in the switch device 6X, a current increases with an increase in the applied voltage as described above; however, when the applied voltage exceeds a certain threshold voltage (a switching threshold voltage), by the OTS operation, the current is abruptly increased or the resistance is decreased to turn the switch device 6X to the ON state (A1). After that, when the applied voltage is decreased, the current value passing through the electrode of the switch device 6X is gradually decreased. For example, depending on the materials and formation conditions of the switch device 6X, the resistance is abruptly increased at a threshold voltage substantially equal to that when the applied voltage is increased to turn the switch device 6X to the OFF state (A2). It is to be noted that H1 in FIG. 11A indicates a selection ratio of the switch device 6X.

FIG. 11B illustrates an I-V characteristic of the storage device 6Y. As can be seen from FIG. 11B, in the storage device 6Y, the current value increases with an increase in the applied voltage; however, a writing operation by formation of a transmission path in the resistance change layer 72 of the storage layer 70 is performed at a certain threshold voltage, and the storage device 6Y is turned to a low-resistance state to increase the current. In other words, the resistance value of the storage device 6Y is turned to the low-resistance state by application of the writing voltage, and this low-resistance state is maintained even after voltage application stops.

FIG. 11C illustrates an I-V characteristic of the memory cell 6. A switching behavior of a current value at the start and end of application of a writing voltage to the memory cell 6 configured of a combination of the above-described storage device 6Y and the above-described switch device 6X is indicated by an I-V curve C1 in FIG. 11C. The I-V curve C1 is a combination of I-V curves A1 and B1 of the switch device 6X and the storage device 6Y. In such a memory cell 6, for example, in a V/2 bias system cross-point array, a reading voltage (Vread) and a voltage Vread/2 of the memory cell 6 are respectively set to a voltage larger than a threshold value at which resistance is abruptly changed on the I-V curve C1 and a voltage smaller than the threshold value at the resistance change. This makes it possible to obtain a large selection ratio (ON/OFF ratio) defined by a current ratio between a Vread bias and a Vread/2 bias. Moreover, since the I-V curve C1 of the memory cell 6 is a combination of the IV curve A1 of the switch device 6X and the I-V curve B1 of the storage device 6Y as described above, the larger a resistance change (or a current change) around a threshold value of an ovonic threshold switch of the switch device 6X is, the larger selection ratio (ON/OFF ratio) is obtainable. Moreover, the larger the selection ratio is, the more a reading margin is increased. This makes it possible to increase the size of the cross-point array without a reading error, thereby further increasing the capacity of the memory cell array.

This applies to not only the reading operation but also a writing operation. FIG. 11D illustrates an I-V characteristic of the memory cell 6 as with FIG. 11C. In the cross-point array, a large number of bits are coupled to a bit line BL or a word line WL that is coupled to a target memory cell as described above. Accordingly, when a leakage current during non-selection biased by Vwrite/2 that is indicated by an intersection of Vwrite/2 and an I-V loop in a Set state of a dotted line of the I-V curve C1 is large as illustrated in FIG. 11D, a writing error may occur in a non-selected memory cell. Therefore, in the writing operation, while the writing voltage Vwrite is set to a voltage that makes it possible to obtain a current necessary to perform writing on the storage device 6Y, it is necessary to reduce a leakage current to an extent that a writing error does not occur in the non-selected memory cell biased by Vwrite/2. In other word, the smaller the leakage current during non-selection biased by Vwrite/2 is, the larger cross-point array is allowed to operate without a writing error. Thus, an increase in the ON/OFF ratio of the switch device 6X even during the writing operation leads to an increase in capacity of the memory cell array.

In contrast, when a reverse bias (herein, an erasing voltage) is applied, a change in the current value upon application of the erasing voltage to the switch device 6X exhibits a behavior similar to that upon application of the writing voltage (an I-V curve A2 in FIG. 1A). On the contrary, the current value upon application of the erasing voltage to the storage device 6Y is changed from a low-resistance state to a high-resistance state by application of a voltage equal to or higher than an erasing threshold voltage (an I-V curve B2 in FIG. 11B). Moreover, a change in the current value upon application of the erasing voltage to the memory cell 6 configured of a combination of the storage device 6Y and the switch device 6X is indicated by a combination of the I-V curve A2 of the switch device 6X and the I-V curve B2 of the storage device 6Y in a similar way to that upon application of the writing voltage (an I-V curve C2 in FIG. 11C or FIG. 11D).

It is to be noted that, in the V/2 bias system cross-point array, for example, even in a case in which a reading bias is set to a writing side, the leakage current during erasing at a Vreset/2 bias causes an issue. More specifically, in a case in which the leakage current is large, an unintended erasing error may occur. Accordingly, as with the case in which the forward bias is applied, a larger ON/OFF ratio of the switch device 6X and a smaller leakage current at the time of OFF are more advantageous in an increase in the size of the cross-point array. In other words, they lead to an increase in capacity of the memory cell array.

Moreover, in the storage unit according to this embodiment, the memory cell array using a bipolar resistance-change storage device 6Y is described as an example; however, this embodiment is not limited thereto. The switch device 6X of the disclosure may be applied to, for example, any memories such as an OTP (One Time Programmable) memory that uses a fuse or an anti-fuse and is able to perform writing only once, a unipolar phase change random access memory PCRAM, and a magnetic memory using a magnetoresistance-change device.

Further, in the storage unit according to this embodiment, a plurality of memory cells 6 are arranged in a plane (two-dimensionally, in an XY plane direction); however, the storage unit may have a three-dimensional configuration in which the memory cells 6 are stacked in a Z-axis direction. It is possible to form the switch device 6X of the technology at a low temperature (for example, from a room temperature to about 100° C.). Accordingly, even in a case in which the memory cells are arranged in a multilayered pattern, it is possible to form the memory cells without causing unintended thermal damage to other layers. This makes it possible to provide a storage unit with higher density and higher capacity.

6. Examples

In the following, description is given of specific examples of the disclosure.

(Experiment 1-1)

First, a sample (the switch device 4; Experimental Example 1-1) including the switch layer 60 and the high-resistance layer 50 between the lower electrode 10 and the upper electrode 20 was fabricated, and the ON/OFF ratio and the leakage current of the sample were determined by calculation. Moreover, adhesion of the switch layer 60 was examined. The sample was fabricated in the following way.

Cleaning of the lower electrode 10 was performed by reverse sputtering. The lower electrode 10 was made of TiN on a substrate where a MOS transistor circuit was formed. Thereafter, the switch layer 30 (a TeBCN film) was fabricated on TiN. The TeBCN film was formed with a thickness of 20 nm by sputtering. Film formation conditions of the TeBCN film were so adjusted as to cause the composition ratio of Te, B, and C except for nitrogen as a gas to be Te40B48C12 (at %). Addition of nitrogen (N) was performed by reactive sputtering with N2 (5 sccm)/Ar (45 sccm) (at a nitrogen flow ratio of 10%). When XPS analysis was performed on the BCTeN film, the composition ratio was about Te28B33.6C8.4N30 (at %), and the N composition ratio included in the actual TeBCN film was about 30 at %. Next, a film of W was formed with a thickness of 30 nm to form the upper electrode 20. Then, microfabrication was performed with use of photolithography, dry etching, or any other process to have a device size of 120 nmφ. Thus, the sample (Experimental Example 1) was fabricated. FIG. 12 illustrates an I-V characteristic of Experimental Example 1-1, and illustrates a typical example of a DC loop that was coupled to a series resistance of 37 kΩ and was measured.

As can be seen from FIG. 12, in Experimental Example 1-1, the OTS operation was observed at 2 V or higher in both positive and negative biases, and switching threshold voltages outgoing and returning in the positive bias direction were about 2.6 V. The ON/OFF ratio and the leakage current in Experimental Example 1 were determined in the following way. A voltage higher by 0.1 V than the switching threshold voltage was applied to a switch device (the switch device 6X) during writing to a memory device (the storage device 6Y), and a voltage V was 2.7 V in a positive bias and 1.35 V during semi-selection (V/2). When the ON/OFF ratio was determined from current values at the respective applied voltages under this condition, the value of the ON/OFF ratio was $4.3 \times 10^3$. Moreover, for the sake of convenience, a current when a positive bias of 0.5 V was applied was considered as the leakage current, and the value of the leakage current was $2.5 \times 10^{-10}$ A (0.25 nA).

(Experiment 1-2)

Next, samples (Experimental Examples 1-2 to 1-4) were fabricated with the same material composition as that of the switch layer 60 of Experimental Example 1-1. The thickness of the switch layer 60 in the samples was smaller than 20 nm (Experimental Example 1-1). The switching threshold voltage of each of the samples with a device size of 120 nmφ and a device size of 20 nmφ was measured in a similar way to that of Experimental Example 1-1. Table 4 summarizes the thickness of the switch layer and the switching threshold voltages in the respective device sizes in the samples of the experiment (Experimental Examples 1-2 to 1-4) together with Experimental Example 1-1.

TABLE 4

| | Thickness of Switch Layer | Switching Threshold Voltage (V) | |
|---|---|---|---|
| | (nm) | 120 nmφ device | 20 nmφ device |
| Experimental Example 1-1 | 20 | 2.6 | 3.8 |
| Experimental Example 1-2 | 15 | 2.2 | 3.2 |
| Experimental Example 1-3 | 10 | 1.8 | 2.8 |
| Experimental Example 1-4 | 5 | 1.3 | 2.2 |

As can be seen from the results summarized in Table 4, in a switch device material of Experimental Example 1-1, the switching threshold voltage was increased with a decrease in the device size. Moreover, in the fine device that operated until the switch layer 60 had a thickness of 5 nm and had a device size of 20 nm, the switching threshold voltage was 2.2 V. This showed that in a switch device material of the invention, the switch layer 60 needed at least a thickness of 5 nm. It is to be noted that an upper limit of the thickness of the switch layer 60 may be preferably 100 nm or less in order not to cause a difficulty in a microfabrication process.

(Experiment 2: Electrical Characteristics)

Next, samples were fabricated, and composition dependence on electrical characteristics of the switch devices of the disclosure was evaluated. In each of the samples, the switch layer with a thickness of 20 nm was formed between the lower electrode and the upper electrode, and each of the samples was so microfabricated as to have a device size of 120 nmφ. A table in which the composition ratios of the respective samples are summarized is given below, and values of the composition ratios of constituent elements other than gases of N, O, and any other element are composition ratios (at %) in a state without addition of N or O. The values of N and O are represented by a flow ratio of $N_2/(Ar+N_2)$ or $O_2/(Ar+O_2)$ in reactive sputtering.

(Experiment 2-1)

First, samples (Experimental Examples 2-1 to 2-7) made of Ge and Te (and Sb or/and N) were fabricated as switch devices (switch layers) serving as comparative examples, and the leakage currents and the switching threshold voltages of the samples were measured. It is to be noted that the switching threshold voltages were measured by adding a series resistance of 37 kΩ. Table 5 summarizes the composition ratios, the leakage currents, and the switching threshold voltages of the respective samples (Experimental Examples 2-1 to 2-7).

TABLE 5

| | Composition of Switch Layer | | | | Characteristic Value | |
|---|---|---|---|---|---|---|
| | Te | Ge | Sb | N (Flow Ratio) | Leakage Current (nA) | Switching Threshold Voltage (V) |
| Experimental Example 2-1 | 85 | 15 | — | — | 18 | 1.1 |
| Experimental Example 2-2 | 80 | 20 | — | — | 10 | 1.7 |
| Experimental Example 2-3 | 70 | 30 | — | — | 930 | — |
| Experimental Example 2-4 | 60 | 40 | — | — | 400 | — |
| Experimental Example 2-5 | 80 | 20 | — | 5 | 5 | 1.5 |
| Experimental Example 2-6 | 56 | 22 | 22 | — | 6500 | — |
| Experimental Example 2-7 | 56 | 22 | 22 | 5 | 1400 | — |

As illustrated in Table 5, in a case in which the switch layer was made of GeTe, GeTeSb, GeTeN, etc., the switching threshold voltage was as small as 1.1 V to 1.7 V. In Experimental Examples 2-3 and 2-4 in which the Ge composition ratio was 30 at % and 40 at %, the OTS phenomenon was not observed. It was considered that insulation breakdown occurred to cause a noticeable increase in the leakage current. Moreover, even in Experimental Examples 2-6 and 2-7 including GeTeSb, the OTS phenomenon was not observed, and the leakage current was large.

As described above, in a case in which the switching threshold voltage of the switch device is smaller than the writing threshold voltage of the memory device, a malfunction such as a writing error is more likely to occur. In other words, in a case in which the switching threshold voltage is small, it is difficult to operate a resistance-change memory device having a large writing threshold voltage. In particular, the above-described Experimental Examples 2-1 to 2-7 had a large leakage current of 5 nA or higher, and in a case in which a threshold current at which a writing error occurs in a V/2 bias system array is 1 μA, only an array of several kbits or smaller is operable. Moreover, even when miniaturization effect is added in the switch device having the above-described material configuration, the OFF leakage current is not sufficiently low, and a sufficient switching threshold voltage is not obtained.

(Experiment 2-2)

Next, samples (Experimental Example 3-1 to 3-28) in which the switch layer was made of Te and B (and N or O) were fabricated as examples of the technology, and the leakage currents and the switching threshold voltages of the samples were measured. Table 6 summarizes the composition ratios of the samples (Experimental Examples 3-1 to 3-28). A relationship between the composition of the switch layer and the switching threshold voltage or the leakage current was verified with use of these samples. The relationship is illustrated in FIGS. 13 to 18.

TABLE 6

| | Composition of Switch Layer | | | |
|---|---|---|---|---|
| | Te | B | N (Flow Ratio) | O (Flow Ratio) |
| Experimental Example 3-1 | 5 | 95 | — | — |
| Experimental Example 3-2 | 10 | 90 | — | — |
| Experimental Example 3-3 | 20 | 80 | — | — |
| Experimental Example 3-4 | 30 | 70 | — | — |
| Experimental Example 3-5 | 40 | 60 | — | — |
| Experimental Example 3-6 | 50 | 50 | — | — |
| Experimental Example 3-7 | 60 | 40 | — | — |
| Experimental Example 3-8 | 70 | 30 | — | — |
| Experimental Example 3-9 | 30 | 70 | 5 | — |
| Experimental Example 3-10 | 30 | 70 | 7 | — |
| Experimental Example 3-11 | 30 | 70 | 10 | — |
| Experimental Example 3-12 | 30 | 70 | 12 | — |
| Experimental Example 3-13 | 30 | 70 | 15 | — |
| Experimental Example 3-14 | 30 | 70 | 20 | — |
| Experimental Example 3-15 | 30 | 70 | 25 | — |
| Experimental Example 3-16 | 30 | 70 | 30 | — |
| Experimental Example 3-17 | 50 | 50 | 5 | — |
| Experimental Example 3-18 | 50 | 50 | 10 | — |
| Experimental Example 3-19 | 50 | 50 | 15 | — |
| Experimental Example 3-20 | 10 | 90 | 10 | — |
| Experimental Example 3-21 | 10 | 90 | 15 | — |
| Experimental Example 3-22 | 70 | 30 | 10 | — |
| Experimental Example 3-23 | 30 | 70 | — | 1 |
| Experimental Example 3-24 | 30 | 70 | — | 3 |
| Experimental Example 3-25 | 30 | 70 | — | 5 |
| Experimental Example 3-26 | 30 | 70 | — | 7 |
| Experimental Example 3-27 | 30 | 70 | — | 10 |
| Experimental Example 3-28 | 30 | 70 | — | 12 |

FIG. 13 illustrates a relationship between the B composition ratio and the switching threshold voltage in Experimental Examples 3-1 to 3-8. As can be seen from FIG. 13, the switch layer tended to increase the switching threshold voltage with an increase in the B composition ratio, and when the B composition ratio was set to 60 at % to 90 at % both inclusive, the switching threshold voltage of 2 V or higher was obtained.

FIG. 14 illustrates a relationship between the B composition ratio and the leakage current. The leakage current was varied depending on the B composition ratio, and had a minimum value within a range of 80 at % to 90 at % both inclusive. However, when the B composition ratio exceeded 90 at %, the switch phenomenon was not observed. In the switch device (Experimental Examples 2-1 to 2-4) including the switch layer made of a GeTe-based chalcogenide, when the Ge composition ratio exceeded 30 at %, the switch phenomenon was less likely to be caused due to insulating breakdown or any other factor. In contrast, in the switch device including the switch layer made of a BTe-based chalcogenide as an example, even when the B composition ratio was 80 at % or more, the OTS phenomenon was maintained, and the switching threshold voltage was improved to reduce the leakage current. In other words, it is considered that the switch device (Experimental Examples 3-2 to 3-5) including the switch layer made of the BTe-based chalcogenide is suitable as the switch device that operates the resistance-change memory device having a relatively large writing threshold voltage. It is to be noted that, in a case in which the switch layer is made of the BTe-based chalcogenide, it was found that the B composition ratio may be preferably within a range of 60 at % to 90 at % both inclusive, but the B composition ratio is not necessarily limited to the range, because the B composition ratio depends on the device size and configuration of the switch device.

FIG. 15 illustrates a relationship between the nitrogen flow ratio and the switching threshold voltage in a case in which N was added to the BTe-based chalcogenide forming the switch layer (Experimental Examples 3-8 to 3-16). As can be seen from FIG. 15, it was possible to maintain a high switching threshold voltage at up to a nitrogen flow ratio of 25%, and favorable operation characteristics were exhibited.

FIG. 16 illustrates a relationship between the nitrogen flow ratio and the leakage current in Experimental Examples 3-9 to 3-16, and Experimental Examples 3-17 to 3-21 having a different B composition ratio from that in Experimental Examples 3-9 to 3-16. As can be seen from FIG. 16, adding N to the switch layer made it possible to remarkably reduce the leakage current. However, when the nitrogen flow ratio during film formation exceeded 30%, film peeling of the switch layer occurred. When the N composition in Experimental Example 3-15 (with a nitrogen flow ratio of 25%) was analyzed, the nitrogen amount was 40 at %. It is considered that the N composition ratio in the switch layer varies even with a same nitrogen flow ratio depending on the composition ratio of B and Te, film formation conditions, and any other condition; however, a suitable switch layer is obtained at up to a nitrogen amount of 40 at % in the film. It is therefore considered that, in a case in which the switch layer is formed of the BTeN-based chalcogenide, the addition amount of N may be preferably 40 at % or less. Moreover, it was found that, in a case in which N is added, the B composition ratio is not necessarily within a range of 60 at % to 90 at % both inclusive, and even if the B composition ratio is decreased, it is possible to sufficiently reduce the leakage current.

Moreover, Experimental Example 3-22 was an example in which the B composition ratio was 30%, and an off leakage current in the example was 1 nA. In a case in which N was added in such a way, a favorable leakage current and a favorable switching threshold value were obtained at a B composition ratio of 30 at % to 90 at % both inclusive. Accordingly, as suitable composition ranges (at %) of respective elements in a switch device using a (BuTex)Nz-based chalcogenide, the composition range of B may be 30≤u≤90, the composition range of Te may be 10≤x≤70, and the addition amount of N may be 0≤z≤40. The chalcogenide herein is represented by not BuTexNz but (BuTex)Nz, because N is added to BTe. For example, in a case in which the nitrogen flow ratio was 20% in B70Te30 (at %), the nitrogen amount was about 33% determined by XPS measurement. Accordingly, the composition ratio was B46.9Te20.1N33 (at %).

Next, results in a case in which O instead of N was added to the switch layer are illustrated. FIG. 17 illustrates a relationship between the oxygen flow ratio and the switching threshold voltage in Experimental Examples 3-23 to 3-28. As can be seen from FIG. 17, at up to an oxygen flow ratio of 10%, a high switching threshold voltage was exhibited, and favorable characteristics were exhibited. It is to be noted that the oxygen amount in the switch layer at an oxygen flow ratio of 10% was 40 at %. It is considered that the O composition ratio in the switch layer varies even with a same oxygen flow ratio depending on the composition ratio of B and Te, film formation conditions, and any other condition; however, a suitable switch layer is obtained at up to an oxygen amount of 40 at % in the film. It is therefore considered that, in a case in which the switch layer is made of the BTe-based chalcogenide, the addition amount of O may be preferably 40 at % or less.

FIG. 18 illustrates a relationship between the oxygen flow ratio and the leakage current in Experimental Examples 3-23 to 3-28. As can be seen from FIG. 18, for the leakage current, the oxygen amount added to a BTeO-based chalcogenide may be preferably 40 at %/o or less. Note that in Experimental Example 3-28 in which 40 at % or more of O was added, film peeling of the switch layer occurred.

Moreover, as with the case in which N was added, a reduction in the leakage current by addition of O is not limited to a case in which the composition of the chalcogenide is B70Te30 (at %). Accordingly, as suitable composition ranges in at % of the switch layer made of a (BuTex)Oy-based chalcogenide, the composition range of B may be 30≤u≤90, the composition range of Te may be 10≤x≤70, and the addition amount of O may be 0≤y≤40. As with the case of the above-described addition of nitrogen, the chalcogenide herein is represented by not BuTexOy but (BuTex)Oy, because O is added to BTe. Hereinafter, in a case in which chalcogenides are represented by similar notations, conditions are same. It is to be noted that since the oxygen amount in B70Te30 was 40 at % at an oxygen flow ratio of 10%, the composition ratio of the switch layer was B42Te18O40 (at %).

Moreover, both N and O may be added. As suitable composition ranges (at %) of respective elements in the switch layer ((BuTex)ONz) in this case, the composition range of B may be 30≤u≤90, the composition range of Te may be 10≤x≤70, the addition amount of O may be 0≤y≤40, and the addition amount of N may be 0≤z≤40. In a case in which gas elements of O and N are both added as will be described later, the total composition ratio of oxygen and N may be desirably 40% or less, and may be preferably 0≤y+z≤40.

(Experiment 2-3)

Next, samples (Experimental Examples 4-1 to 4-12) in which the switch layer was made of Te and C (and N or O) were fabricated, and the leakage currents and the switching threshold voltages of the samples were measured. Table 7 summarizes the composition ratios and composition ratios of N and O in the respective samples. A relationship between the composition of the switch layer and the switching threshold voltage or the leakage current was verified with use of these samples. The relationship is illustrated in FIGS. 19 to 21.

TABLE 7

| | Composition of Switch Layer | | | |
|---|---|---|---|---|
| | Te | C | N (Flow Ratio) | O (Flow Ratio) |
| Experimental Example 4-1 | 40 | 60 | — | — |
| Experimental Example 4-2 | 50 | 50 | — | — |
| Experimental Example 4-3 | 60 | 40 | — | — |
| Experimental Example 4-4 | 70 | 30 | — | — |
| Experimental Example 4-5 | 83 | 17 | — | — |
| Experimental Example 4-6 | 50 | 50 | 2 | — |
| Experimental Example 4-7 | 50 | 50 | 5 | — |
| Experimental Example 4-8 | 50 | 50 | 7 | — |
| Experimental Example 4-9 | 50 | 50 | 10 | — |
| Experimental Example 4-10 | 60 | 40 | 7 | — |
| Experimental Example 4-11 | 70 | 30 | 10 | — |
| Experimental Example 4-12 | 50 | 50 | — | 4 |

FIG. 19 illustrates a relationship between the C composition ratio and the switching threshold voltage in Experimental Examples 4-1 to 4-5. The C composition ratio at which a switching threshold voltage equal to or higher than that in the GeTe-based switch layer in Experiment 2-1 was obtained in the CTe-based switch layer was within a range of 30 at % to 50 at % both inclusive. The switch phenomenon was not observed out of this range. Accordingly, in a case in which the switch layer is made of the CTe-based chalcogenide, it was found that the C composition ratio may be preferably within a range of 30 at % to 50 at % both inclusive, but the C composition ratio is not necessarily limited to the range, because the C composition ratio depends on the device size and the configuration of the switch device.

FIG. 20 illustrates a relationship between the nitrogen flow ratio and the switching threshold voltage in the CTe-based chalcogenide. When N was added to chalcogenide layers with composition ratios of C50Te50, C40Te60, and C30Te70 (Experimental Example 4-6 to 4-11), depending on the composition ratio of CTe, the threshold voltage was increased by addition of N, and it was possible to maintain a high switching threshold voltage at up to a nitrogen flow ratio of 10%. It may be estimated from analysis of the nitrogen amount in the switch layer using the BTeN-based chalcogenide in Experimental Example 3-10 that the N composition ratio at a nitrogen flow ratio of 10% is 20 at % at most. A favorable switching threshold value is obtained at a C composition ratio of 30 at % to 60 at % both inclusive in a case in which N is added. Accordingly, as an optimum range (at %) of the composition ratio of a (CvTex)Nz-based chalcogenide, the composition range of C is $30 \leq v \leq 60$, the composition range of Te is $40 \leq x \leq 70$, and the addition amount of nitrogen is $0 \leq z \leq 20$. The chalcogenide herein is represented by not CvTexNz but (CvTex)Nz, because N is added to CTe. For example, in a case in which the N flow ratio was 10% in C50Te50, the nitrogen amount was 20% determined by XPS measurement; therefore, the composition ratio was C40Te40N20.

FIG. 21 illustrates a comparison between a case in which a chalcogenide layer with a composition ratio of C50Te50 was mixed with oxygen to add O to CTe and a case in which O was not added to CTe. More specifically, a comparison between the switching threshold voltages of Experimental Example 4-2 and Experimental Example 4-12 is illustrated. As can be seen from FIG. 21, the switching threshold voltage was improved by addition of O. Moreover, when O was added at an oxygen flow ratio exceeding 4%, film peeling occurred. The O composition ratio at an oxygen flow ratio of 4% (Experimental Example 4-12) was 15 at %. Accordingly, as a suitable range (at %) of the composition ratio of the (CvTex)Oy-based chalcogenide, the composition range of C may be $30 \leq v \leq 60$, the composition range of Te may be $40 \leq x \leq 70$, and the addition amount of O may be $0 \leq y \leq 5$. Note that it is expected that similar effects are obtained even if both N and O are added. As suitable composition ranges (at %) of respective elements in the switch layer ((CvTex)OyNz) in this case, the composition range of C may be $30 \leq v \leq 60$, the composition range of Te may be $40 \leq x \leq 70$, the addition amount of O may be $0 \leq y \leq 15$, and the addition amount of N may be $0 \leq z \leq 20$. In a case in which both O and N are added, the addition amount of O and N may be $0 \leq y+z \leq 20$.

(Experiment 2-4)

Next, samples (Experimental Examples 5-1 to 5-30) in which the switch layer was made of Te and Si (and N or O) were fabricated, and the leakage currents and the switching threshold voltages of the samples were measured. Table 8 summarizes the composition ratios of the respective samples (Experimental Examples 5-1 to 5-30). A relationship between the composition of the switch layer and the switching threshold voltage or the leakage current was verified with use of these samples. The relationship is illustrated in FIGS. 22 to 24.

TABLE 8

| | Composition of Switch Layer | | | |
|---|---|---|---|---|
| | Te | Si | N (Flow Ratio) | O (Flow Ratio) |
| Experimental Example 5-1 | 80 | 20 | — | — |
| Experimental Example 5-2 | 70 | 30 | — | — |
| Experimental Example 5-3 | 60 | 40 | — | — |
| Experimental Example 5-4 | 50 | 50 | — | — |
| Experimental Example 5-5 | 40 | 60 | — | — |
| Experimental Example 5-6 | 30 | 70 | — | — |
| Experimental Example 5-7 | 20 | 80 | — | — |
| Experimental Example 5-8 | 10 | 90 | — | — |
| Experimental Example 5-9 | 60 | 40 | 2 | — |
| Experimental Example 5-10 | 50 | 50 | 2 | — |
| Experimental Example 5-11 | 40 | 60 | 2 | — |
| Experimental Example 5-12 | 30 | 70 | 2 | — |
| Experimental Example 5-13 | 20 | 80 | 2 | — |
| Experimental Example 5-14 | 10 | 90 | 10 | — |
| Experimental Example 5-15 | 80 | 20 | 10 | — |

TABLE 8-continued

| | Composition of Switch Layer | | | |
|---|---|---|---|---|
| | Te | Si | N (Flow Ratio) | O (Flow Ratio) |
| Experimental Example 5-16 | 70 | 30 | 10 | — |
| Experimental Example 5-17 | 60 | 40 | 10 | — |
| Experimental Example 5-18 | 50 | 50 | 10 | — |
| Experimental Example 5-19 | 40 | 60 | 10 | — |
| Experimental Example 5-20 | 30 | 70 | 10 | — |
| Experimental Example 5-21 | 20 | 80 | 10 | — |
| Experimental Example 5-22 | 10 | 90 | 10 | — |
| Experimental Example 5-23 | 50 | 50 | 5 | — |
| Experimental Example 5-24 | 50 | 50 | 7 | — |
| Experimental Example 5-25 | 50 | 50 | 15 | — |
| Experimental Example 5-26 | 50 | 50 | 20 | — |
| Experimental Example 5-27 | 50 | 50 | 25 | — |
| Experimental Example 5-28 | 50 | 50 | — | 1 |
| Experimental Example 5-29 | 50 | 50 | — | 4 |
| Experimental Example 5-30 | 50 | 50 | — | 7 |

FIG. 22 illustrates a relationship between the Si composition ratio and the switching threshold voltage and a relationship between the Si composition ratio and the switching threshold voltage at nitrogen flow ratios of 2% and 10% in Experimental Examples 5-1 to 5-8. In a case in which a SiTe-based chalcogenide to which N was not added was used for the switch device, the switching threshold voltage was 1.4 V to 1.6V both inclusive that was substantially equal to that of the switch devices using the GeTe-based chalcogenide for the switch layer in Experimental Examples 2-1 and 2-2. In other words, it was difficult to operate a memory device having a larger writing threshold value than 1.6 V and to obtain sufficient writing and reading margins in the cross-point array. In contrast, it was found that, when the switch layer is formed, the switching threshold value is increased by adding 2% or more in a flow ratio of nitrogen by reactive sputtering.

FIG. 23 illustrates a relationship between the nitrogen flow ratio and the switching threshold voltage in a case in which the ratio of Si and Te was Si50Te50 in Experimental Examples 5-4, 5-10, 5-17, and 5-23 to 5-27. While the switching threshold voltage had a favorable value at a nitrogen flow ratio of 2% to 20% both inclusive, film peeling occurred at a nitrogen flow ratio exceeding 20% (for example. Experimental Example 5-27). Accordingly, the switching threshold voltage was not measured properly. It is to be noted that, when the nitrogen amounts corresponding to the respective nitrogen flow ratios were measured by XPS, the nitrogen amount was 5% in Experimental Example 5-13 (at a nitrogen flow ratio of 2%) and 40% in Experimental Example 5-36 (at a nitrogen flow ratio of 20%). Accordingly, as suitable composition ranges (at %) of respective elements in the switch layer $((Si_WTe_X)N_Z)$ made of the chalcogen element. Si, and N, the composition range of Si may be $30 \leq w \leq 80$, the composition range of Te may be $20 \leq x \leq 70$, and the addition amount of N may be $5 \leq z \leq 40$. It is to be noted that in a case in which a SiTe film made of Si50Te50 was processed at a nitrogen flow ratio of 20%, the nitrogen amount included in the SiTe film was about 40%; therefore, a final composition of the switch layer was Si30Te30N40.

FIG. 24 illustrates a relationship between the oxygen flow ratio and the switching threshold voltage in Experimental Examples 5-4 and 5-28 to 5-30. Even in a case in which oxygen was added to the chalcogenide layer, as with the case in which N was added, an increase in the switching threshold voltage was observed. More specifically, when the oxygen flow ratio was within a range of 1% to 7% both inclusive, the switching threshold voltage was increased. However, when the oxygen flow ratio exceeded 7%, film peeling occurred. It is to be noted that, when the oxygen amounts corresponding to respective oxygen flow ratios were measured by XPS, the oxygen amount was 3% in Experimental Example 5-28 (at an oxygen flow ratio of 1%) and 20% in Experimental Example 5-30 (at an oxygen flow ratio of 7%). Accordingly, as suitable composition ranges (at %) of respective elements in the switch layer $((Si_WTe_X)O_y)$ made of the chalcogen element, Si, and O, the composition range of Si may be $30 \leq w \leq 80$, the composition range of Te may be $20 \leq x \leq 70$, and the addition amount of O may be $3 \leq z \leq 20$. It is to be noted that in a case in which the SiTe film made of Si50Te50 was processed at an oxygen flow ratio of 7%, the oxygen amount included in the SiTe film was about 20%; therefore, a final composition of the switch layer was Si40Te40O20.

Moreover, both N and O may be added to the switch layer made of Si and the chalcogen element. As suitable composition ranges (at %) of respective elements in (SiwTex)OyNz, the composition range of Si may be $30 \leq w \leq 80$, the composition range of Te may be $20 \leq x \leq 70$, the addition amount of O may be $3 \leq y \leq 20$, and the addition amount of N may be $5 \leq z \leq 40$. In a case in which both oxygen (O) and nitrogen (N) are added, the addition amount of O and N may be $3 \leq y+z \leq 40$.

(Experiment 2-5)

Next, samples (Experimental Examples 6-1 to 6-24) in which the switch layer was made of Te, B, and C (and N or O) were fabricated, and the switching threshold voltages of the samples were measured. Table 9 summarizes the composition ratios of the respective samples (Experimental Examples 6-1 to 6-24). A relationship between the composition of the switch layer and the switching threshold voltage was verified with use of these samples. The relationship is illustrated in FIGS. 25 to 28. It is to be noted that Experimental Examples 6-1 to 6-18 were similar to Experimental Example 3-4, except that a part of B was replaced with C (BuCvTex (where U+V=60)).

TABLE 9

| | Composition of Switch Layer | | | | |
|---|---|---|---|---|---|
| | Te | B | C | N (Flow Ratio) | O (Flow Ratio) |
| Experimental Example 6-1 | 40 | 60 | — | — | — |
| Experimental Example 6-2 | 40 | 48 | 12 | — | — |
| Experimental Example 6-3 | 40 | 35 | 25 | — | — |
| Experimental Example 6-4 | 40 | 20 | 40 | — | — |
| Experimental Example 6-5 | 40 | 10 | 50 | — | — |

TABLE 9-continued

| | Composition of Switch Layer | | | | |
| --- | --- | --- | --- | --- | --- |
| | Te | B | C | N (Flow Ratio) | O (Flow Ratio) |
| Experimental Example 6-6 | 40 | 5 | 55 | — | — |
| Experimental Example 6-7 | 40 | 35 | 25 | 2 | — |
| Experimental Example 6-8 | 40 | 35 | 25 | 5 | — |
| Experimental Example 6-9 | 40 | 35 | 25 | 7 | — |
| Experimental Example 6-10 | 40 | 35 | 25 | 10 | — |
| Experimental Example 6-11 | 40 | 35 | 25 | 12 | — |
| Experimental Example 6-12 | 40 | 35 | 25 | 15 | — |
| Experimental Example 6-13 | 40 | 35 | 25 | 20 | — |
| Experimental Example 6-14 | 40 | 35 | 25 | 25 | — |
| Experimental Example 6-15 | 40 | 48 | 12 | 10 | — |
| Experimental Example 6-16 | 30 | 55 | 14 | 10 | — |
| Experimental Example 6-17 | 20 | 64 | 16 | 10 | — |
| Experimental Example 6-18 | 10 | 72 | 18 | 10 | — |
| Experimental Example 6-19 | 5 | 76 | 19 | 10 | — |
| Experimental Example 6-20 | 40 | 35 | 25 | — | 2 |
| Experimental Example 6-21 | 40 | 35 | 25 | — | 5 |
| Experimental Example 6-22 | 40 | 35 | 25 | — | 7 |
| Experimental Example 6-23 | 40 | 35 | 25 | — | 10 |
| Experimental Example 6-24 | 40 | 35 | 25 | — | 12 |

FIG. 25 illustrates a relationship between the C composition ratio and the switching threshold voltage in Experimental Examples 6-1 to 6-6. As can be seen from FIG. 25, the switching threshold voltage was further increased by including both B and C in the switch layer. Moreover, a favorable switching threshold voltage was obtained at up to a C composition ratio of 50 at % (about 83% of B was replaced with C). When the C composition ratio exceeded 50 at %, the switching threshold voltage was decreased. It is to be noted that B and C may have any composition ratio, but the C composition ratio may be preferably within a range of 12 at % to 40 at % both inclusive. In other words, the ratio of B and C may be preferably about 10:0 to about 3:2. It is considered that this is because the amorphous structure of the chalcogenide forming the switch layer was stabilized by addition of C. It is to be noted that, in this case, a total composition ratio of B and C was 60 at %; however, the total composition ratio is not limited thereto. It is expected that an optimum total composition ratio of B and C is within a range of 50 at % to 90 at % both inclusive. Accordingly, as suitable composition ranges (at %) of respective elements in the switch layer (BuCvTex) including both B and C, the composition range of B may be $10 \leq u \leq 90$, the composition range of C may be $0 \leq v \leq 65$, and the composition range of Te may be $10 \leq x \leq 70$ (where $50 \leq u+v \leq 90$). It is to be noted that the composition ranges are not necessarily limited to the above-described composition ranges, because the composition ranges depend on the size and device configuration of the switch device.

FIG. 26 illustrates a relationship between the nitrogen composition ratio and the switching threshold voltage in Experimental Examples 6-3 and 6-7 to 6-14. Experimental Examples 6-7 to 6-14 were similar to Experimental Example 6-3, except that N was added to the switch layer (B35C25Te40) at different flow ratios. It was found that the switching threshold voltage is gradually increased by adding nitrogen as with Experiment 2-2 and increasing the addition amount (the flow ratio) of nitrogen. It was possible to maintain this high switching threshold voltage at up to a nitrogen flow ratio of about 25%. As a result of analyzing the composition ratio of the switch layer under this condition by XPS, the N composition ratio in the switch layer at a nitrogen flow ratio of 25% was 40 at %.

FIG. 27 illustrates a relationship between the Te composition ratio and the leakage current in a case in which the composition ratio of B and C in Experimental Examples 6-15 to 6-19 was 1:4 and the Te composition ratio was varied from 40 at % to 10 at % without consideration of N. In this case, the nitrogen flow ratio was 10%, and as a result of composition analysis by XPS, the N composition ratio in the switch layer was 35 at %. A most favorable leakage current value was obtained at a Te composition ratio of 10 at %. Although not illustrated, the switching threshold voltage was 3.5 V that was favorable. Accordingly, in a case in which N was added, favorable characteristics were obtained at a total composition ratio of B and C of up to at least 90 at/o without consideration of the N composition ratio. In the result of BTeN in Experiment 2-2, favorable operation characteristics were obtained at a B composition ratio of 30 at % to 90 at % both inclusive. It may be therefore estimated that an optimum range of the total composition ratio of B and C except for N in (BuCvTex)Nz is $30 \leq u+v \leq 90$.

FIG. 28 illustrates a relationship between the oxygen composition ratio and the switching threshold voltage in Experimental Examples 6-3, and 6-19 to 6-24. Experimental Examples 6-19 to 6-24 were similar to Experimental Example 6-3, except that O was added to the switch layer (B35C25Te40) at different flow ratios. It was found that the switching threshold voltage is gradually increased by adding O as with Experiment 2-2 and increasing the addition amount (the flow ratio) of O. It was possible to maintain this high switching threshold voltage at up to an oxygen flow ratio of about 10%. The O composition ratio in the switch layer at an oxygen flow ratio of 10% was about 35 at %. However, in Experimental Example 6-18 in which the oxygen flow ratio was 12%, film peeling occurred.

It is considered that the switching threshold voltage was increased by above-described addition of N or O, because, as with Experiment 2-5 in which C was added to the switch layer, the amorphous structure of the chalcogenide forming the switch layer was stabilized. Moreover, in addition to this, it is considered that it is because the insulation property of the switch layer was improved by bonding N or O to B included in the switch layer and dispersing B in the switch layer.

It is to be noted that, although not illustrated here, similar effects are obtained even in a case in which both N and O are added to the switch layer. Moreover, in Experiment 2-2, in a case in which N or O was added, suitable composition ranges of B and Te were enlarged more, as compared with a case in which these elements were not added. It is therefore expected that suitable composition ranges are enlarged by addition of N or O to the switch layer (BuCvTex)OyNz including both B and C. Accordingly, as suitable composition ranges (at %) of respective elements in the switch layer made of (BuCvTex)OyNz, the composition range of B may be $10 \leq u \leq 90$, the composition range of C may be $0 \leq v \leq 65$, the composition range of Te may be $10 \leq v \leq 70$, the addition amount of O may be $0 \leq y \leq 35$, and the addition amount of N may be $0 \leq z \leq 40$ (where $30 \leq u+v \leq 90$ and $0 \leq y+z \leq 40$). It is to be noted that the composition ranges are not necessarily limited to the above-described composition ranges, because the composition ranges depend on the size and the device configuration of the switch device.

(Experiment 2-6)

Next, samples (Experimental Examples 7-1 to 7-18) in which the switch layer was made of Te, Si, and C (and N or O) were fabricated, and the switching threshold voltages of the samples were measured. Table 10 summarizes composition ratios of the respective samples (Experimental Examples 7-1 to 7-18). A relationship between the composition of the switch layer and the switching threshold voltage was verified with use of these samples. The relationship is illustrated in FIGS. 29 to 31. It is to be noted that Experimental Examples 7-1 to 7-18 were similar to Experimental Example 5-5, except that a part of Si was replaced with C (SiwCvTex (where W+V=60)).

TABLE 10

| | | Composition of Switch Layer | | |
|---|---|---|---|---|
| | Te | Si | C | N (Flow Ratio) | O (Flow Ratio) |
| Experimental Example 7-1 | 40 | 50 | 10 | — | — |
| Experimental Example 7-2 | 40 | 30 | 30 | — | — |
| Experimental Example 7-3 | 40 | 20 | 40 | — | — |
| Experimental Example 7-4 | 40 | 10 | 50 | — | — |
| Experimental Example 7-5 | 40 | 5 | 55 | — | — |
| Experimental Example 7-6 | 40 | 30 | 30 | 2 | — |
| Experimental Example 7-7 | 40 | 30 | 30 | 5 | — |
| Experimental Example 7-8 | 40 | 30 | 30 | 7 | — |
| Experimental Example 7-9 | 40 | 30 | 30 | 10 | — |
| Experimental Example 7-10 | 40 | 30 | 30 | 12 | — |
| Experimental Example 7-11 | 40 | 30 | 30 | 15 | — |
| Experimental Example 7-12 | 40 | 30 | 30 | 20 | — |
| Experimental Example 7-13 | 40 | 30 | 30 | 25 | — |
| Experimental Example 7-14 | 40 | 30 | 30 | — | 2 |
| Experimental Example 7-15 | 40 | 30 | 30 | — | 5 |
| Experimental Example 7-16 | 40 | 30 | 30 | — | 7 |
| Experimental Example 7-17 | 40 | 30 | 30 | — | 10 |
| Experimental Example 7-18 | 40 | 30 | 30 | — | 12 |

FIG. 29 illustrates a relationship between the C composition ratio and the switching threshold voltage in Experimental Examples 5-5, and 7-1 to 7-5. As can be seen from FIG. 29, in the switch device including the switch layer made of TeSi, the switching threshold voltage was increased by addition of C. It was possible to improve the switching threshold voltage at up to a C composition ratio of 50 at % (about 83% of Si was replaced with C). It is considered that it is because the amorphous structure of the chalcogenide forming the switch layer was stabilized by addition of C. It is to be noted that the total composition ratio of Si and C was 60 at % in this case; however, the total composition ratio is not limited thereto. It is expected that an optimum total composition ratio of Si and C is within a range of 50 at % to 80 at % both inclusive. Accordingly, as suitable composition ranges (at %) of respective elements in the switch layer (SiwCvTex) including both Si and C, the composition range of Si may be $10 \leq w \leq 80$, the composition range of C may be $10 \leq v \leq 65$, and the composition range of Te may be $20 \leq v \leq 50$ (where $50 \leq w+v \leq 80$). It is to be noted the composition ranges are not necessarily limited to the above-described composition ranges, because the composition ranges depend on the size and the device configuration of the switch device.

FIG. 30 illustrates a relationship between the nitrogen composition ratio and the switching threshold voltage in Experimental Examples 7-2 and 7-6 to 7-13. Experimental Examples 7-6 to 7-13 were similar to Experimental Example 7-2 (Te40Si30C30), except that N was added at different flow ratios. It was found that the switching threshold voltage is gradually increased by adding N to a TeSiC chalcogenide layer as with addition of N to a SiTe chalcogenide layer in Experiment 2-4 and increasing the addition amount (the flow ratio) of N. It was possible to maintain this high switching threshold voltage at up to a nitrogen flow ratio of about 25%. The N composition ratio in the switch layer at a nitrogen flow ratio of 25% was about 40 at %. It is to be noted that film peeing occurred at a nitrogen flow ratio exceeding 25%.

FIG. 31 illustrates a relationship between the oxygen composition ratio and the switching threshold voltage in Experimental Examples 7-2 and 7-14 to 7-18. Experimental Examples 7-14 to 7-18 were similar to Experimental Example 7-2 (Te40Si30C30), except that O was added at different flow ratios. It was found that the switching threshold voltage is gradually increased by adding O to a TeSiC chalcogenide layer as with addition of O to the SiTe chalcogenide layer in Experiment 2-4 and increasing the addition amount (the flow ratio) of O. It was possible to maintain this high switching threshold voltage at up to an oxygen flow ratio of about 10%. The O composition ratio in the switch layer at an oxygen flow ratio of 10% was 35 at %. It is to be noted that film peeling occurred at an oxygen flow ratio exceeding 10%.

It is considered that the switching threshold voltage was increased by above-described addition of N or O, because the amorphous structure of the chalcogenide forming the switch layer was stabilized. Moreover, in addition to this, it is considered that it is because the insulating property of the switch layer was improved by bonding N or O to Si included in the switch layer and dispersing Si in the switch layer.

It is to be noted that, although not illustrated here, similar effects are obtained even in a case in which both nitrogen and oxygen are added to the switch layer. Moreover, in Experiment 2-4, in a case in which nitrogen or O was added, suitable composition ranges of Si and Te were enlarged more, as compared with a case in which these elements were not added. It is therefore expected that suitable composition ranges are enlarged by addition of N or O even in the switch layer ((SiwCvTex)OyNz) including both B and C. Accordingly, as suitable composition ranges (at %) of respective elements in the switch layer made of (SiwCvTex)OyNz, the composition range of Si may be $10 \leq w \leq 80$, the composition range of C may be $0 \leq v \leq 65$, the composition range of Te may be $20 \leq x \leq 70$, the addition amount of O may be $0 \leq y \leq 35$, and the addition amount of N may be $0 \leq z \leq 40$ (where $30 \leq w+v \leq 80$ and $0 \leq y+z \leq 40$). It is to be noted that the composition ranges are not necessarily limited to the above-described composition ranges, because the composition ranges depend on the size and the device configuration of the switch device.

(Experiment 2-7)

Next, samples (Experimental Examples 8-1 to 8-19) in which the switch layer was made of Te, B, and Si (and N or O) were fabricated, and the switching threshold voltages of the samples were measured. Table 11 summarizes composition ratios of the respective samples (Experimental Examples 8-1 to 8-19). A relationship between the composition of the switch layer and the switching threshold voltage was verified with use of these samples. The relationship is illustrated in FIGS. 32 to 34. It is to be noted that Experimental Examples 8-1 to 8-19 were similar to Experimental Example 3-5, except that a part of B was replaced with Si (BuSiwTex (where U+W=60)).

TABLE 11

| | Composition of Switch Layer | | | |
|---|---|---|---|---|
| | Te | B | Si | N (Flow Ratio) | O (Flow Ratio) |
| Experimental Example 8-1 | 40 | 60 | — | — | — |
| Experimental Example 8-2 | 40 | 50 | 10 | — | — |
| Experimental Example 8-3 | 40 | 30 | 30 | — | — |
| Experimental Example 8-4 | 40 | 20 | 40 | — | — |
| Experimental Example 8-5 | 40 | 10 | 50 | — | — |
| Experimental Example 8-6 | 40 | 5 | 55 | — | — |
| Experimental Example 8-7 | 40 | 30 | 30 | 2 | — |
| Experimental Example 8-8 | 40 | 30 | 30 | 5 | — |
| Experimental Example 8-9 | 40 | 30 | 30 | 7 | — |
| Experimental Example 8-10 | 40 | 30 | 30 | 10 | — |
| Experimental Example 8-11 | 40 | 30 | 30 | 12 | — |
| Experimental Example 8-12 | 40 | 30 | 30 | 15 | — |
| Experimental Example 8-13 | 40 | 30 | 30 | 20 | — |
| Experimental Example 8-14 | 40 | 30 | 30 | 25 | — |
| Experimental Example 8-15 | 40 | 30 | 30 | — | 2 |
| Experimental Example 8-16 | 40 | 30 | 30 | — | 5 |
| Experimental Example 8-17 | 40 | 30 | 30 | — | 7 |
| Experimental Example 8-18 | 40 | 30 | 30 | — | 10 |
| Experimental Example 8-19 | 40 | 30 | 30 | — | 12 |

FIG. 32 illustrates a relationship between the Si composition ratio and the switching threshold voltage in Experimental Examples 3-4, and 8-1 to 8-5. As can be seen from FIG. 32, in the switch device including the switch layer made of TeB, the switching threshold voltage was increased by addition of Si. In particular, it was possible to improve the switching threshold voltage at up to a Si composition ratio of 50 at % (about 83% of B was replaced with Si). It is considered that this is because the amorphous structure of the chalcogenide forming the switch layer was stabilized by addition of Si. It is to be noted that the total composition ratio of B and Si was 60 at % in this case; however, the total composition ratio is not limited thereto. It is expected from the result of BTe in Experiment 2-2 that an optimum total composition ratio of B and Si is within a range of 50 at % to 90 at % both inclusive. Accordingly, as suitable composition ranges (at %) of respective elements in the switch layer (BuSiwTex) including both B and Si, the composition range of B may be 10≤u≤80, the composition range of Si may be 10≤w≤65, and the composition range of Te may be 10≤x≤50 (where 50≤u+w≤90). It is to be noted the composition ranges are not necessarily limited to the above-described composition ranges, because the composition ranges depend on the size and the device configuration of the switch device.

FIG. 33 illustrates a relationship between the nitrogen composition ratio and the switching threshold voltage in Experimental Examples 8-3 and 8-7 to 8-14. Experimental Examples 8-7 to 8-14 were similar to Experimental Example 8-4 (Te40B30Si30), except that N was added at different flow ratios. It was found that the switching threshold voltage is gradually increased by adding N to a TeBSi chalcogenide layer as with addition of N to the BTe chalcogenide layer and the SiTe chalcogenide layer in Experiment 3-5 and increasing the addition amount (the flow ratio) of N. It was possible to maintain this high switching threshold voltage at up to a nitrogen flow ratio of about 20%. The N composition ratio in the switch layer at a nitrogen flow ratio of 20% was 40 at %.

FIG. 34 illustrates a relationship between the oxygen composition ratio and the switching threshold voltage in Experimental Examples 8-3 and 8-15 to 8-18. Experimental Examples 8-15 to 8-18 were similar to Experimental Example 8-3 (Te40B30Si30), except that N was added at different flow ratios. It was found that the switching threshold voltage is gradually increased by adding O to the TeBSi chalcogenide layer as with addition of O to the BTe chalcogenide layer in Experiment 3-5 and increasing the addition amount (the flow ratio) of O. It was possible to maintain this high switching threshold voltage at up to an oxygen flow ratio of about 10%. The composition ratio of oxygen (O) in the switch layer at an oxygen flow ratio of 10% was 35 at %.

It is considered that the switching threshold voltage was increased by the above-described addition of N or O, because the amorphous structure of the chalcogenide forming the switch layer was stabilized. Moreover, in addition to this, it is considered that it is because the insulating property of the switch layer was improved by bonding N or O to B or Si included in the switch layer and dispersing B or Si in the switch layer.

It is to be noted that, although not illustrated here, similar effects were obtained even in a case in which both N and O were added to the switch layer. Moreover, in Experiment 2-2 and Experiment 2-4, in a case in which N or O was added, suitable composition ranges of B, Si, and Te were enlarged more, as compared with a case in which these elements were not added. It is therefore expected that suitable composition ranges are enlarged by addition of N or O even in the switch layer ((BuSiwTex)OyNz) including both B and Si. Accordingly, as suitable composition ranges (at %) of respective elements in the switch layer made of (BuSiwTex)OyNz, the composition range of B may be 10≤u≤90, the composition range of Si may be 0≤w≤65, the composition range of Te may be 10≤v≤70, the addition amount of O may be 0≤y≤35, and the addition of N may be 0≤z≤40 (where 30≤u+w≤90 and 0≤y+z≤40). It is to be noted that the composition ranges are not necessarily limited to the above-described ranges, because the composition ranges depend on the size and the device configuration of the switch device.

(Experiment 2-8)

Next, samples (Experimental Examples 9-1 to 9-14) in which the switch layer was made of Te, B, C, and Si (and N or O) were fabricated, and the leakage currents and the switching threshold voltages were measured. Table 12 summarizes composition ratios of the respective samples (Experimental Examples 9-1 to 9-14), and the leakage currents and the switching threshold voltages of the respective samples. As can be seen from Table 12, a favorable leakage current and a favorable switching threshold voltage were obtained in all of the samples. In particular, the leakage current was largely reduced by addition of N or O to a chalcogenide layer made of TeBCSi, and it was possible to improve the switching threshold voltage. Moreover, as can be seen from Experimental Example 9-14, N and O may coexist.

TABLE 12

| | Composition of Switch Layer | | | | | | Characteristic Value | |
|---|---|---|---|---|---|---|---|---|
| | | | | | N (Flow Ratio) | O (Flow Ratio) | Leakage Current (nA) | Switching Threshold Voltage (V) |
| | Te | B | C | Si | | | | |
| Experimental Example 9-1 | 28 | 30 | 21 | 21 | — | — | 4.5 | 2.4 |
| Experimental Example 9-2 | 32 | 20 | 24 | 24 | — | — | 2.3 | 2.5 |
| Experimental Example 9-3 | 36 | 10 | 27 | 27 | — | — | 2.11 | 2.5 |
| Experimental Example 9-4 | 45 | 10 | 22.5 | 22.5 | — | — | 3 | 2.1 |
| Experimental Example 9-5 | 40 | 20 | 20 | 20 | — | — | 5 | 2.3 |
| Experimental Example 9-6 | 35 | 30 | 17.5 | 17.5 | — | — | 3.2 | 2.2 |
| Experimental Example 9-7 | 28 | 30 | 21 | 21 | 10 | — | 2.3 | 2.8 |
| Experimental Example 9-8 | 32 | 20 | 24 | 24 | 10 | — | 0.733 | 2.9 |
| Experimental Example 9-9 | 36 | 10 | 27 | 27 | 10 | — | 0.119 | 2.9 |
| Experimental Example 9-10 | 45 | 10 | 22.5 | 22.5 | 10 | — | 0.338 | 2.7 |
| Experimental Example 9-11 | 40 | 20 | 20 | 20 | 10 | — | 0.278 | 2.6 |
| Experimental Example 9-12 | 35 | 30 | 17.5 | 17.5 | 10 | — | 0.0145 | 2.7 |
| Experimental Example 9-13 | 35 | 30 | 17.5 | 17.5 | — | 7 | 0.03 | 2.7 |
| Experimental Example 9-14 | 35 | 30 | 17.5 | 17.5 | 10 | 2 | 0.02 | 2.7 |

As a summary of the results of the above-described Experiments 2-2 to 2-7 and 3-1, and this experiment, as suitable composition ranges (at %) of respective elements in the switch layer (($B_u C_v Si_w Te_x$)$O_y N_z$) including Te, B, C, and Si (and N or/and O), the composition range of B may be $0 \le u \le 90$, the composition range of C may be $0 \le v \le 65$, the composition range of Si may be $0 \le w \le 65$, the composition range of Te may be $10 \le x \le 70$, the addition amount of O may be $0 \le y \le 35$, and the addition amount of N may be $0 \le z \le 40$ (where $30 \le u+v+w \le 90$ and $0 \le y+z \le 40$). It is to be noted that the composition ranges are not necessarily limited to the above-described composition ranges, because the composition ranges depend on the size and the device configuration of the switch device.

Moreover, it is expectable that even if the chalcogen element is not Te but any of Te, Se, and S, similar effects are obtained; therefore, as suitable composition ranges (at %) of respective elements in (($B_u C_v Si_w Z_x$)$O_y N_z$) where Z=Te, Se, or S, the composition range of B may be $0 \le u \le 90$, the composition range of C may be $0 \le v \le 65$, the composition range of Si may be $0 \le w \le 65$, the composition range of Te may be $10 \le x \le 70$, the addition amount of O may be $0 \le y \le 35$, and the addition amount of N may be $0 \le z \le 40$ (where $30 \le u+v+w \le 90$). It is to be noted that the composition ranges are not necessarily limited to the above-described composition ranges, because the composition ranges depend on the size and the device configuration of the switch device.

(Experiment 3; Adhesion)

Next, a sample was fabricated, and the leakage current, the switching threshold voltage, and adhesion of the switch layer in the sample were evaluated. The adhesion of the switch layer was determined by a tape test. More specifically, the lower electrode, the switch layer, and the upper electrode were formed as, for example, solid films of TiN/MgTe/W, and scratches each having a length of 10 mm were made in a lattice form, and a tape was adhered on the scratches, and whether film peeling occurred when the tape was removed was observed.

(Experiment 3-1)

First, samples (Experimental Examples 10-1 to 10-5) in which the switch layer was made of Te and Mg were fabricated, and the leakage currents and the switching threshold voltages of the samples were measured, and adhesion in the samples was evaluated with use of the above-described method. Table 13 summarizes the composition ratios, the leakage currents, the switching threshold voltages, and evaluation of film peeling of the respective samples (Experimental Examples 10-1 to 10-5). It is to be noted that a case in which film peeling was not observed is indicated by "A", a case in which film peeling was partially observed (in 10% or less of an area where the tape was adhered) is indicated by "B", and a case in which film peeling was observed in 10% or more of the area where the tape was adhered is indicated by "C". As can be seen from Table 13, in Experimental Examples 10-1 and 10-2, film peeling was not observed in an entire surface, but was observed in part.

TABLE 13

| | Composition of Switch Layer | | Leakage Current | Switching Threshold Voltage | Film Peeling |
|---|---|---|---|---|---|
| | Te | Mg | (nA) | (V) | |
| Experimental Example 10-1 | 80 | 20 | 200 | 1.3 | B |
| Experimental Example 10-2 | 70 | 30 | 4.1 | 2 | B |
| Experimental Example 10-3 | 60 | 40 | 2.4 | 3 | C |

TABLE 13-continued

|  | Composition of Switch Layer | | Leakage Current | Switching Threshold Voltage | Film |
|---|---|---|---|---|---|
|  | Te | Mg | (nA) | (V) | Peeling |
| Experimental Example 10-4 | 50 | 50 | — | — | C |
| Experimental Example 10-5 | 40 | 60 | — | — | C |

It is to be noted that even in the switch device in which the switch layer was made of MgTe, favorable switch characteristics were exhibited. However, as can be seen from Table 13, in a case in which the Mg composition ratio in the switch layer was too small (for example, 20 at % or less), the leakage current was increased, and the switching threshold voltage was low. In contrast, when the Mg composition ratio exceeded 50 at %, film peeling was noticeable, and it was not possible to perform measurement properly. It is therefore considered that a suitable Mg composition range when the switch layer is formed of an MgTe-based chalcogenide material may be within a range of 30 at % to 40 at % both inclusive.

(Experiment 3-2)

Next, samples (Experimental Examples 11-1 to 11-17) in which B, C, or Si was added to the switch layer made of MgTe were fabricated, and the switching threshold voltages and adhesion of the samples were evaluated. Table 14 summarizes the composition ratios, the switching threshold voltages, and evaluation of film peeling of the respective samples (Experimental Examples 11-1 to 11-17).

TABLE 14

|  | Composition of Switch Layer | | | | | Switching Threshold Voltage | Film |
|---|---|---|---|---|---|---|---|
|  | Te | Mg | B | C | Si | (V) | Peeling |
| Experimental Example 11-1 | 50 | 10 | 40 | — | — | 2.2 | A |
| Experimental Example 11-2 | 50 | 20 | 30 | — | — | 2.1 | B |
| Experimental Example 11-3 | 50 | 30 | 20 | — | — | — | C |
| Experimental Example 11-4 | 50 | 40 | 10 | — | — | — | C |
| Experimental Example 11-5 | 40 | 10 | 50 | — | — | 2.5 | A |
| Experimental Example 11-6 | 40 | 20 | 40 | — | — | 2.9 | B |
| Experimental Example 11-7 | 40 | 30 | 30 | — | — | 2.9 | B |
| Experimental Example 11-8 | 40 | 40 | 20 | — | — | — | C |
| Experimental Example 11-9 | 30 | 10 | 60 | — | — | 3.1 | A |
| Experimental Example 11-10 | 30 | 20 | 50 | — | — | 3.1 | B |
| Experimental Example 11-11 | 30 | 30 | 40 | — | — | 3.2 | B |
| Experimental Example 11-12 | 30 | 40 | 30 | — | — | — | C |
| Experimental Example 11-13 | 30 | 50 | 20 | — | — | — | C |
| Experimental Example 11-14 | 40 | 20 | 30 | 10 | — | 2.7 | B |
| Experimental Example 11-15 | 40 | 20 | 20 | 20 | — | 2.5 | B |
| Experimental Example 11-16 | 40 | 20 | 20 | 10 | 10 | 2.5 | B |
| Experimental Example 11-17 | 40 | 20 | 10 | 20 | 10 | 2.4 | B |

In the sample made of MgTe in Experiment 10-1, film peeling occurred in a composition (Experimental Examples 10-2 and 10-3) in which a switching threshold voltage of 2 V or higher was obtained; however, in this experiment, it was possible to reduce the occurrence of film peeling. In other words, it was found that addition of B, C, or Si made it possible to improve the switching threshold voltage while improving adhesion of the switch layer. From the above results, as suitable composition ranges of respective elements in the switch layer (MgtBuTex) including Mg, Te, and B, 40 at % or more of B may be desirably included; therefore, the composition range of B may be 40≤u≤90. In a case in which the Mg composition ratio is large, it is possible to increase the switching threshold value; however, when the composition ratio of Mg was too large, film peeling was observed. Accordingly, a suitable composition ratio of Mg may be 0≤t≤30. Moreover, when the composition ratio of Te is too small, the OTS phenomenon is not observed; therefore, the composition ratio of Te may be preferably 10% or more. Accordingly, a preferable composition ratio of Te may be 10≤x≤50.

(Experiment 3-3)

Next, samples (Experimental Examples 12-1 to 12-11) in which N or O was added to the switch layer made of MgTeB were fabricated, and the switching threshold voltages and adhesion of the samples were evaluated. Table 15 summarizes the composition ratios, the leakage currents, the switching threshold voltages, and evaluation of film peeling of the respective samples (Experimental Examples 12-1 to 12-11).

TABLE 15

|  | Composition of Switch Layer | | | | | | Switching | |
|---|---|---|---|---|---|---|---|---|
|  | Te | Mg | B | N (Flow Ratio) | O (Flow Ratio) | Leakage Current (nA) | Threshold Voltage (V) | Film Pealing |
| Experimental Example 12-1 | 40 | 20 | 40 | 2 | — | 0.22 | 3 | A |
| Experimental Example 12-2 | 40 | 20 | 40 | 5 | — | 0.05 | 3 | A |

TABLE 15-continued

| | Composition of Switch Layer | | | | | Characteristic Value | | |
| --- | --- | --- | --- | --- | --- | --- | --- | --- |
| | | | | | | Switching | | |
| | Te | Mg | B | N (Flow Ratio) | O (Flow Ratio) | Leakage Current (nA) | Threshold Voltage (V) | Film Pealing |
| Experimental Example 12-3 | 40 | 20 | 40 | 7 | — | 0.12 | 2.8 | A |
| Experimental Example 12-4 | 40 | 20 | 40 | 10 | — | 0.3 | 2.5 | A |
| Experimental Example 12-5 | 40 | 20 | 40 | 15 | — | 5.3 | 2 | B |
| Experimental Example 12-6 | 40 | 20 | 40 | 20 | — | — | — | C |
| Experimental Example 12-7 | 40 | 20 | 40 | — | 1 | 1.2 | 2.9 | A |
| Experimental Example 12-8 | 40 | 20 | 40 | — | 3 | 0.5 | 2.9 | A |
| Experimental Example 12-9 | 40 | 20 | 40 | — | 5 | 5.4 | 2.9 | A |
| Experimental Example 12-10 | 40 | 20 | 40 | — | 7 | 30 | 2 | A |
| Experimental Example 12-11 | 40 | 20 | 40 | — | 10 | — | — | C |

Experimental Examples 12-1 to 12-11 were similar to Experimental Example 11-6 (Te40Mg20B40), except that N or O was added at different flow ratios. As can be seen from Table 15, in a case in which N was added to a TeMgB chalcogenide layer, film peeling did not occurred at a nitrogen flow ratio of 2% to 10% both inclusive. In other words, an improvement in adhesion was observed. Moreover, a reduction in the leakage current was observed. Accordingly, it was found that a suitable nitrogen flow ratio when N is added to the TeMgB chalcogenide layer may be within a range of 2% to 10% both inclusive. It is to be noted that the N composition ratio in the switch layer when reactive sputtering is performed at the above-described nitrogen flow ratio is within a range of 5 at % to 25 at % both inclusive. Moreover, in a case in which O was added to the TeMgB chalcogenide layer, a reduction in the occurrence of film peeling and a reduction in the leakage current were observed at an oxygen flow ratio of 1% to 5% both inclusive. Accordingly, it was found that a suitable oxygen flow ratio when O is added to the TeMgB chalcogenide layer may be within a range of 1% to 5% both inclusive. It may be estimated that the O composition ratio in the switch layer when reactive sputtering is performed at the above-described oxygen flow ratio is within a range of 5 at % to 25 at % both inclusive. Accordingly, as suitable composition ranges (at %) of respective elements in the switch layer ((MgtBuTex)OyNz) including Mg, Te, B, and N (or O), the composition range of Mg may be 0≤t≤30, the composition range of B may be 40≤u≤60, the composition range of Te may be 10≤x≤50, the addition amount of O may be 5≤y≤25, and the addition amount of N may be 5≤z≤25, where 5≤y+z≤25.

Moreover, as illustrated in the above-described Experiments 2-2 to 2-7 and 3-1, B may be replaced with C or Si. Therefore, as suitable composition ratios (at %) of respective elements in a case in which the switch layer is made of (MgtBuCvSiwTex)OyNz, the composition range of Mg may be 0≤t≤30, the composition range of BuCvSiw may be 40≤u+v+w≤90, the composition range of Te may be 10≤x≤50, the addition amount of O may be 5≤y≤25, and the addition amount of N may be 5≤z≤25. In a case in which both nitrogen and oxygen are added, the addition amount of nitrogen and oxygen may be 5≤y+z≤25.

(Experiment 3-4)

Next, samples (Experimental Examples 13-1 to 13-8) in which a metal element (M) other than Mg was added to the switch layer made of TeBN (or TeBO) were fabricated, and the switching threshold voltages and adhesion of the samples were evaluated. Table 16 summarizes the composition ratios, the leakage currents, the switching threshold voltages, and evaluation of film peeling of the respective samples (Experimental Examples 13-1 to 13-8).

TABLE 16

| | Composition of Switch Layer | | | | | Characteristic Value | | |
| --- | --- | --- | --- | --- | --- | --- | --- | --- |
| | | | | | | Switching | | |
| | Te | M | B | N (Flow Ratio) | O (Flow Ratio) | Leakage Current (nA) | Threshold Voltage (V) | Film Peeling |
| Experimental Example 13-1 | 40 | Mg/20 | 40 | 5 | — | 0.05 | 3 | A |
| Experimental Example 13-2 | 40 | Al/20 | 40 | 5 | — | 0.1 | 2.5 | A |
| Experimental Example 13-3 | 40 | Ga/20 | 40 | 5 | — | 1 | 2.4 | A |
| Experimental Example 13-4 | 40 | Y/20 | 40 | 5 | — | 2.4 | 2.1 | A |
| Experimental Example 13-5 | 40 | Mg/20 | 40 | — | 3 | 0.5 | 2.9 | A |
| Experimental Example 13-6 | 40 | Al/20 | 40 | — | 3 | 0.3 | 2.5 | A |
| Experimental Example 13-7 | 40 | Ga/20 | 40 | — | 3 | 6 | 2.4 | A |
| Experimental Example 13-8 | 40 | Y20 | 40 | — | 3 | 5.5 | 3 | A |

As can be seen from Table 16, as the metal element (M) added to the switch layer, Al, Ga, or Y may be used instead of Mg. Since Y is a rare earth element, as a metal element other than the above-described metal elements, a lanthanoid rare earth element is considered to operate in a similar manner. Moreover, it is expected that alkaline-earth metal elements such as Ca and Sr having similar properties to those of Mg also obtain a similar operation.

Further, as illustrated in the above-described Experiments 2-2 to 2-7 and 3-1, B may be replaced with C or Si. Accordingly, as suitable composition ranges (at %) of respective elements in a case in which the metal element (M) is Mg, Al, Ga, or Y and the switch layer is made of (MtBuCvSiwTex)OyNz, the composition range of M may be $0 \leq t \leq 30$, the composition range of BuCvSiw may be $40 \leq u+v+w \leq 90$, the composition range of Te may be $10 \leq x \leq 50$, the addition amount of O and N may be $5 \leq y+z \leq 25$.

It is to be noted that the chalcogenide including a metalloid light element (B, C, or Si) and a metal element (M; Mg, Al, Ga, Y, or any other metal element) is used for the switch layer in this experiment, however, Ge, As, Sn, or any other element used in a known OTS material may be added in addition to these elements without departing from the scope of the invention. At this occasion, a composition range (at %) of a known material (K) included in the switch layer (KsMtBuCvSiwTex)OyNz may be preferably $0 \leq s \leq 10$.

Moreover, in this experiment, Te was used as the chalcogen element, but the chalcogen element is not limited to Te, and Te may be replaced with Se or S. For example, in Experiment 3, as suitable composition ranges (at %) of respective elements in the switch layer ((MtBuCvSiwZx)OyNz) where Z is Te, Se, or S, the composition range of M may be $0 \leq t \leq 30$, the composition range of BuCvSiw may be $40 \leq u+v+w \leq 90$, the composition range of Z may be $10 \leq x \leq 50$, the addition amount of O and N may be $5 \leq y+z \leq 25$.

(Experiment 4: Addition of Oxide Film)

The switch devices described in the above-described Experiments 1 to 3 may be used in combination with a high-resistance layer (the high-resistance layer 50) between the switch layer and an electrode (the lower electrode or the upper electrode). Samples (Experimental Example 14) were fabricated by forming, for example, an oxide film (or a nitride film) made of SiOx or any other oxide as the high-resistance layer between the lower electrode and the switch layer. Table 17 summarizes composition ratios of the high-resistance layer and the switch layer, the switching threshold voltages, and the leakage currents of the respective samples (Experimental Examples 14-1 to 14-6).

TABLE 17

| | | Composition of Switch Layer | | Characteristic Value Switching | |
|---|---|---|---|---|---|
| | High-resistance Layer | Composition (without gas element) | Oxygen Flow Ratio | Threshold Voltage (V) | Leakage Current (nA) |
| Experimental Example 14-1 | SiOx/ 2 nm | Te40Mg30B30 | 3% | 2.9 | 0.0052 |
| Experimental Example 14-2 | AlOx/ 2.5 nm | Te40Mg30B30 | 3% | 2.9 | 0.12 |
| Experimental Example 14-3 | MgOx/ 2 nm | Te40Mg30B30 | 3% | 2.7 | 0.2 |
| Experimental Example 14-4 | SiN/ 5 nm | Te40Mg30B30 | 3% | 3.2 | 0.045 |
| Experimental Example 14-5 | HfOx/ 2 nm | Te40Mg30B30 | 3% | 2.9 | 0.115 |
| Experimental Example 14-6 | — | Te40Mg30B30 | 3% | 2.9 | 0.5 |

As can be seen from Table 17, forming the high-resistance layer between the lower electrode and the switch layer made it possible to reduce the leakage current while increasing the switching threshold voltage. Moreover, it was found that even in a case in which a nitride having a lower insulation property than a typical oxide is used as with Experimental Example 14-4, favorable effects are obtained by adjusting the thickness of the high-resistance layer. It is to be noted that it is easily expected that even in a case in which the high-resistance layer is formed with use of a material other than the above-described materials, similar effects are obtained, as long as it is possible to form a film having a high insulation property as the high-resistance layer.

Note that effects described in the foregoing first to third embodiments, the foregoing modification example, and the foregoing examples are non-limiting. Effects achieved by the technology may be one or more of effects described in the disclosure.

It is to be noted that the technology may have the following configurations.

(1) A switch device including:
a first electrode;
a second electrode disposed to oppose the first electrode;
a switch layer provided between the first electrode and the second electrode, and including at least one or more kinds of chalcogen elements and one or more kinds of first elements out of the one or more kinds of chalcogen elements, the one or more kinds of first elements, and a second element including one or both of oxygen (O) and nitrogen (N), the one or more kinds of chalcogen elements being selected from tellurium (Te), selenium (Se), and sulfur (S), and the one or more kinds of first elements being selected from boron (B), carbon (C), and silicon (Si).

(2) The switch device according to (1), wherein, without phase change between an amorphous phase and a crystalline phase, the switch layer is turned to a low-resistance state by setting an applied voltage to a predetermined threshold voltage or higher, and is turned to a high-resistance state by decreasing the applied voltage to the threshold voltage or lower.

(3) The switch device according to (1) or (2), wherein the switch layer includes one of compositions including BTe, CTe, BCTe, CSiTe, BSiTe, BCSiTe, BTeN, CTeN, BCTeN, CSiTeN, BSiTeN, BCSiTeN, BTeO, CTeO, BCTeO, CSiTeO, BSiTeO, BCSiTeO, BTeON, CTeON, BCTeON, CSiTeON, BSiTeON, and BCSiTeON.

(4) The switch device according to any one of (1) to (3), wherein the switch layer has a composition ratio (at %) of (BuTex)OyNz (where $30 \leq u \leq 90$, $10 \leq x \leq 70$, $0 \leq y \leq 35$, and $0 \leq z \leq 40$ or $0 \leq y+z \leq 40$).

(5) The switch device according to any one of (1) to (3), the switch layer has a composition ratio (at %) of (CvTex)OyNz (where $30 \leq v \leq 60$, $40 \leq x \leq 70$, $0 \leq y \leq 15$ at %, and $0 \leq z \leq 20$ at % or $0 \leq y+z \leq 20$ at %).

(6) The switch device according to any one of (1) to (3), wherein the switch layer has a composition ratio (at %) of (SiwTex)OyNz (where $30 \leq w \leq 80$, $20 \leq x \leq 70$, $3 \leq y \leq 20$, and $5 \leq z \leq 40$ or $3 \leq y+z \leq 40$).

(7) The switch device according to any one of (1) to (3), wherein the switch layer has a composition ratio (at %) of (BuCvTex)OyNz (where $10 \leq u \leq 90$, $0 \leq v \leq 65$, $0 \leq x \leq 70$, $0 \leq y \leq 35$, and $0 \leq z \leq 40$ (where $30 \leq u+v \leq 90$ and $0 \leq y+z \leq 40$)).

(8) The switch device according to any one of (1) to (3), wherein the switch layer has a composition ratio (at %) of (CvSiwTex)OyNz (where $10 \leq v \leq 65$, $10 \leq w \leq 80$, $20 \leq x \leq 70$, $0 \leq y \leq 35$, and $0 \leq y \leq 40$ (where $30 \leq v+w \leq 80$ and $0 \leq v \leq y+z \leq 40$)).

(9) The switch device according to any one of (1) to (3), wherein the switch layer has a composition ratio (at %) of (BuSiwTex)OyNz (where $10 \leq u \leq 90$, $0 \leq w \leq 65$, $10 \leq x \leq 70$, $0 \leq y \leq 35$, and $0 \leq z \leq 40$ (where $30 \leq u+w \leq 90$ and $0 \leq y+z \leq 40$)).

(10) The switch device according to any one of (1) to (3), wherein the switch layer has a composition ratio (at %) of (BuCvSiwTex)OyNz (where $0 \leq u \leq 90$, $0 \leq v \leq 65$, $10 \leq w \leq 65$, $10 \leq x \leq 70$, $0 \leq y \leq 35$, and $0 \leq z \leq 40$ (where $30 \leq u+v+w \leq 90$ and $0 \leq y+z \leq 40$)).

(11) The switch device according to any one of (1) to (3), wherein the switch layer has a composition ratio (at %) of (BuCvSiwZx)OyNz (where $20 \leq x \leq 50$, $40 \leq u+v+w \leq 60$, $55 \leq y \leq 25$, $5 \leq z \leq 25$, and $5 \leq y+z \leq 25$ (where Z=(Te, Se, S))).

(12) The switch device according to any one of (1) to (3), wherein the switch layer includes one or more kinds selected from magnesium (Mg), calcium (Ca), strontium (Sr), aluminum (Al), and gallium (Ga).

(13) The switch device according to (12), wherein the switch layer has a composition ratio (at %) of (MtBuCvSiwTex)OyNz (where $0 \leq t \leq 30$, $40 \leq u+v+w \leq 90$, $10 \leq x \leq 50$, $5 \leq y \leq 25$, and $5 \leq z \leq 25$, where a composition ratio of O and N is $5 \leq y+z \leq 25$ (where M=Mg, Zn, Ca, Sr, Al, Ga)).

(14) The switch device according to (12), wherein the switch layer has a composition ratio of (MtBuCvSiwZx)OyNz (where $0 \leq t \leq 30$, $10 \leq x \leq 50$, $40 \leq u+v+w \leq 90$, $5 \leq y \leq 25$, and $5 \leq z \leq 25$, where a composition ratio of O and N is $5 \leq y+z \leq 25$ (where M=(Mg, Zn, Ca, Sr, Al, Ga) and Z=(Te, Se, and S))).

(15) The switch device according to any one of (1) to (14), wherein the switch layer includes a high-resistance layer on one or both of a surface on the first electrode side and a surface on the second electrode side.

(16) The switch device according to (15), wherein the high-resistance layer includes one or more kinds selected from oxides, nitrides, and oxynitrides of aluminum (Al), silicon (Si), magnesium (Mg), hafnium (Hf), and rare-earth metal elements.

(17) The switch device according to any one of (1) to (16), wherein a thickness of the switch layer is within a range of 5 nm to 100 nm both inclusive.

(18) A storage unit provided with a plurality of memory cells, the memory cells each including a storage device and a switch device directly coupled to the storage device, the switch device including:
a second electrode disposed to oppose the first electrode;
a switch layer provided between the first electrode and the second electrode, and including at least one or more kinds of chalcogen elements and one or more kinds of first elements out of the one or more kinds of chalcogen elements, the one or more kinds of first elements, and a second element including one or both of oxygen (O) and nitrogen (N), the one or more kinds of chalcogen elements being selected from tellurium (Te), selenium (Se), and sulfur (S), and the one or more kinds of first elements being selected from boron (B), carbon (C), and silicon (Si).

(19) The storage unit according to (18), wherein the storage device includes a storage layer between the first electrode and the second electrode of the switch device.

(20) The storage unit according to (19), wherein the storage layer includes an ion source layer and a resistance change layer, the ion source layer including one or more kinds of chalcogen elements selected from tellurium (Te), sulfur (S), and selenium (Se).

(21) The storage unit according to (19) or (20), wherein the storage layer and the switch layer are stacked with a third electrode in between the first electrode and second electrode.

(22) The storage unit according to any one of (19) to (21), wherein the storage layer and the switch layer are stacked with the resistance change layer in between.

(23) The storage unit according to any one of (19) to (22), wherein the switch device includes a high-resistance layer on one or both of a surface on the first electrode side and a surface on the second electrode side, and the storage layer and the switch layer are stacked with the high-resistance layer in between.

(24) The storage unit according to any one of (19) to (23), wherein the high-resistance layer of the switch layer also serves as the resistance change layer of the storage layer.

(25) The storage unit according to any one of (18) to (24), wherein a plurality of row lines and a plurality of column lines are included, and the memory cells are each provided around corresponding one of intersection regions of the row lines and the column lines.

(26) The storage unit according to any one of (19) to (25), wherein the storage layer is configured of one of a resistance-change layer made of a transition metal oxide, a phase-change memory layer, and a magnetoresistance-change memory layer.

(27) A switch device including:
a first electrode:
a second electrode disposed to oppose the first electrode:
a switch layer provided between the first electrode and the second electrode, and including one or more kinds of chalcogen elements selected from tellurium (Te), selenium (Se), and sulfur (S) and one or more kinds selected from magnesium (Mg), calcium (Ca), strontium (Sr), aluminum (Al), and gallium (Ga).

(28) The switch device according to (27), wherein the switch layer includes one or both of nitrogen (N) and oxygen (O).

(29) The switch device according to (27) or (28), wherein each of nitrogen (N) and oxygen (O) included in the switch layer is within a range of 5 at % to 25 at % both inclusive.

(30) A switch device including:
a first electrode;
a second electrode disposed to oppose the first electrode;
a switch layer provided between the first electrode and the second electrode, and including one or more kinds of chalcogen elements selected from tellurium (Te), selenium (Se), and sulfur (S) and a compound having a band gap of 2.2 V or higher.

This application claims the benefit of Japanese Priority Patent Application JP 2014-007264 filed in the Japan patent office on Jan. 17, 2014, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A switch device comprising:
   a first electrode;
   a second electrode disposed to oppose the first electrode; and
   a switch layer provided between the first electrode and the second electrode, the switch layer comprising:
   one or more kinds of chalcogen elements selected from tellurium (Te), selenium (Se), and sulfur (S); and
   one or more kinds of first elements, the one or more kinds of first elements being selected from magnesium (Mg), calcium (Ca), and strontium (Sr).

2. The switch device according to claim 1, wherein the switch layer further comprises one or both of nitrogen (N) and oxygen (O).

3. The switch device according to claim 1, wherein the switch layer further comprises one or more of nitrogen (N) and oxygen (O), wherein the one or more of N and O is within a range of 5% to 25% both inclusive.

4. The switch device according to claim 1, wherein, without a phase change between an amorphous phase and a crystalline phase, the switch layer is turned to a low-resistance state by setting an applied voltage to a predetermined threshold voltage or higher, and is turned to a high-resistance state by decreasing the applied voltage to the threshold voltage or lower.

5. The switch device according to claim 1, wherein the switch layer comprises one of compositions including BTe, CTe, BCTe, CSiTe, BSiTe, BCSiTe, BTeN, CTeN, BCTeN, CSiTeN, BSiTeN, BCSiTeN, BTeO, CTeO, BCTeO, CSiTeO, BSiTeO, BCSiTeO, BTeON, CTeON, BCTeON, CSiTeON, BSiTeON, and BCSiTeON.

6. The switch device according to claim 1, wherein the switch layer has a composition ratio (%) of $(BuTex)OyNz$ (where $30 \leq u \leq 90\%$, $10 \leq x \leq 70\%$, $0 \leq y \leq 35\%$, and $0 \leq z \leq 40\%$ or $0 \leq y+z \leq 40\%$).

7. The switch device according to claim 1, wherein the switch layer has a composition ratio (%) of $(CvTex)OyNz$ (where $30 \leq v \leq 60\%$, $40 \leq x \leq 70\%$, $0 \leq y \leq 15\%$, and $0 \leq z \leq 20\%$ or $0 \leq y+z \leq 20\%$).

8. The switch device according to claim 1, wherein the switch layer has a composition ratio (%) of $(BuCvTex)OyNz$ (where $10 \leq u \leq 90\%$, $0 \leq v \leq 65\%$, $0 \leq x \leq 70\%$, $0 \leq y \leq 35\%$, and $0 \leq z \leq 40\%$ (where $30 \leq u+v \leq 90\%$ and $0 \leq y+z \leq 40\%$)).

9. The switch device according to claim 1, wherein the switch layer has a composition ratio (%) of $(CvSiwTex)OyNz$ (where $10 \leq v \leq 65\%$, $10 \leq w \leq 80\%$, $20 \leq x \leq 70\%$, $0 \leq y \leq 35\%$, and $0 \leq y \leq 40\%$ (where $30 \leq v+w \leq 80\%$ and $0 \leq y+z \leq 40\%$)).

10. The switch device according to claim 1, wherein the switch layer has a composition ratio (%) of $(BuSiwTex)OyNz$ (where $10 \leq u \leq 90\%$, $0 \leq w \leq 65\%$, $10 \leq x \leq 70\%$, $0 \leq y \leq 35\%$, and $0 \leq z \leq 40\%$ (where $30 \leq u+w \leq 90\%$ and $0 \leq y+z \leq 40\%$)).

11. The switch device according to claim 1, wherein the switch layer has a composition ratio (%) of $(BuCvSiwTex)OyNz$ (where $0 \leq u \leq 90\%$, $0 \leq v \leq 65\%$, $10 \leq w \leq 65\%$, $10 \leq x \leq 70\%$, $0 \leq y \leq 35\%$, and $0 \leq z \leq 40\%$ (where $30 \leq u+v+w \leq 90\%$ and $0 \leq y+z \leq 40\%$)).

12. The switch device according to claim 1, wherein the switch layer has a composition ratio (%) of $(BuCvSiwZx)OyNz$ (where $20 \leq x \leq 50\%$, $40 \leq u+v+w \leq 60\%$, $5 \leq y \leq 25\%$, $5 \leq z \leq 25\%$, and $5 \leq y+z \leq 25\%$ (where Z=(Te, Se, S))).

13. The switch device according to claim 1, wherein the switch layer further comprises one or more kinds selected from aluminum (Al), and gallium (Ga).

14. The switch device according to claim 13, wherein the switch layer has a composition ratio (%) of $(MtBuCvSiwTex)OyNz$ (where $0 \leq t \leq 30\%$, $40 \leq u+v+w \leq 90\%$, $10 \leq x \leq 50\%$, $5 \leq y \leq 25\%$, and $5 \leq z \leq 25\%$, where a composition ratio of O and N is $5 \leq y+z \leq 25\%$ (where M=Mg, Zn, Ca, Sr, Al, Ga)).

15. The switch device according to claim 13, wherein the switch layer has a composition ratio of $(MtBuCvSiwZx)OyNz$ (where $0 \leq t \leq 30\%$, $10 \leq x \leq 50\%$, $40 \leq u+v+w \leq 90\%$, $5 \leq y \leq 25\%$, and $5 \leq z \leq 25\%$, where a composition ratio of O and N is $5 \leq y+z \leq 25$ (where M=(Mg, Zn, Ca, Sr, Al, Ga) and Z=(Te, Se, and S))).

16. The switch device according to claim 1, wherein the switch layer comprises a high-resistance layer on one or both of a surface on the first electrode side and a surface on the second electrode side.

17. The switch device according to claim 16, wherein the high-resistance layer includes one or more kinds selected from oxides, nitrides, and oxynitrides of aluminum (Al), silicon (Si), magnesium (Mg), hafnium (Hf), and rare-earth metal elements.

18. The switch device according to claim 1, wherein a thickness of the switch layer is within a range of 5 nm to 100 nm both inclusive.

19. A storage unit provided with a plurality of memory cells, the memory cells each including a storage device and a switch device directly coupled to the storage device, the switch device comprising:
   a first electrode;
   a second electrode disposed to oppose the first electrode; and
   a switch layer provided between the first electrode and the second electrode, the switch layer comprising:
   one or more kinds of chalcogen elements, the one or more kinds of chalcogen elements being selected from tellurium (Te), selenium (Se), and sulfur (S); and
   one or more kinds of first elements, the one or more kinds of first elements being selected from magnesium (Mg), calcium (Ca), and strontium (Sr).

20. The storage unit according to claim 19, wherein the storage device includes a storage layer between the first electrode and the second electrode of the switch device.

21. The storage unit according to claim 20, wherein the storage layer includes a ion source layer and a resistance change layer, the ion source layer including one or more kinds of chalcogen elements selected from tellurium (Te), sulfur (S), and selenium (Se).

22. The storage unit according to claim 20, wherein the storage layer and the switch layer are stacked with a third electrode in between the first electrode and second electrode.

23. The storage unit according to claim 20, wherein the storage layer and the switch layer are stacked with a resistance change layer in between.

24. The storage unit according to claim 20, wherein the switch device includes a high-resistance layer on one or both of a surface on the first electrode side and a surface on the second electrode side, and the storage layer and the switch layer are stacked with the high-resistance layer in between.

25. The storage unit according to claim 20, wherein a high-resistance layer of the switch layer also serves as a resistance change layer of the storage layer.

26. The storage unit according to claim 19, wherein a plurality of row lines and a plurality of column lines are included, and the memory cells are each provided around corresponding one of intersection regions of the row lines and the column lines.

27. The storage unit according to claim 20, wherein the storage layer is configured of one of a resistance-change layer made of a transition metal oxide, a phase-change memory layer, and a magnetoresistance-change memory layer.

28. A switch device comprising:
a first electrode;
a second electrode disposed to oppose the first electrode; and
a switch layer provided between the first electrode and the second electrode, the switch layer comprising:
one or more kinds of chalcogen elements selected from tellurium (Te), selenium (Se), and sulfur (S); and
a compound having a band gap of 2.2 V or higher, the compound comprising one or more of magnesium (Mg), calcium (Ca), and strontium (Sr).

* * * * *